(12) United States Patent
Hashimoto et al.

(10) Patent No.: US 6,940,120 B2
(45) Date of Patent: Sep. 6, 2005

(54) NON-VOLATILE SEMICONDUCTOR MEMORY DEVICE AND METHOD OF FABRICATING THEREOF

(75) Inventors: Hiroshi Hashimoto, Kawasaki (JP); Koji Takahashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/437,896

(22) Filed: May 15, 2003

(65) Prior Publication Data

US 2003/0218207 A1 Nov. 27, 2003

(30) Foreign Application Priority Data

May 21, 2002 (JP) .......................... 2002-146184

(51) Int. Cl.[7] .................. H01L 29/76; H01L 29/94; H01L 31/062; H01L 31/113; H01L 31/119
(52) U.S. Cl. .................. 257/314; 257/303; 257/304; 257/316; 257/317; 257/315
(58) Field of Search .................. 257/296, 303, 257/306, 307, 314–319, 202–208

(56) References Cited

U.S. PATENT DOCUMENTS 6,137,134 A * 10/2000 Nakagawa .................. 257/316
6,365,944 B1 * 4/2002 Reisinger .................... 257/390
6,528,843 B1 * 3/2003 Wu .............................. 257/315
6,696,724 B2 * 2/2004 Verhaar ....................... 257/314

OTHER PUBLICATIONS

Patent Abstracts of Japan, Publication No. 8–172174, dated Jul. 2, 1996.
Patent Abstracts of Japan, Publication No. 5–275716, dated Oct. 22, 1993./Discussed in the specification.

* cited by examiner

*Primary Examiner*—Jerome Jackson
*Assistant Examiner*—Jesse A. Fenty
(74) *Attorney, Agent, or Firm*—Westerman, Hattori, Daniels & Adrian, LLP

(57) ABSTRACT

A phosphorus-doped amorphous silicon film and a silicon nitride film are serially grown over a semiconductor substrate. The obtained stack is patterned so as to obtain word lines. A CVD oxide film is grown on the entire surface and then anisotropically etched to thereby form sidewalls on the lateral faces of the word lines. An ONO film previously formed just under the CVD oxide film is also removed by the etching. The semiconductor substrate is etched to thereby form a groove, where masking is effected by the silicon nitride film, silicon oxide film and sidewall. Boron ions are doped by ion implantation through the same mask into the bottom of the groove to thereby form a channel stop impurity-diffused layer. Then, an inter-layer insulating film is formed over the entire surface.

11 Claims, 43 Drawing Sheets

US 6,940,120 B2

NON-VOLATILE SEMICONDUCTOR MEMORY DEVICE AND METHOD OF FABRICATING THEREOF

CROSS-REFERENCE TO RELATED APPLICATIONS

This application is based upon and claims the benefit of priority from the prior Japanese Patent Application No. 2002-146184, filed on May 21, 2002, the entire contents of which are incorporated herein by reference.

BACKGROUND OF THE INVENTION

1. Field of the Invention

The present invention relates to a non-volatile semiconductor memory device preferably applicable to flash memory, and a method of fabricating thereof.

2. Description of the Related Art

Flash memory is one known type of non-volatile semiconductor memory device. FIGS. 30 and 31 are a circuit diagram and a layout chart, respectively, showing a constitution of a NOR-type flash memory. FIG. 32A shows a schematic sectional view taken along the line I—I in FIG. 31, FIG. 32B is such that taken along the line II—II in FIG. 31, and FIG. 32C is such that taken along the line III—III in FIG. 31.

In the NOR-type flash memory (a first conventional example), as shown in FIGS. 30 and 31, a plurality of bit lines and a plurality of word lines are arranged so as to spatially cross with each other. The source and drain of a transistor composing one flash memory cell are respectively connected to either of two adjacent bit lines. Every bit line is commonly possessed by two adjacent transistors placed on both sides thereof. The gates of these transistors are connected to a word line. One transistor herein can store data at two points indicated in FIG. 30 with broken-line circles, that is, two bits are storable.

As shown in FIG. 31 and FIGS. 32A through 32C, the bit line is composed of a bit line impurity-diffused layer 4 formed in the surficial portion of a semiconductor substrate 1. On the other hand, the word line 6 is composed of a semiconductor film formed over the semiconductor substrate 1 while placing an insulating film in between. More specifically, an ONO film 2 is provided between a channel region (a portion of the semiconductor substrate 1) and the word line 6. The ONO film 2 comprises a silicon oxide film, a silicon nitride film and another silicon oxide film stacked in this order. Between the bit line impurity-diffused layer 4 and word line 6, a silicon oxide film 5 thicker than the ONO film 2 is provided. On the lateral faces of each word line 6, sidewalls 8 are formed (not shown in FIG. 31). An inter-layer insulating film 9 (not shown in FIG. 31) is formed over the entire surface. The area where neither the bit line impurity-diffused layer 4 nor the word line 6 is formed has a channel stop impurity-diffused layer 7 formed therein. That is, the channel stop impurity-diffused layer 7 is responsible for element isolation. A bit line contact 10 is formed in an insulating film, such as the silicon oxide film 5 on the bit line impurity-diffused layer 4 and the inter-layer insulating film 9, and a word line contact 11 is formed in an insulating film such as the inter-layer insulating film 9 on the word line 6. It is to be noted that illustration of the insulating films (ONO film 2, sidewall 8 and inter-layer insulating film 9) other than the silicon oxide film 5 on the bit line impurity-diffused layer 4 and a silicon nitride film 22 on the word line 6 are omitted in FIG. 31.

Next paragraphs will describe a conventional method of fabricating thus-composed flash memory (first conventional example). FIGS. 33A, 33B and 33C through FIGS. 37A, 37B and 37C are schematic sectional views for serially explaining a conventional method of fabricating the flash memory. It is to be noted that drawings having Fig. number suffixed by "A" are sectional views taken along the I—I line in FIG. 31, those having Fig. number suffixed by "B" are sectional views taken along the line II—II in FIG. 31, and those having Fig. number suffixed by "C" are sectional views taken along the line III—III in FIG. 31.

First as shown in FIGS. 33A through 33C, the ONO film 2 is formed on the surface of the semiconductor substrate 1. In the formation process of the ONO film 2, a silicon oxide film 2a having a thickness of 3 to 10 nm is grown, a silicon nitride film 2b having a thickness of 12 to 16 nm is formed thereon by the CVD process, and further thereon another silicon oxide film 2c having a thickness of 5 to 10 nm is grown by wet oxidation.

Next a resist film 3 is formed by coating on the ONO film 2, and the resist film 3 is then patterned as shown in FIGS. 34A through 34C so as to have a pattern equivalent to that of the bit line impurity-diffused layer 4. The exposed portion of the silicon oxide film 2c and silicon nitride film 2b, which are components of the ONO film 2, are etched off. Arsenic ions are then doped by ion implantation into the semiconductor substrate 1, where masking is effected by the resist film 3, to thereby form the bit line impurity-diffused layer 4. The dose herein can typically be set to $1 \times 10^{15}$ to $3 \times 10^{15}$ $cm^{-2}$ or around.

Next as shown in FIGS. 35A through 35C, the silicon oxide film 5 having a thickness of 400 to 600 nm is grown by wet oxidation on the surface of the bit line impurity-diffused layer 4. Both edges of the ONO film 2 are lifted to some extent.

Then a phosphorus-doped amorphous silicon (DASi) film is grown over the entire surface by the CVD process, and a tungsten silicide (WSi) film is grown further thereon by the CVD process. The thickness of the DASi film is 100 to 150 nm, and that of the WSi film is 100 to 180 nm. Next a resist film is formed by coating on the WSi film, and then patterned so as to have a pattern equivalent to that of the word lines and gate electrodes of transistors in the peripheral circuit area. Then as shown in FIGS. 36A through 36C, the WSi film and DASi film are successively etched off to thereby form the word lines 6 and gate electrodes of transistors (not shown) in the peripheral circuit area. The resist film is then removed, and a new resist film is formed by coating over the entire surface, and patterned so as to have a pattern equivalent to that of the channel stop impurity-diffused layer. Boron ions are then doped by ion implantation into the semiconductor substrate 1, where masking is effected by the resist film, to thereby form the channel stop impurity-diffused layer 7. The dose herein can typically be set to $5 \times 10^{12}$ to $1 \times 10^{13}$ $cm^{-2}$ or around. The channel stop impurity-diffused layer 7 is responsible for element isolation between every adjacent bit line impurity-diffused layers 4. It is to be noted that, in the peripheral circuit area, the ONO film 2 is etched off prior to the formation of the DASi film, where masking is effected by a resist film having openings in the peripheral circuit area, the resist mask is then removed, and a gate oxide film (now shown) is formed.

Next, a CVD oxide film is grown in a thickness of 100 to 200 nm on the entire surface, and then anisotropically etched to thereby produce the sidewalls 8 on the lateral faces of the gate electrodes (not shown) of transistors in the peripheral circuit area and of the word lines 6 as shown in FIGS. 37A through 37C. The inter-layer insulating film 9 is then formed over the entire surface, which is followed by formation of wirings (not shown) and so forth. Thus the NOR-type flash memory is fabricated.

FIGS. 38 and 39 are a circuit diagram and a layout chart, respectively, showing a constitution of an AND-type flash memory. FIG. 40A shows a schematic sectional view taken along the line I—I in FIG. 39, FIG. 40B is such that taken along the line II—II in FIG. 39, and FIG. 40C is such that taken along the line III—III in FIG. 39.

In the AND-type flash memory (a second conventional example), as shown in FIGS. 38 and 39, a plurality of bit lines and a plurality of word lines are arranged so as to spatially cross with each other. The source and drain of a double-gate-structured transistor composing one flash memory cell are respectively connected to either of two adjacent bit lines. Unlike the NOR-type flash memory, there are two bit lines between every adjacent transistors, and these transistors are respectively connected to these bit lines. That is, every bit line is commonly possessed only by the transistors aligned along the extending direction of such bit line. The gates of these transistors are connected to the word lines.

As shown in FIG. 39 and FIGS. 40A through 40C, the bit line is composed of a bit line impurity-diffused layer 4 formed in the surficial portion of the semiconductor substrate 1. An element isolation oxide film 12 is formed between every adjacent bit lines (bit line impurity-diffused layers) respectively connected to the different transistors. On the other hand, the word line 6 is composed of a semiconductor film formed over the semiconductor substrate 1 while placing an insulating film in between. More specifically, a tunnel oxide film 13, a floating gate 14 and the ONO film 2 are provided between the channel region (a portion of the semiconductor substrate 1) and the word line 6. The silicon oxide film 5 having a thickness larger than that of the tunnel oxide film 13, the floating gate 14 and the ONO film 2 are provided between the bit line impurity-diffused layer 4 and word line 6. The floating gate 14 is divided for every transistor. The inter-layer insulating film 9 is formed over the entire surface. The area where neither the bit line impurity-diffused layer 4 nor the word line 6 is formed has a channel stop impurity-diffused layer 7 formed therein. It is to be noted that illustration of the insulating films (ONO film 2, inter-layer insulating film 9 and tunnel oxide film 13) other than the silicon oxide film 5 on the bit line impurity-diffused layer 4 are omitted in FIG. 39.

Next, a third conventional example differing in the sectional structure from that of the second conventional example will be explained. The third conventional example is cited from Japanese Laid-Open Patent Publication No. 8-172174. FIGS. 41A through 41C show a constitution of the third conventional example, where FIG. 41A shows a schematic sectional view taken along the line I—I in FIG. 39, FIG. 41B is such that taken along the line II—II in FIG. 39, and FIG. 41C is such that taken along the line III—III in FIG. 39.

While the channel stop impurity-diffused layer 7 is directly formed in the surficial portion of the semiconductor substrate in the second conventional example, the corresponded portion of the semiconductor substrate 1 in the third conventional example has formed therein a groove 15, and the channel stop impurity-diffused layer 7 is formed by oblique angle ion implantation into the bottom and lateral face of the groove 15. There is also provided a thermal oxide film 17 covering the channel stop impurity-diffused layer 7 and a flash memory cell. A CVD oxide film is further formed thereon as an inter-layer insulating film 9.

Next paragraphs will describe a method of fabricating the AND-type flash memory according to the third conventional example. FIGS. 42A, 42B and 42C, and FIGS. 43A, 43B and 43C are schematic sectional views serially showing process steps in the fabrication method of such AND-type flash memory of the third conventional example, where FIGS. 42A and 43A illustrate the area shown in FIG. 41A, FIGS. 42B and 43B illustrate the area shown in FIG. 41B, and FIGS. 42C and 43C illustrate the area shown in FIG. 41C.

In the fabrication of the AND-type flash memory according to the third conventional example, the tunnel oxide film 13 and semiconductor substrate 1 are etched, where masking is effected by the resist film 16 used for patterning the word line 6, ONO film 2 and floating gate 14 to obtain the constitution shown in FIG. 40, and also by the silicon oxide film 5 on the bit line impurity-diffused layer 4, to thereby form the groove 15 as shown in FIGS. 42A through 42C. Then the channel stop impurity-diffused layer 7 is formed by oblique angle ion implantation into the bottom and lateral face of such groove 15. The resist film 16 is then removed.

Then as shown in FIGS. 43A through 43C, the thermal oxide film 17 is grown so as to cover the channel stop impurity-diffused layer 7 and flash memory cell 16, and further thereon the CVD oxide film is formed as an inter-layer insulating film 9, which is followed by formation of wirings and so forth.

A fourth conventional example can be found in Japanese Laid-Open Patent Publication No. 5-275716, which discloses a method by which sidewalls are formed on the lateral faces of the word lines, the semiconductor substrate is etched, where masking is effected by the sidewalls to thereby form grooves, at the bottom of which a channel stop impurity-diffused layer is formed, and bit lines are formed on the lateral faces thereof.

The conventional examples described in the above are, however, disadvantageous in the following points.

In the first and second conventional examples, only the channel stop impurity-diffused layer 7 is in charge of element isolation, which makes it difficult to assure a sufficient level of voltage resistance between bit lines under an environment where the pitch of the bit lines is reduced for a higher level of integration and space saving.

In the third conventional example, the resist film 16 used for patterning the word line 6, ONO film 2 and floating gate 14 is also used directly as a mask in the etching of the tunnel oxide film 13 and semiconductor substrate 1 to thereby form the groove 15. A relatively small thickness of the resist film 16 herein undesirably makes it difficult for the resist film to endure the process, which may result in deformation thereof during the etching. On the contrary, a relatively large thickness of the resist film 16 undesirably makes it difficult to narrow the word line width. Another problem resides in that the channel stop impurity-diffused layer 7 is formed after the groove is formed 15 and to as far as on the lateral faces thereof, which narrows the effective channel width of the flash memory, and consequently reduces current flowing in the transistor.

In the fourth conventional example, the gate electrodes of the individual memory cells are independent from each other within a layer in which the gate electrodes per se are formed. The bit lines are provided, as described in the above, on the lateral faces of the grooves. Such constitution and the method of fabricating thereof is not directly applicable to the flash memory of which word lines and gate electrodes or control gates are composed of the same layer.

SUMMARY OF THE INVENTION

The present invention is accomplished considering the above-described problems, and is to provide a non-volatile semiconductor memory device and a method of fabricating thereof capable of narrowing the word line width while keeping a desirable level of voltage resistance between the bit lines.

The present inventors reached the various aspects of the present invention described below after extensive investigations.

A first aspect of the present invention relates to a non-volatile semiconductor memory device which comprises a semiconductor substrate; a plurality of bit lines comprised of an impurity-diffused layer formed in the surficial portion of the semiconductor substrate; and a plurality of word lines comprised of a conductive layer formed above the semiconductor substrate and arranged so as to cross with the plurality of bit lines in a plan view. The memory device further comprises a first insulating film formed on the word lines; and a second insulating film formed along the word lines. Between every adjacent word lines, a groove is formed in the surficial portion of the semiconductor substrate within each area defined, in a plan view, by the first insulating film formed on the adjacent word lines and by the adjacent bit lines so as to be aligned with the second insulating film; a channel stop impurity-diffused layer is formed at the bottom of the groove; and an insulating film is filled in the groove.

Also a second aspect of the present invention relates to a non-volatile semiconductor memory device which comprises a semiconductor substrate; a plurality of bit lines comprised of an impurity-diffused layer formed in the surficial portion of the semiconductor substrate; and a plurality of word lines comprised of a conductive layer formed above the semiconductor substrate and arranged so as to cross with the plurality of bit lines in a plan view. Between every adjacent word lines in the second aspect of the present invention, a groove is formed in the surficial portion of the semiconductor substrate within each area defined, in a plan view, by the adjacent word lines and adjacent bit lines; a channel stop impurity-diffused layer is formed at the bottom of the groove; sidewalls are formed on the lateral faces of the individual word lines so as to extend towards the bottom of the groove; and the groove has filled therein an insulating film.

A third aspect of the present invention relates to a method of fabricating a non-volatile semiconductor memory device which comprises the steps of: forming a stack comprised of a first oxide film, a nitride film and a second oxide film stacked in this order on a semiconductor substrate; forming a plurality of bit lines comprised of an impurity-diffused layer in the surficial portion of the semiconductor substrate; and forming a first insulating film on the plurality of bit lines. The method according to the third aspect of the present invention further comprises the steps of: successively forming a conductive layer and a second insulating layer over the entire surface; patterning the conductive layer and the second insulating film so as to obtain a plurality of word lines crossing in a plan view with the plurality of bit lines; forming sidewalls comprised of a third insulating film on the lateral faces of the word lines; forming a groove by etching the surface of the semiconductor substrate, where masking is effected by the first insulating film, second insulating film and sidewalls; forming a channel stop impurity-diffused layer at the bottom of the groove by ion implantation; and filling the groove with a fourth insulating film.

Also a fourth aspect of the present invention relates to a method of fabricating a non-volatile semiconductor memory device which comprises the steps of: forming a stack comprised of a first oxide film, a nitride film and a second oxide film stacked in this order on a semiconductor substrate; forming a plurality of bit lines comprised of an impurity-diffused layer in the surficial portion of the semiconductor substrate; and forming a first insulating film on the plurality of bit lines. The method according to the fourth aspect of the present invention further comprises the steps of: successively forming a conductive layer and a second insulating layer over the entire surface; patterning the conductive layer and the second insulating film so as to obtain a plurality of word lines crossing in a plan view with the plurality of bit lines; forming a groove by etching the surface of the semiconductor substrate, where masking is effected by the first insulating film and second insulating film; forming a channel stop impurity-diffused layer at the bottom of the groove by ion implantation; forming sidewalls which are comprised of a third insulating film and extend toward the bottom of the groove on the lateral faces of the word lines; and filling the groove with a fourth insulating film.

Also a fifth aspect of the present invention relates to a method of fabricating a non-volatile semiconductor memory device which comprises the steps of: forming a stack comprised of a first oxide film, a nitride film and a second oxide film stacked in this order on a semiconductor substrate; forming a plurality of bit lines comprised of an impurity-diffused layer in the surficial portion of the semiconductor substrate; and forming a first insulating film on the plurality of bit lines. The method according to the fifth aspect of the present invention further comprises the steps of: successively forming a conductive layer and a second insulating layer over the entire surface; patterning the conductive layer and the second insulating film so as to obtain a plurality of word lines crossing in a plan view with the plurality of bit lines; forming a resist film which covers the conductive layer and the second insulating film, and has openings in a plan view in the areas between every adjacent word lines and apart from the word lines; forming a groove by etching the surface of the semiconductor substrate, where masking is effected by the first insulating film and the resist film; forming a channel stop impurity-diffused layer at the bottom of the groove by ion implantation; and filling the groove with a fourth insulating film.

A sixth aspect of the present invention relates to a method of fabricating a non-volatile semiconductor memory device which comprises the steps of: forming a tunnel insulating film on a semiconductor substrate; forming a plurality of bit lines comprised of an impurity-diffused layer in the surficial portion of the semiconductor substrate; forming a first insulating film on the plurality of bit lines; forming a floating gate on the tunnel insulating film and the first insulating film; and forming a stack comprised of a first oxide film, a nitride film and a second oxide film stacked in this order on the floating gate. The method according to the sixth aspect of the present invention further comprises the steps of: successively forming a conductive layer and a second insulating film over the entire surface; patterning the conductive layer and the second insulating film so as to obtain a plurality of word lines crossing in a plan view with the plurality of bit lines; forming sidewalls comprised of a third insulating film on the lateral faces of the word lines; forming a groove by etching the surface of the semiconductor substrate, where masking is effected by the first insulating film, second insulating film and sidewalls; forming a channel stop impurity-diffused layer at the bottom of the groove by ion implantation; and filling the groove with a fourth insulating film.

Also a seventh aspect of the present invention relates to a method of fabricating a non-volatile semiconductor memory device which comprises the steps of: forming a tunnel insulating film on a semiconductor substrate; forming a plurality of bit lines comprised of an impurity-diffused layer in the surficial portion of the semiconductor substrate; forming a first insulating film on the plurality of bit lines; forming a floating gate on the tunnel insulating film and the first insulating film; and forming a stack comprised of a first oxide film, a nitride film and a second oxide film stacked in this order on the floating gate. The method according to the seventh aspect of the present invention further comprises the steps of: successively forming a conductive layer and a second insulating film over the entire surface; patterning the conductive layer and the second insulating film so as to obtain a plurality of word lines crossing in a plan view with the plurality of bit lines; forming a groove by etching the surface of the semiconductor substrate, where masking is effected by the first insulating film and second insulating film; forming a channel stop impurity-diffused layer at the bottom of the groove by ion implantation; forming sidewalls which are comprised of a third insulating film and extend toward the bottom of the groove on the lateral faces of the word lines; and filling the groove with a fourth insulating film.

Also an eighth aspect of the present invention relates to a method of fabricating a non-volatile semiconductor memory device which comprises the steps of: forming a tunnel insulating film on a semiconductor substrate; forming a plurality of bit lines comprised of an impurity-diffused layer in the surficial portion of the semiconductor substrate; forming a first insulating film on the plurality of bit lines; forming a floating gate on the tunnel insulating film and the first insulating film; and forming a stack comprised of a first oxide film, a nitride film and a second oxide film stacked in this order on the floating gate. The method according to the eighth aspect of the present invention further comprises the steps of: successively forming a conductive layer and a second insulating film over the entire surface; patterning the conductive layer and the second insulating film so as to obtain a plurality of word lines crossing in a plan view with the plurality of bit lines; forming a resist film which covers the conductive layer and the second insulating film, and has openings in a plan view in the areas between every adjacent word lines and apart from the word lines; forming a groove by etching the surface of the semiconductor substrate, where masking is effected by the first insulating film and the resist film; forming a channel stop impurity-diffused layer at the bottom of the groove by ion implantation; and filling the groove with a fourth insulating film.

A ninth aspect of the present invention relates to a method of fabricating a non-volatile semiconductor memory device which comprises a semiconductor substrate, a plurality of bit lines comprised of an impurity-diffused layer formed in the surficial portion of the semiconductor substrate, and a plurality of word lines comprised of a conductive layer formed above the semiconductor substrate and arranged so as to cross with the plurality of bit lines in a plan view. The method according to the ninth aspect of the present invention comprises the steps of: forming a groove by etching the semiconductor substrate, where masking is effected by an insulating film preliminarily formed on the plurality of bit lines and the plurality of word lines; forming a channel stop impurity-diffused layer at the bottom of the groove by ion implantation; and filling the groove with a fourth insulating film.

Also a tenth aspect of the present invention relates to a method of fabricating a non-volatile semiconductor memory device which comprises a semiconductor substrate, a plurality of bit lines comprised of an impurity-diffused layer formed in the surficial portion of the semiconductor substrate, and a plurality of word lines comprised of a conductive layer formed above the surface of the semiconductor substrate and arranged so as to cross with the plurality of bit lines in a plan view. The method according to the tenth aspect of the present invention comprises the steps of: forming a groove by etching the semiconductor substrate, where masking is effected by an insulating film preliminarily formed on the plurality of bit lines and by a resist film preliminarily formed on the word lines; forming a channel stop impurity-diffused layer at the bottom of the groove by ion implantation; and filling the groove with a fourth insulating film.

In all aspects of the present invention, the groove can be formed by etching the semiconductor substrate while masking is effected only with the insulating film. Formation of the channel stop impurity-diffused layer at the bottom of the groove and filling thereof with an insulating film can ensure a large voltage resistance between the bit lines. Masking only using the insulating film is also advantageous in ensuring fine processing of the word lines.

It is also possible to reduce narrow channel effect of the transistors if the channel stop impurity-diffused layer is formed also on the lateralfaces of the groove in the process step of forming the channel stop impurity-diffused layer at the bottom of the groove by ion implantation.

DETAILED DESCRIPTION OF THE PREFERRED EMBODIMENTS

The non-volatile semiconductor memory device and the method of fabricating thereof according to the present invention will specifically be detailed referring to the attached drawings.

(First Embodiment)

Figure 1:
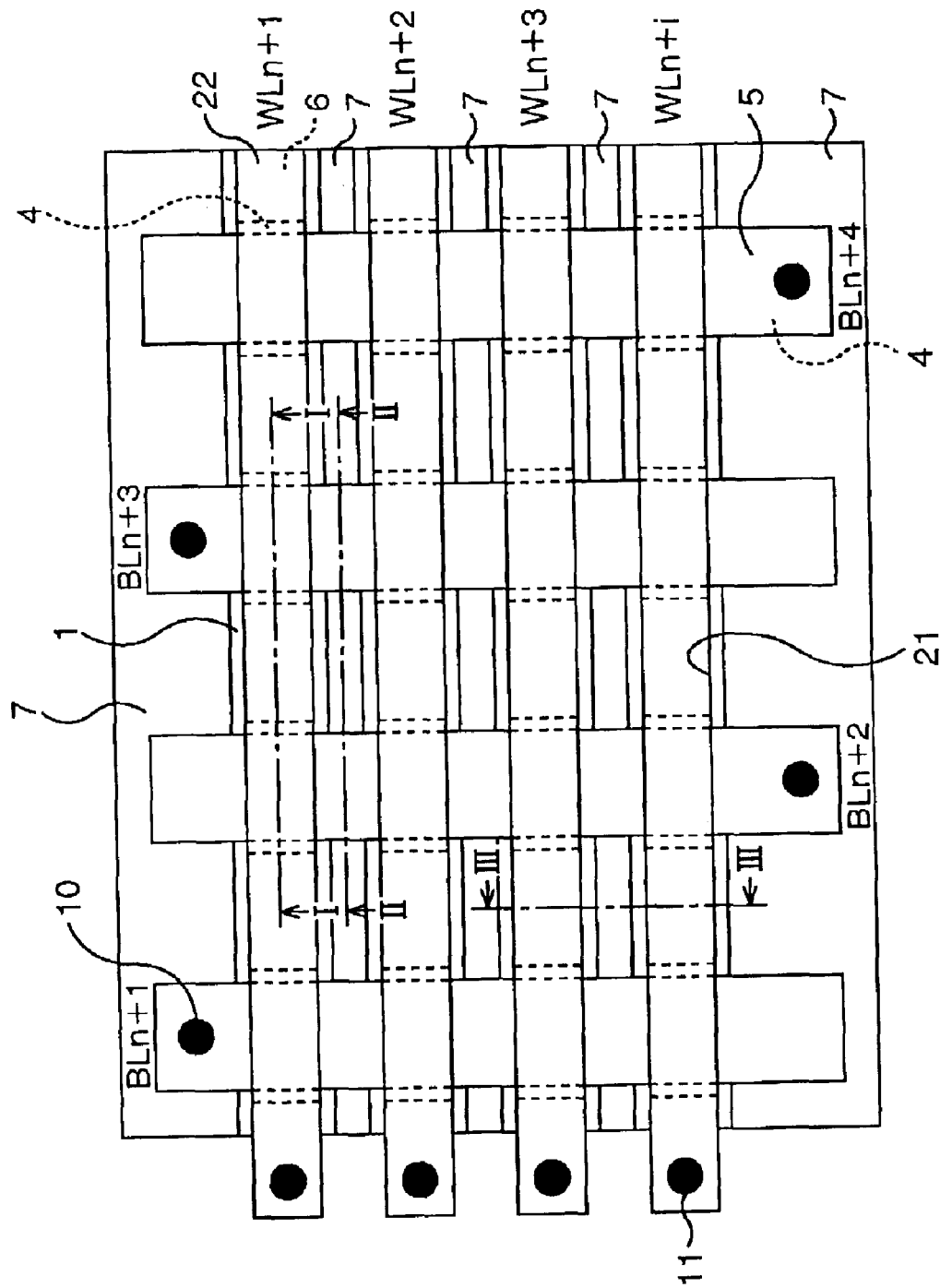
FIG. 1 is a layout chart showing a constitution of a non-volatile semiconductor memory device (NOR-type flash memory) according to a first embodiment of the present invention.
Figure 2A:
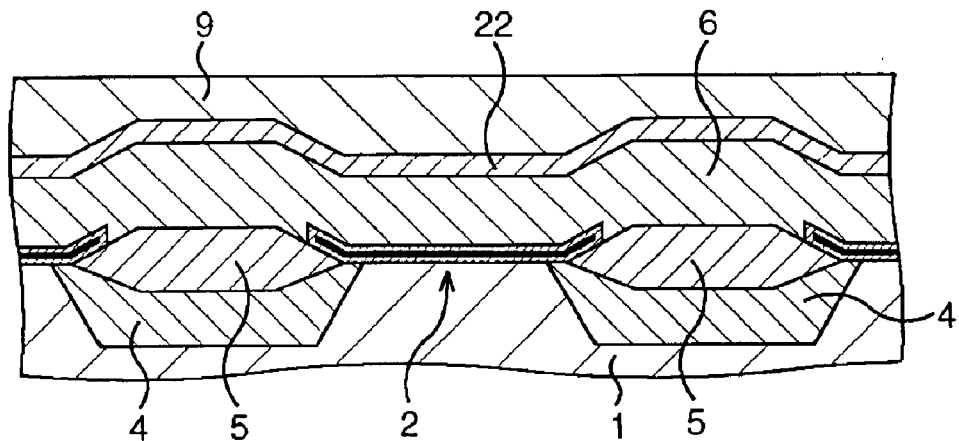
FIGS. 2A through 2C are schematic sectional views showing a constitution of the NOR-type flash memory according to the first embodiment of the present invention.
Figure 2B:
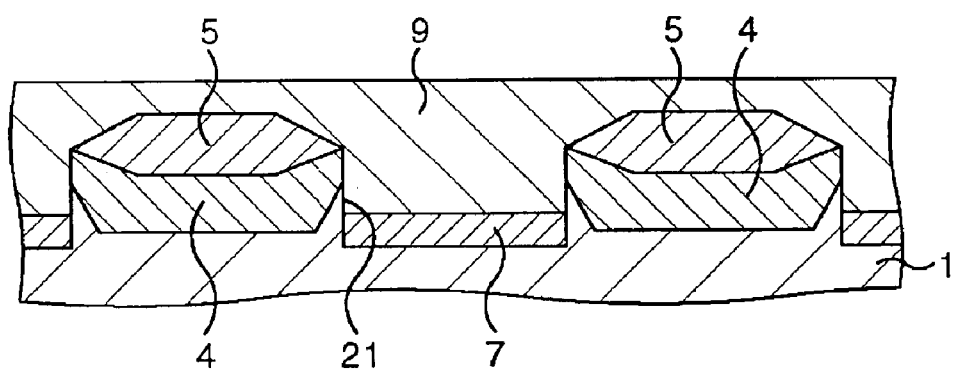
Figure 2C:
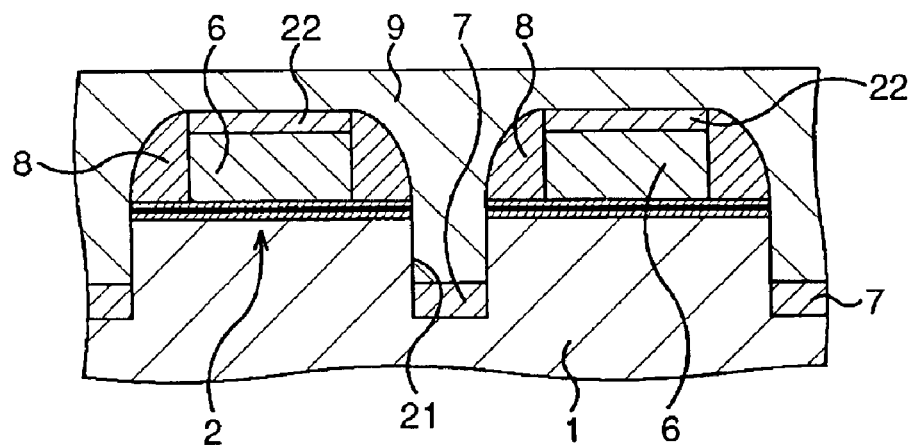
Figure 30:
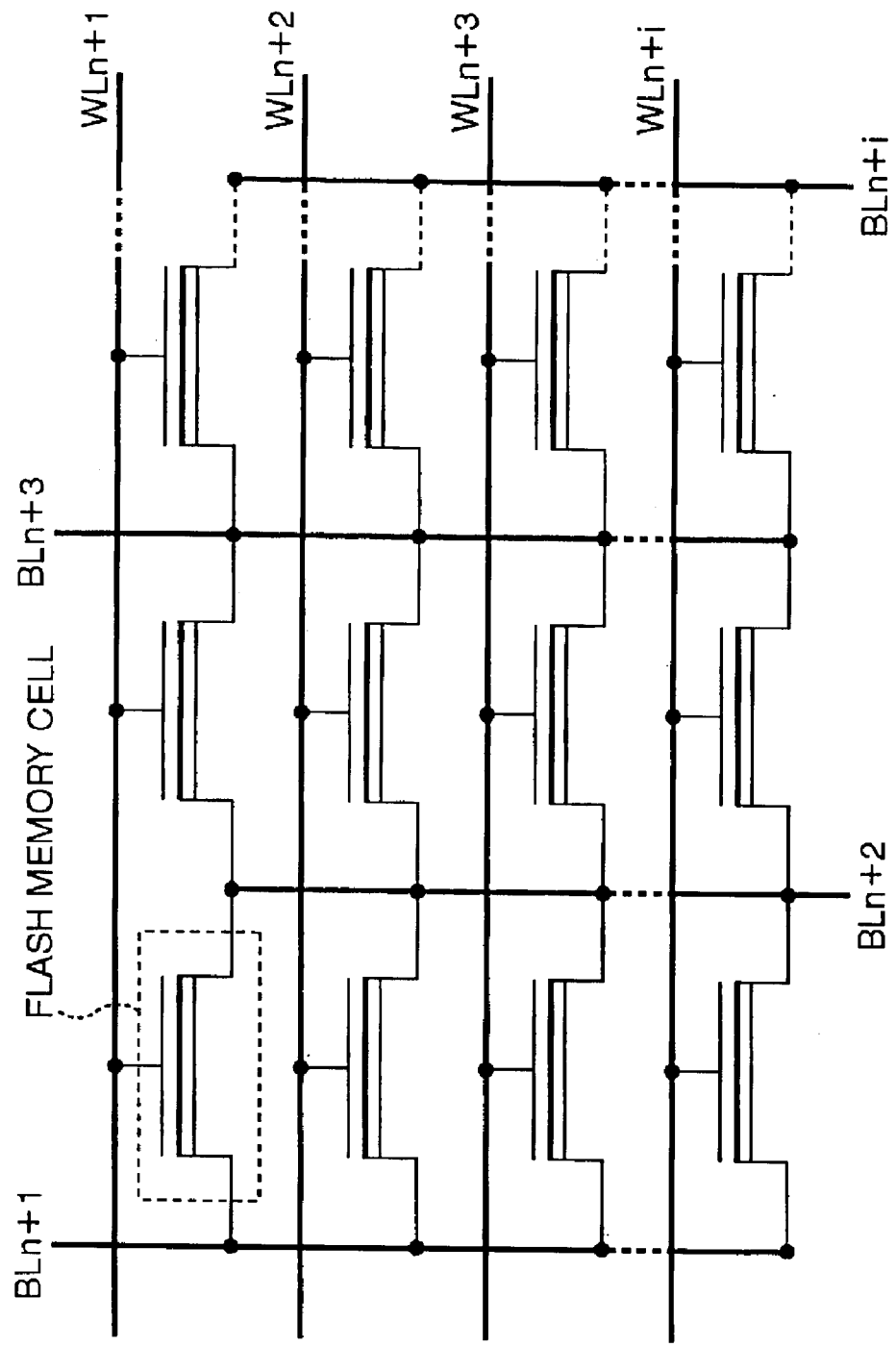
FIG. 30 is a circuit diagram showing a general constitution of a NOR-type flash memory.

First a non-volatile semiconductor memory device (NOR-type flash memory) according to a first embodiment of the present invention will be explained. A circuit constitution in the first embodiment is same as that previously shown in FIG. 30, but a layout and sectional structure are differed from those in the first conventional example previously shown in FIG. 31 and FIGS. 32A through 32C. FIG. 1 is a layout chart showing a constitution of the non-volatile semiconductor memory device (NOR-type flash memory) according to the first embodiment of the present invention. FIGS. 2A, 2B and 2C are schematic sectional views taken along the I—I line, II—II line and III—III line, respectively, in FIG. 1.

Also in the first embodiment, as shown in FIGS. 2A through 2C, the bit line is composed of the bit line impurity-diffused layer 4 formed in the surficial portion of the semiconductor substrate 1, and the word line 6 is composed of a semiconductor film formed on the surface of the semiconductor substrate 1 while placing an insulating film in between. The sidewalls 8 are formed on the lateral faces of the word line 6, and the silicon nitride film 22 is formed on the word line 6. The ONO film 2 is provided also between the sidewalls 8 and semiconductor substrate 1. The entire surface is covered with the inter-layer insulating film 9. The area of the semiconductor substrate 1 having formed therein or thereon none of the bit line impurity-diffused layer 4, word lines 6 and sidewalls 8 has formed therein a groove 21. In this embodiment, the channel stop impurity-diffused layer 7 is formed at the bottom of the groove 21. The inter-layer insulating film 9 is filled also in the groove 21. The inter-layer insulating film 9 is formed by the CVD process, for example. It is to be noted that illustration of the insulating films (ONO film 2, sidewall 8 and inter-layer insulating film 9) other than the silicon oxide film 5 on the bit line impurity-diffused layer 4 and the silicon nitride film 22 on the word line 6 are omitted in FIG. 1.

Figure 31:
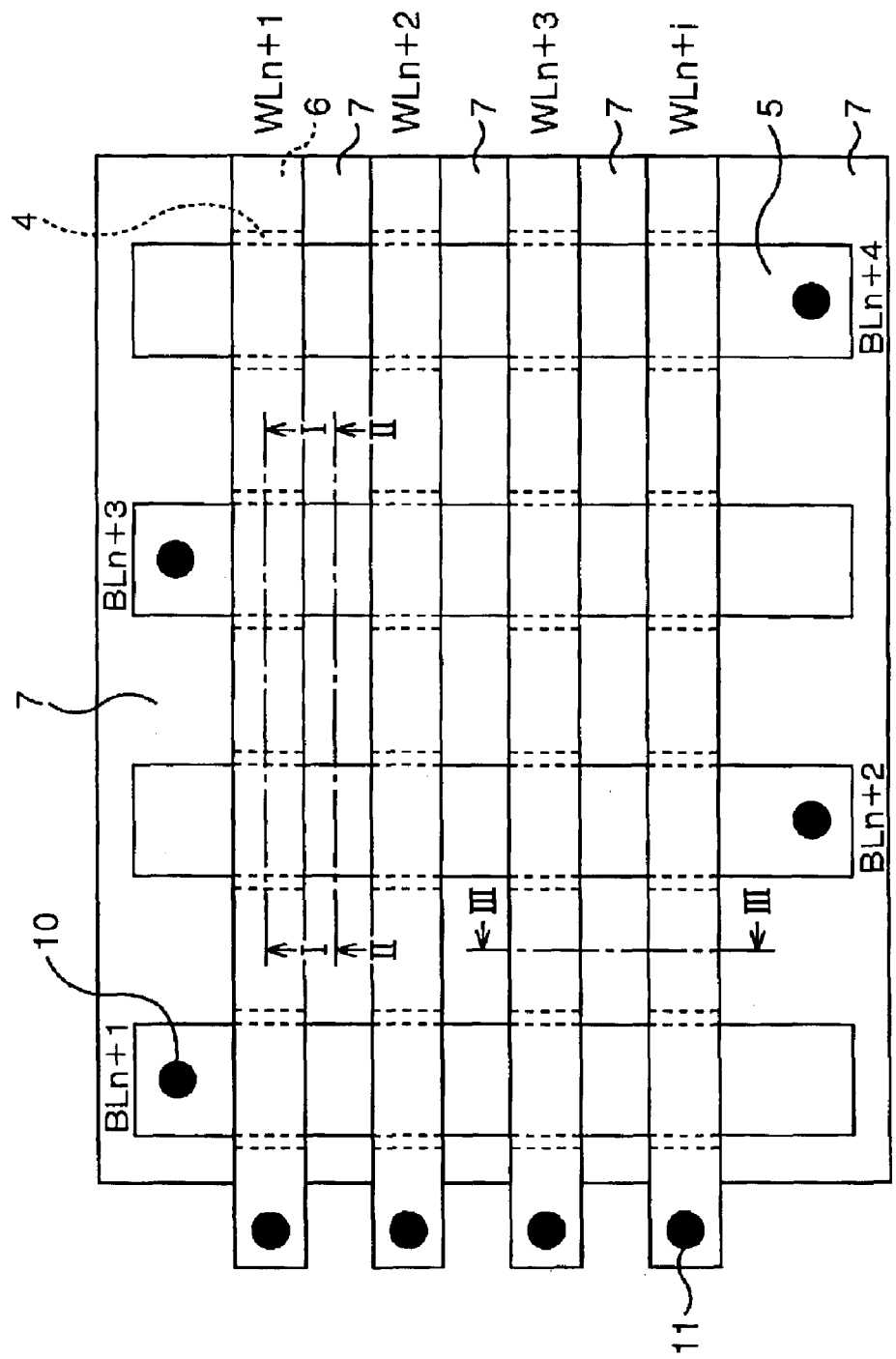
FIG. 31 is a layout chart showing a general constitution of a NOR-type flash memory.
Figure 32A:
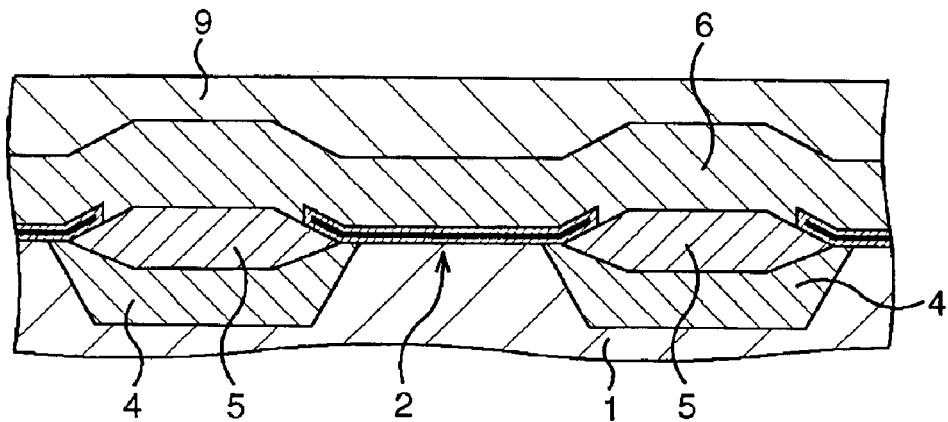
FIGS. 32A, 32B and 32C are schematic sectional views taken along the I—I line, II—II line and III—III line, respectively, in FIG. 31.
Figure 32B:
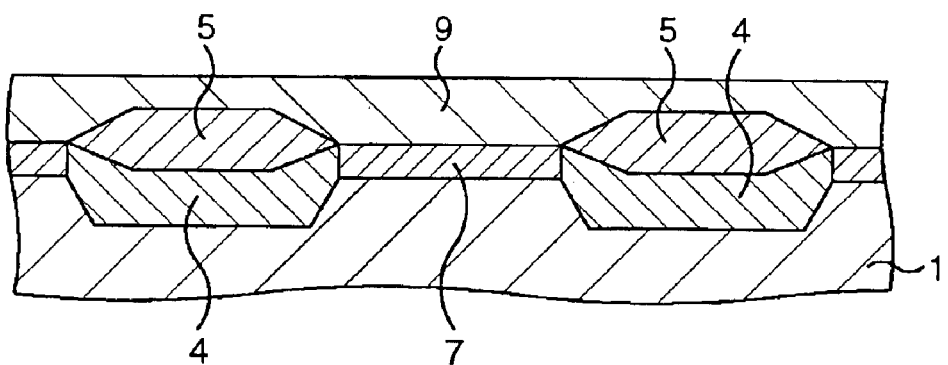
Figure 32C:
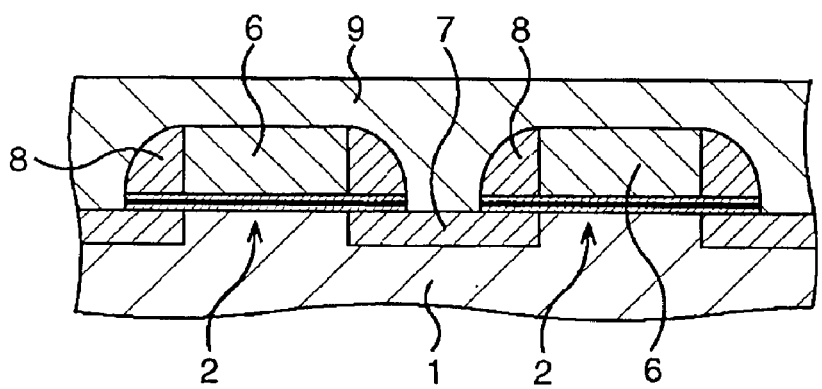
Figure 33A:
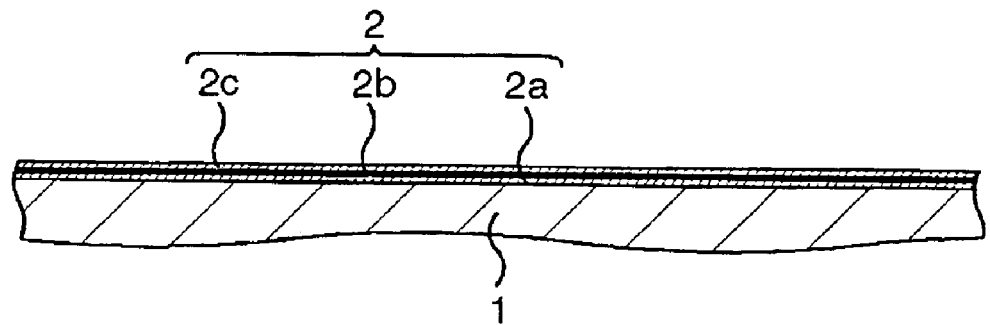
FIGS. 33A through 33C are schematic sectional views showing a process step in a conventional method of fabricating a flash memory.
Figure 33B:
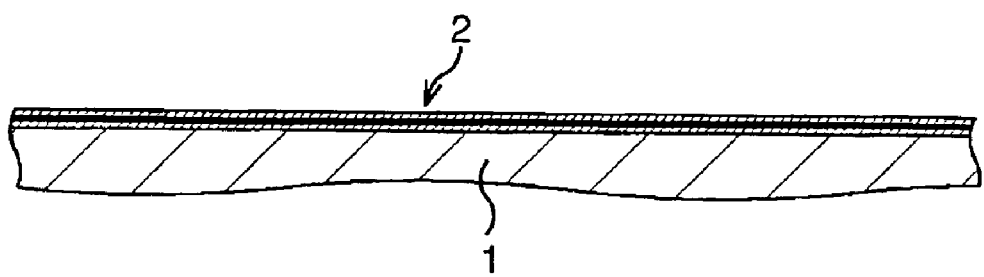
Figure 33C:
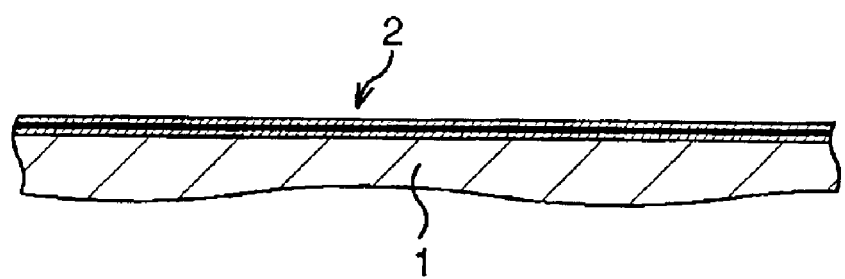
Figure 34A:
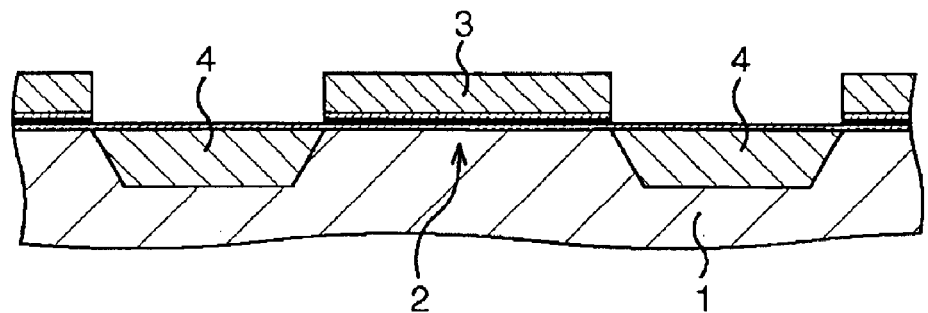
FIGS. 34A through 34C also are schematic sectional views showing the next process step as continued from FIGS. 33A through 33C.
Figure 34B:
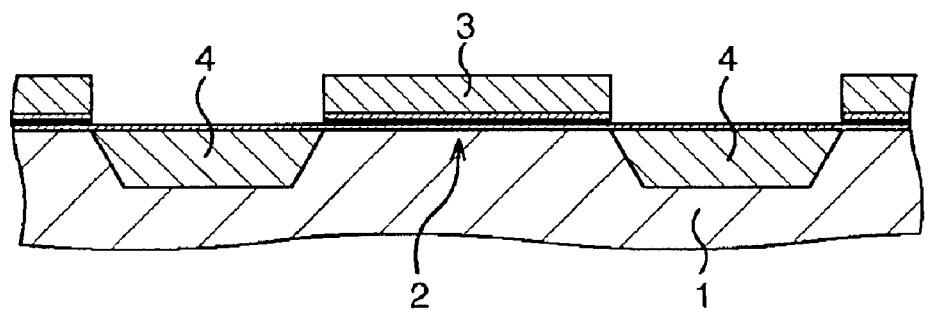
Figure 34C:
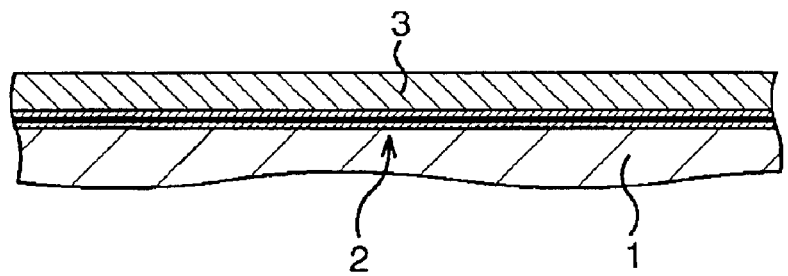
Figure 35A:
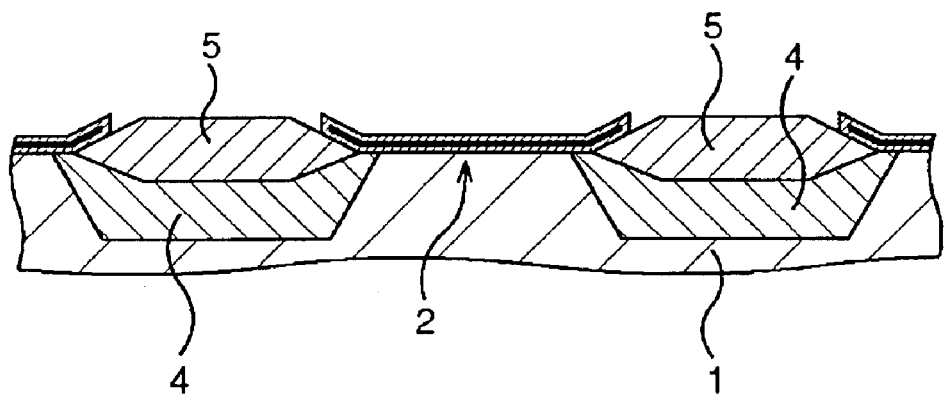
FIGS. 35A through 35C also are schematic sectional views showing the next process step as continued from FIGS. 34A through 34C.
Figure 35B:
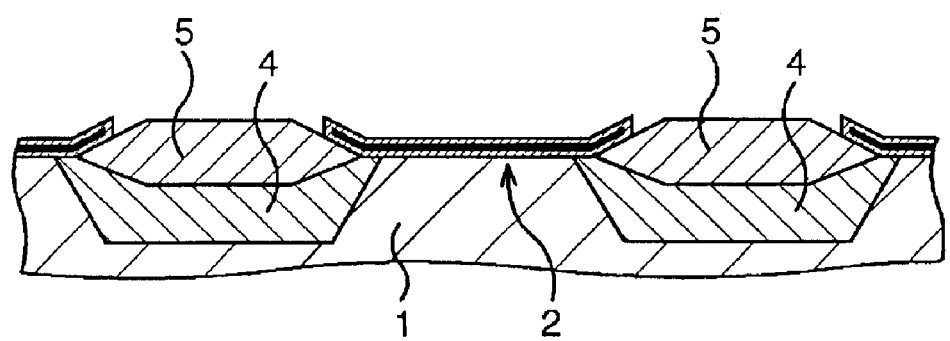
Figure 35C:
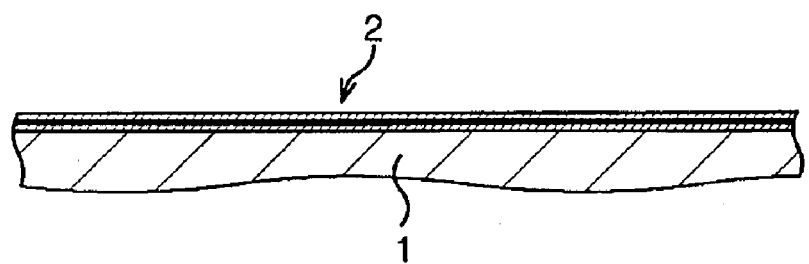
Figure 36A:
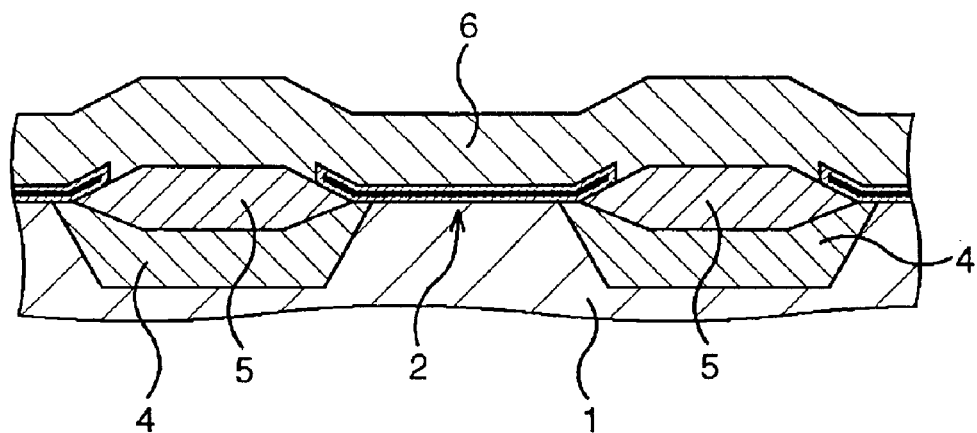
FIGS. 36A through 36C also are schematic sectional views showing the next process step as continued from FIGS. 35A through 35C.
Figure 36B:
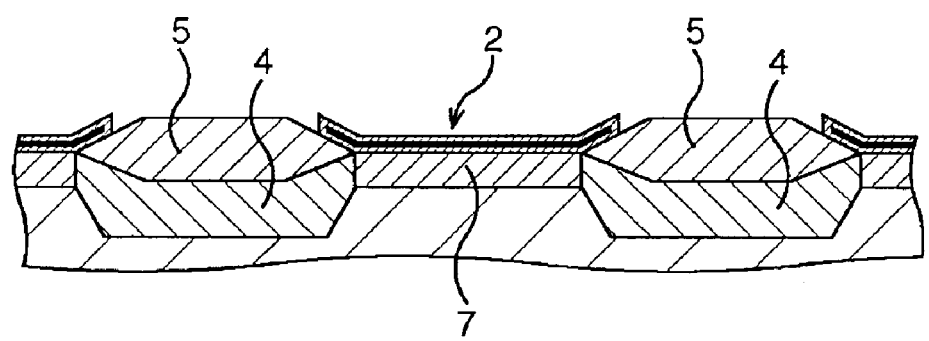
Figure 36C:
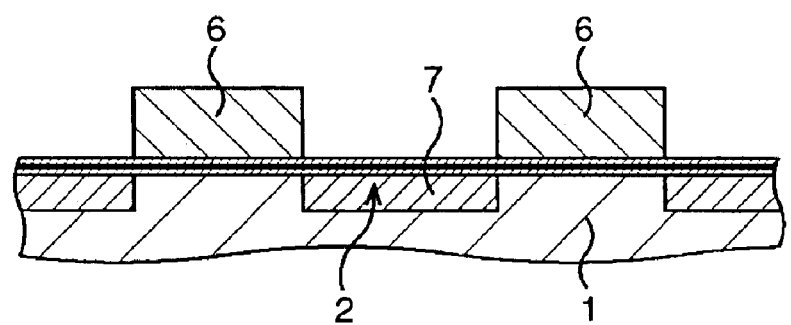
Figure 37A:
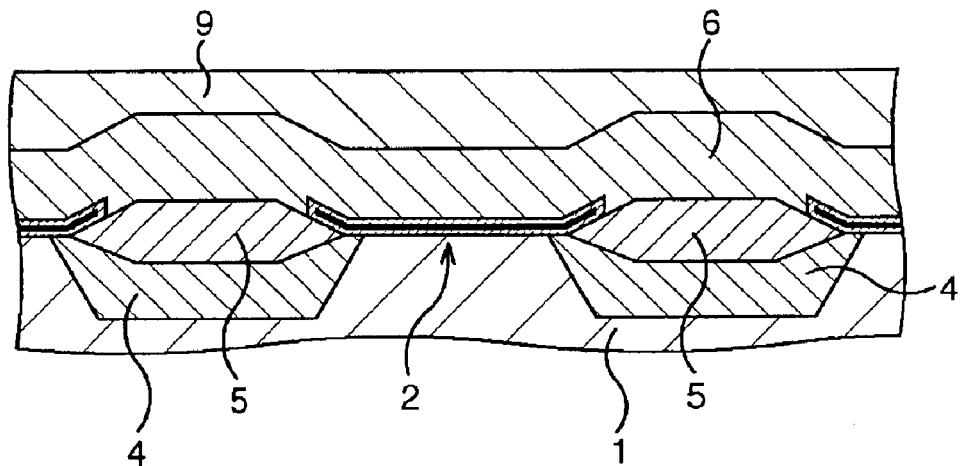
FIGS. 37A through 37C also are schematic sectional views showing the next process step as continued from FIGS. 36A through 36C.
Figure 37B:
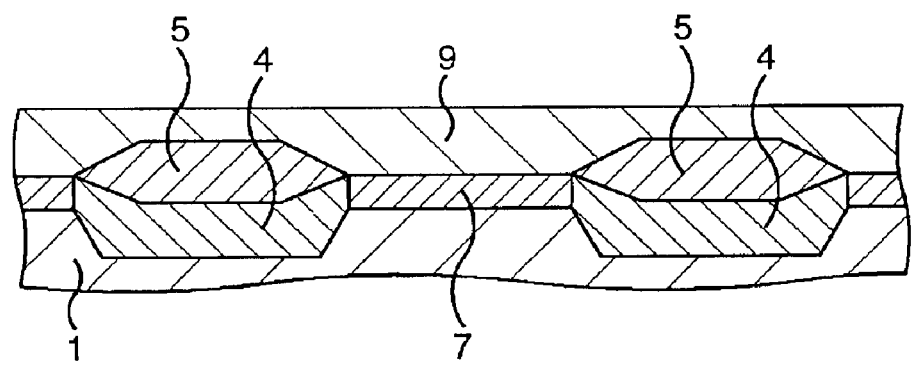
Figure 37C:
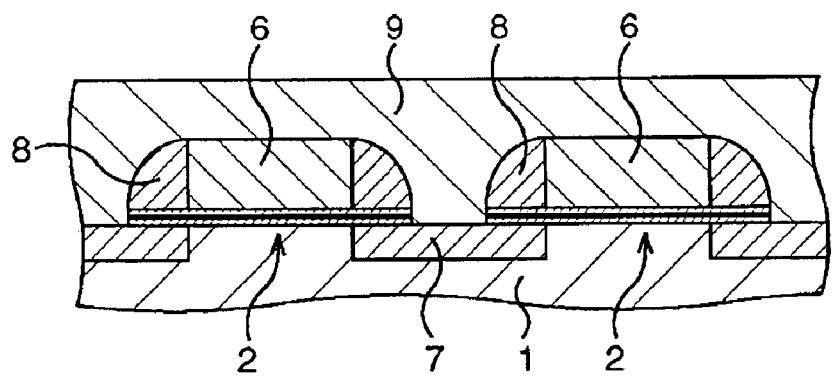

The pattern of the channel stop impurity-diffused layer 7 in the first embodiment is thus slightly different from that previously shown in FIG. 31. More specifically, as shown in FIG. 1, the word line 6 and channel stop impurity-diffused layer 7 never come into a direct contact with each other in a plan view, and instead there is a gap having a width equivalent to the width of the sidewall 8 between them.

In thus-composed device of the first embodiment, element isolation is achieved not only by the channel stop impurity-diffused layer 7 but also by the inter-layer insulating film 9 filled in the groove 21, which ensures an advanced voltage resistance. In the formation of the groove 21, as shown in FIG. 2C, there is no need of masking with any resist film, since there are the sidewalls 8 between the groove 21 between the word lines 6 and each of the word line 6, and there is the silicon nitride film 22 on the word line 6, where all of the sidewalls 8, silicon nitride film 22 and silicon oxide film 5 can be used as an etching mask. This makes it possible to finely process the word line 6 with ease, and is further advantageous in that suppressing variation in transistor characteristics due to damage possibly occurs when the groove 21 is formed by etching. The formation of the sidewall 8 is never required as a specialized process for producing them within an area of the memory cell array, but can be produced together with the sidewalls of MOS transistors formed within the area for peripheral circuit such as a decoder. Thus the number of process steps does not increase.

Next paragraphs will describe a method of fabricating thus-composed NOR-type flash memory according to the first embodiment. FIGS. 3A, 3B and 3C through FIGS. 8A, 8B and 8C are schematic sectional views serially showing process steps in the method of fabricating the NOR-type flash memory according to the first embodiment of the present invention. It is to be noted now that, in the drawings from FIG. 3A through FIG. 8C, those having Fig. number suffixed by "A" are sectional views taken along the I—I line in FIG. 1, those suffixed by "B" along the line II—II in FIG. 1, and those suffixed by "C" along the line III—III in FIG. 1.

Figure 3A:
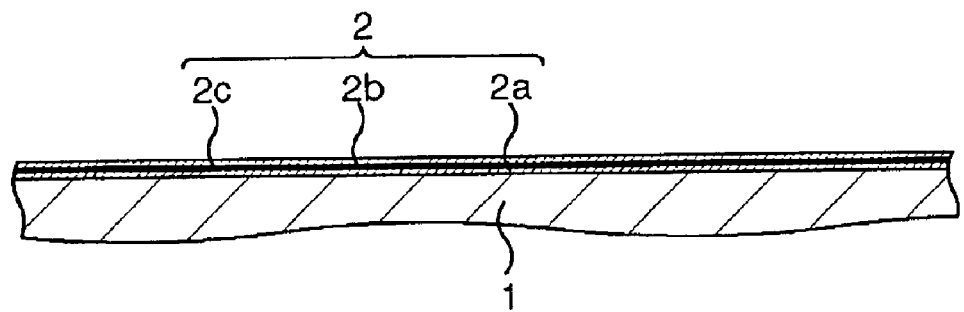
FIGS. 3A through 3C are schematic sectional views showing a process step in a method of fabricating the NOR-type flash memory according to the first embodiment of the present invention.
Figure 3B:
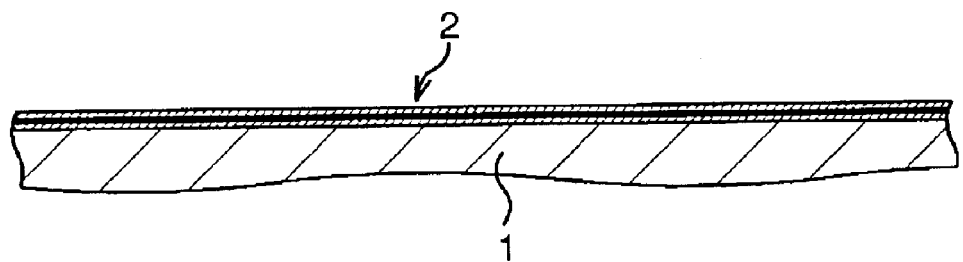
Figure 3C:
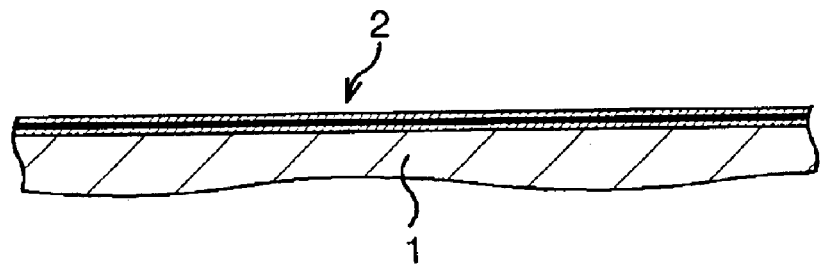

First as shown in FIGS. 3A, 3B and 3C, the ONO film 2 is formed on the surface of the semiconductor substrate 1. In the formation of the ONO film 2, the silicon oxide film 2a having a thickness of 3 to 10 nm is first formed by thermal oxidation at 800 to 1,100° C. or around. Next, on the silicon oxide film 2a, the silicon nitride film 2b having a thickness of 12 to 16 nm is formed by the CVD process at 600 to 800° C. or around. Further on the silicon nitride film 2b, the silicon oxide film 2c having a thickness of 5 to 10 nm is formed by wet oxidation at 1,000 to 1,100° C. or around. It is also allowable herein to reduce the thickness of the silicon nitride film 2b to 5 to 10 nm, and to form the silicon oxide film 2c by the CVD process.

Figure 4A:
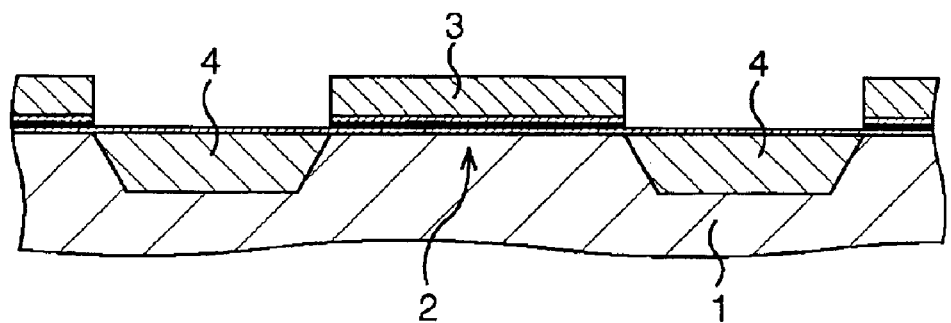
FIGS. 4A through 4C also are schematic sectional views showing the next process step as continued from FIGS. 3A through 3C.
Figure 4B:
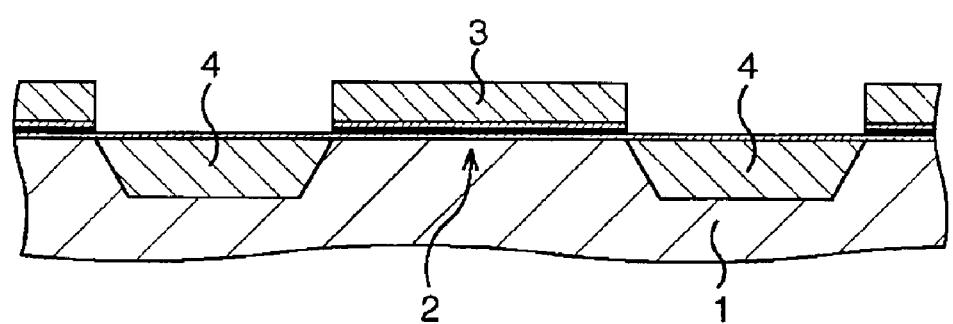
Figure 4C:
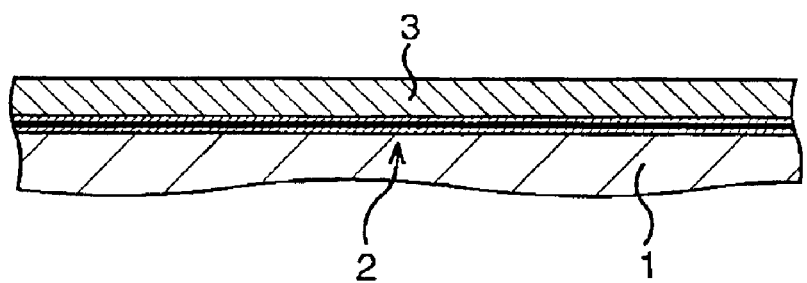

Next, the resist film 3 is formed by coating on the ONO film 2, and the resist film is then patterned as shown in FIGS. 4A through 4C so as to have openings only in a target area where the bit line impurity-diffused layers are to be formed. The exposed portion of the silicon oxide film 2c and silicon nitride film 2b, which are components of the ONO film 2, are etched off. Arsenic ions are then doped by ion implantation into the surficial portion of the semiconductor substrate 1, where masking is effected by the resist film 3, to thereby form the bit line impurity-diffused layer 4. Conditions for the ion implantation relate to a dose of $1 \times 10^{15}$ to $3 \times 10^{15}$ $cm^{-2}$ or around, an ion acceleration voltage of 60 to 80 keV, and an inclination angle (incident angle) of 0°, for example.

Figure 5A:
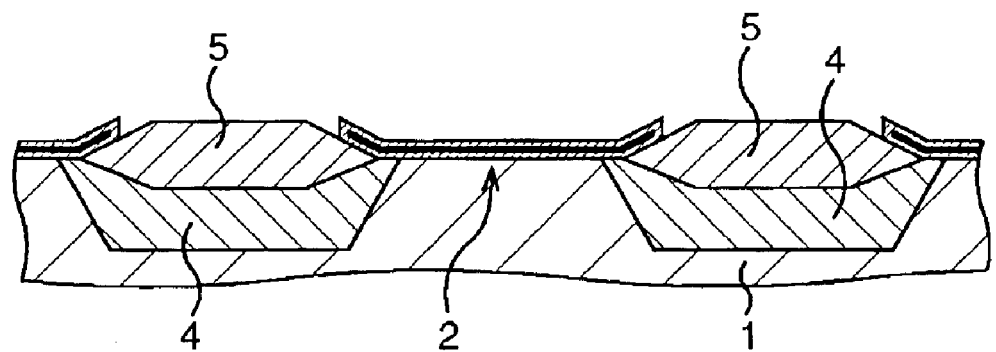
FIGS. 5A through 5C also are schematic sectional views showing the next process step as continued from FIGS. 4A through 4C.
Figure 5B:
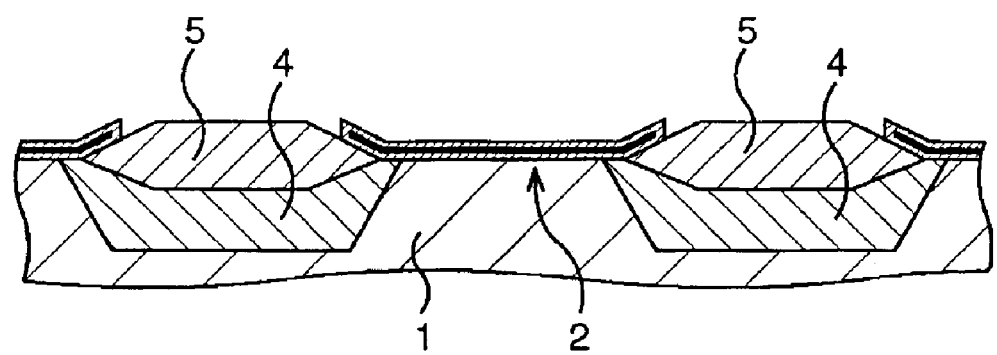
Figure 5C:
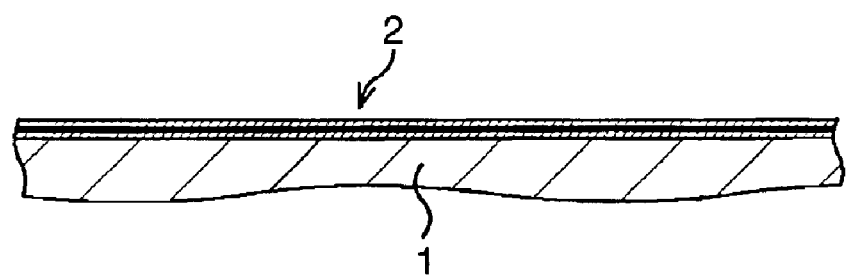

Next as shown in FIGS. 5A through 5C, the silicon oxide film 5 having a thickness of 400 to 600 nm is grown by wet oxidation at 800 to 1,000° C. or around on the surface of the bit line impurity-diffused layer 4. As a consequence of the oxidation, both edges of the ONO film 2 are lifted to some extent.

Figure 6A:
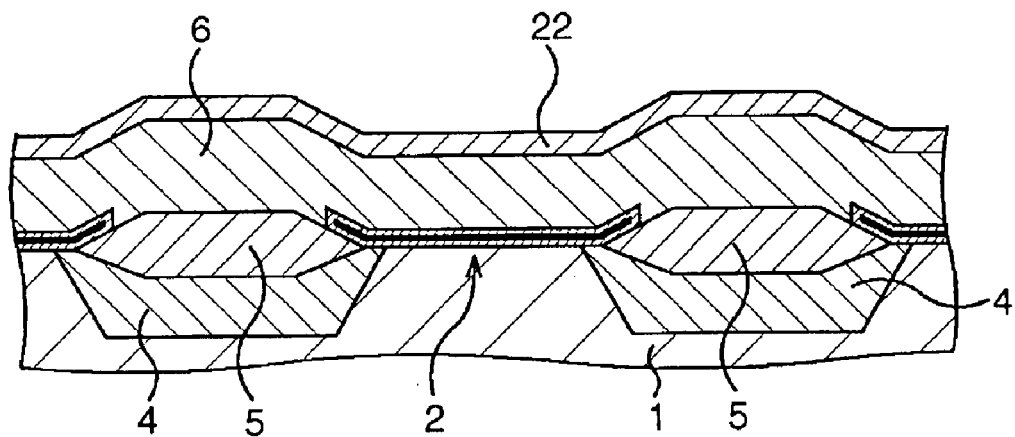
FIGS. 6A through 6C also are schematic sectional views showing the next process step as continued from FIGS. 5A through 5C.
Figure 6B:
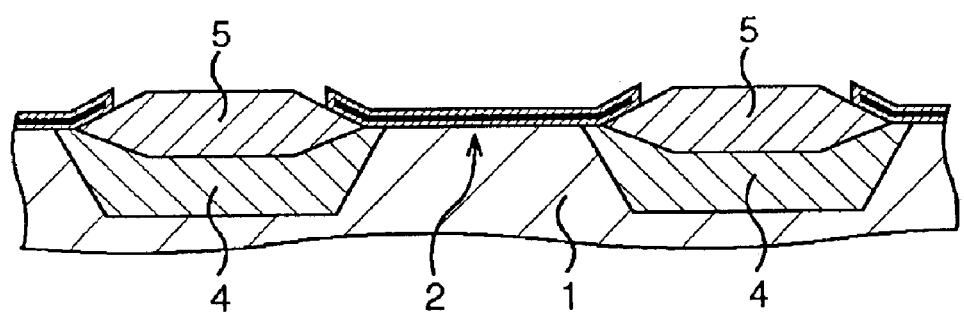
Figure 6C:
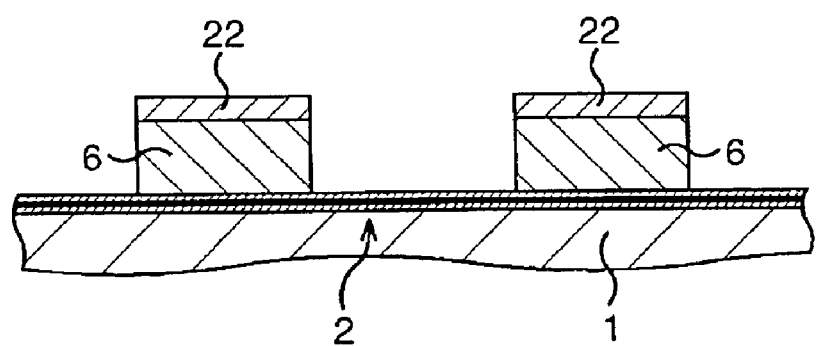

Then the phosphorus-doped amorphous silicon (DASi) film is grown over the entire surface by the CVD process, and the tungsten silicide (WSi) film is grown further thereon by the CVD process. The dose of phosphorus is, for example, within a range from $2 \times 10^{20}$ to $3 \times 10^{21}$ $cm^{-3}$ or around. The thickness of the DASi film is 100 to 150 nm, and that of the WSi film is 100 to 180 nm. In the present embodiment, a silicon nitride film is formed on the WSi film by the CVD process. The thickness of the silicon nitride film can be set to 50 to 150 nm, for example. It is also allowable herein to form, in place of the silicon nitride film, other films capable of ensuring a desirable level of etching selectivity against the semiconductor substrate 1, for example, a silicon oxide film or silicon oxinitride film. Next a resist film is formed by coating on the silicon nitride film, and then patterned so as to have a pattern equivalent to that of the word lines and gate electrodes of transistors in the peripheral circuit area, that is, so as to have openings only in a target area where the word lines and gate electrodes of transistors in the peripheral circuit area are to be formed. Then as shown in FIGS. 6A through 6C, the silicon nitride film, the WSi film and DASi film are successively etched off to thereby form the word lines 6 and gate electrodes of transistors (not shown) in the peripheral circuit area. It is to be noted that, in the peripheral circuit area, the ONO film 2 is etched off, where masking is effected by a resist film having openings in the peripheral circuit area prior to the formation of the DASi film, then the resist mask is removed, and a gate oxide film (now shown) is formed.

Figure 7A:
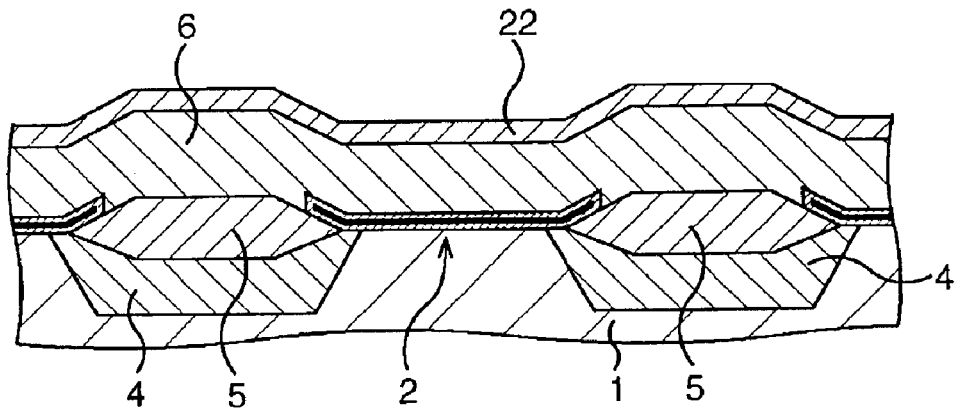
FIGS. 7A through 7C also are schematic sectional views showing the next process step as continued from FIGS. 6A through 6C.
Figure 7B:
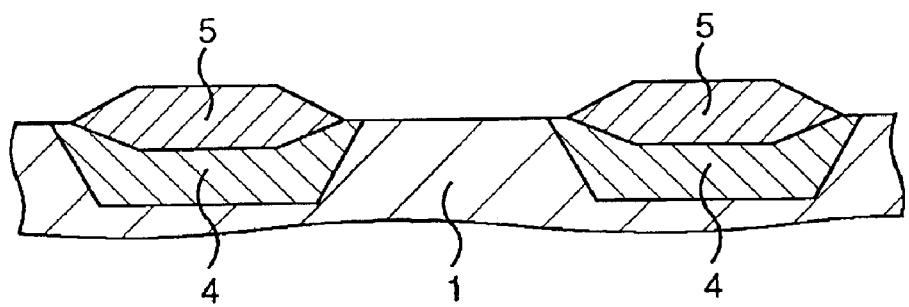
Figure 7C:
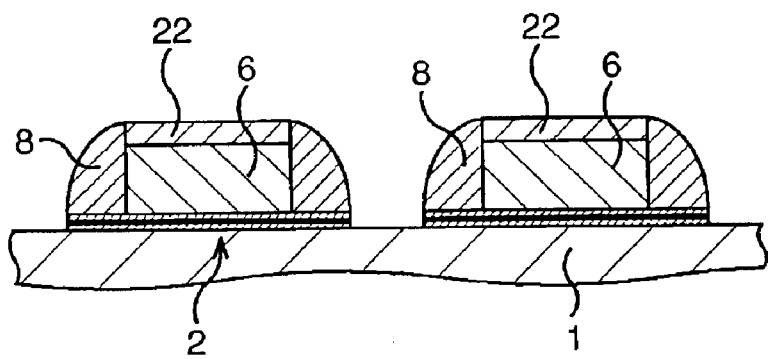

Next, a CVD oxide film is grown in a thickness of 100 to 200 nm on the entire surface, and then anisotropically etched to thereby produce the sidewalls 8 on the lateral faces of the gate electrodes (not shown) of transistors in the peripheral circuit area and of the word lines 6 as shown in FIGS. 7A through 7C. Also a portion of the ONO 2 film just under the CVD oxide film is etched off by the anisotropic etching. It is also allowable herein to form, in place of the CVD oxide film, other films capable of ensuring a desirable level of etching selectivity against the semiconductor substrate 1, for example, a silicon nitride film or silicon oxinitride film.

Figure 8A:
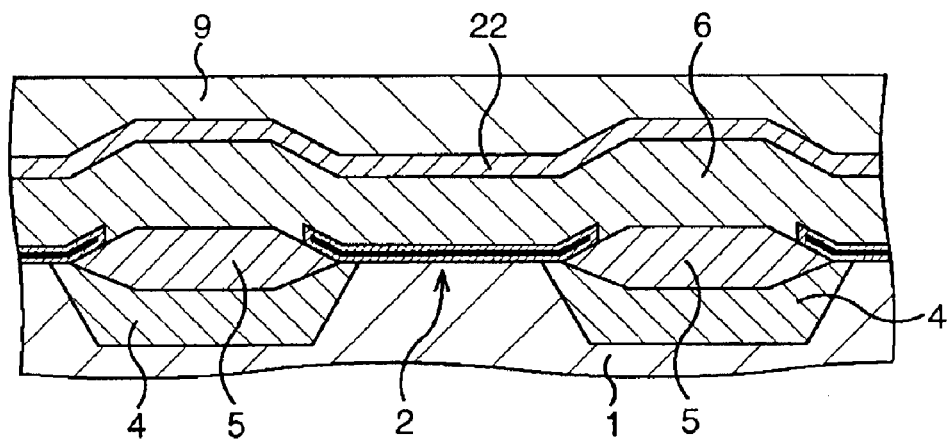
FIGS. 8A through 8C also are schematic sectional views showing the next process step as continued from FIGS. 7A through 7C.
Figure 8B:
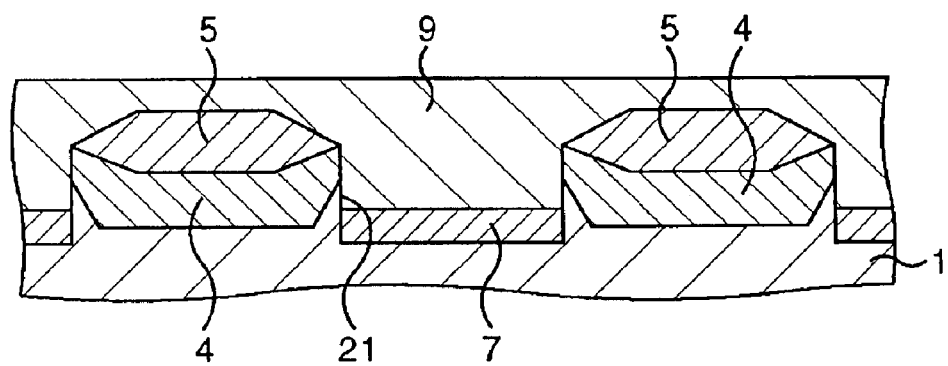
Figure 8C:
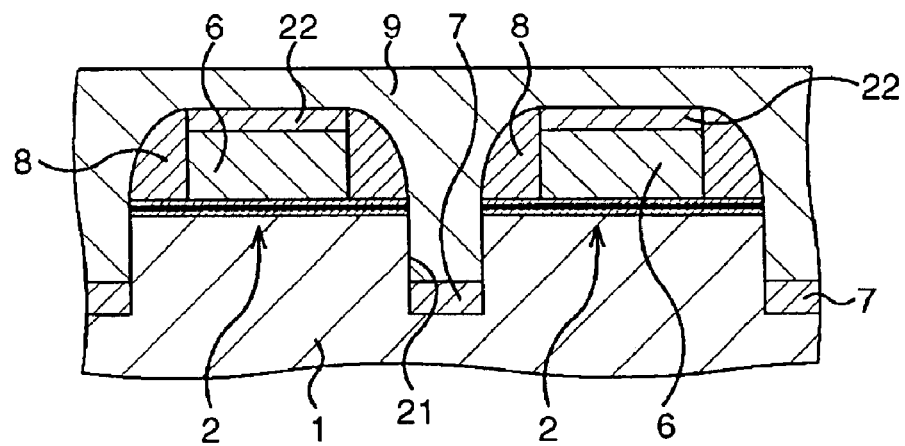

A resist film (not shown) is then formed so as to cover the peripheral circuit area and allows only the flash memory cell area to be exposed, and the semiconductor substrate 1 is then etched, where masking is effected by such resist film. Since also the silicon nitride film 22, silicon oxide film 5 and sidewall 8 can function as an etching mask in the flash memory cell area, only a portion of the semiconductor substrate 1 not covered by any of them is etched. The groove 21 is thus formed as shown in FIGS. 8A through 8C. Boron ions are then doped by ion implantation into the bottom portion of the groove 21, where masking is effected by the resist film, silicon nitride film 22, silicon oxide film 5 and sidewall 8, to thereby form the channel stop impurity-diffused layer 7. Conditions for the ion implantation relate to a dose of $5 \times 10^{12}$ to $1 \times 10^{13}$ cm$^{-2}$ or around, an ion acceleration voltage of 20 to 40 keV, and an inclination angle (incident angle) of 0°, for example. The resist film is then removed, the inter-layer insulating film 9 is formed over the entire surface by the CVD process, for example, which is followed by formation of wirings (not shown) and so forth. Thus the NOR-type flash memory according to the first embodiment is fabricated. It is also allowable to form the channel stop impurity-diffused layer 7 also on the lateral faces of the groove 21 by doping boron ions by oblique angle ion implantation. This successfully reduces narrow channel effect of the transistors.

Figure 9A:
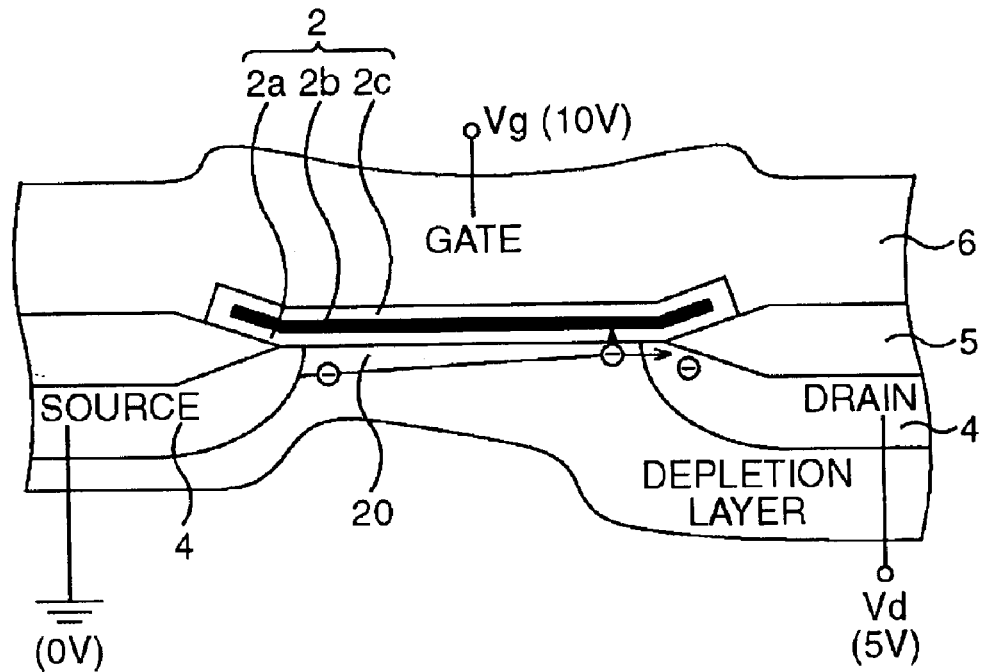
FIGS. 9A and 9B are schematic drawings showing operations of the NOR-type flash memory.
Figure 9B:
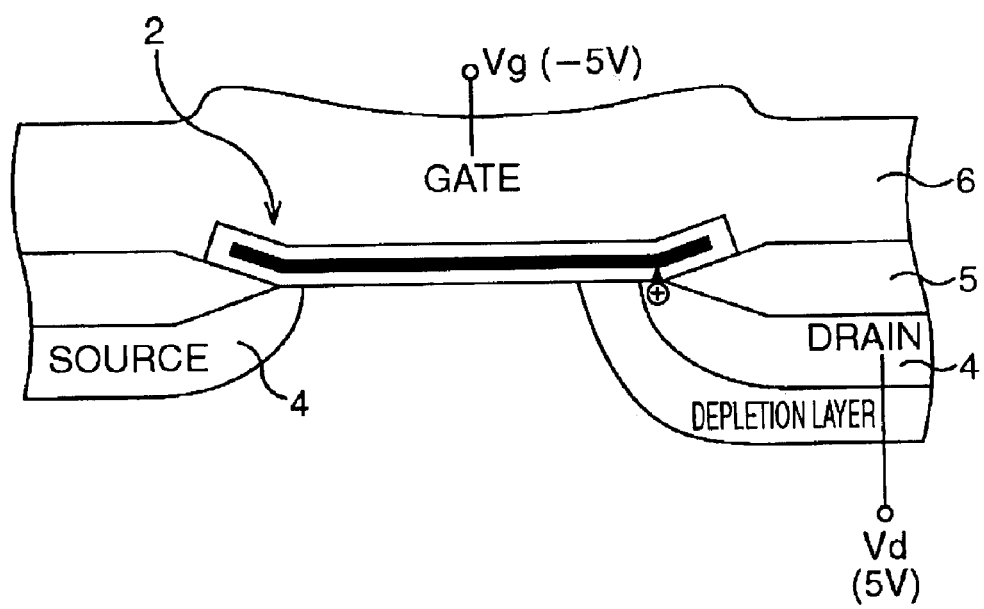
Figure 10A:
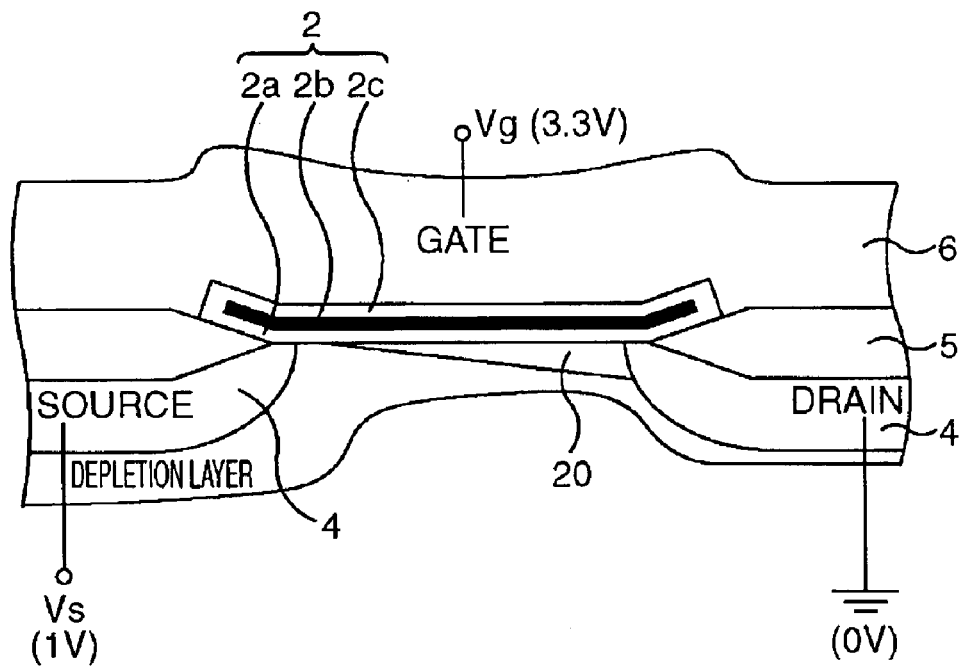
FIGS. 10A and 10B also are schematic drawings showing operations of the NOR-type flash memory.
Figure 10B:
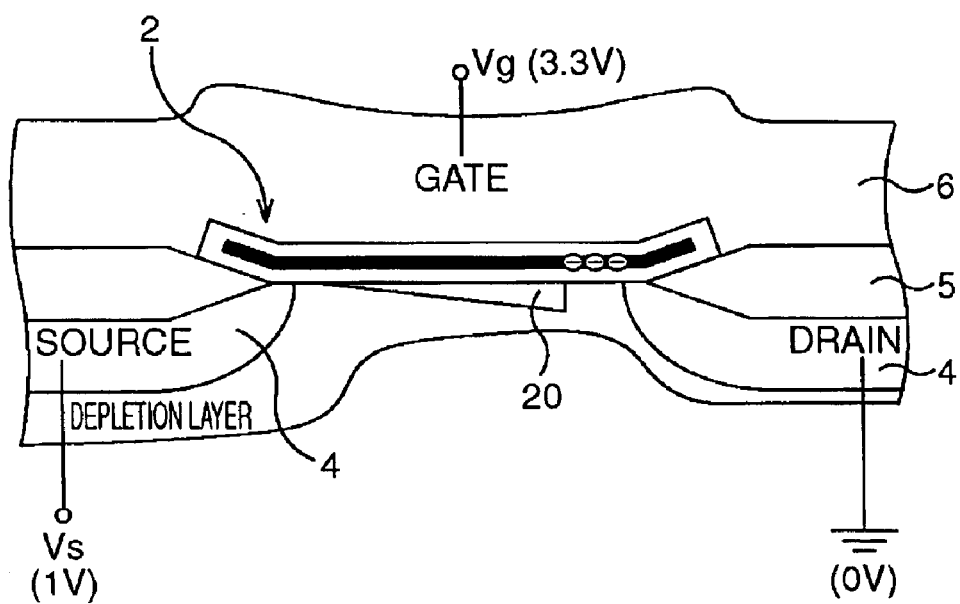

FIGS. 9A through 10B are schematic drawings showing operation of the NOR-type flash memory. FIG. 9A shows a write operation of data "0", and FIG. 9B shows an erase operation of data "0". FIGS. 10A and 10B show read operations of data, where FIG. 10A shows a case where data "1" is preliminarily stored, and FIG. 10B shows a case where data "0" is preliminarily stored.

For the case where write operation of data is effected by injection of hot electron (CHE), as shown in FIG. 9A, the gate voltage, drain voltage and source voltage are set to levels, for example, of 10 V, 5 V and 0 V, respectively. The voltage level of the substrate is now 0 V. Electrons injected from a channel 20 are trapped into the silicon nitride film 2b, which is a component of the ONO film 2, or at the boundary between the silicon oxide film 2a and silicon nitride film 2b. While FIG. 9A shows an exemplary case where the electrons are injected in the vicinity of the drain, it is also possible, by exchanging the source voltage and drain voltage, to inject electrons in the vicinity of the source to thereby write data. That is, one memory cell can store two bits as indicated by the broken-line circles.

On the other hand, for the case where erase operation of data proceeds based on tunnel effect between the energy bands, as shown in FIG. 9B, the gate voltage, drain voltage and source voltage are set to levels, for example, of −5 V, 5 V and floating level, respectively. The voltage level of the substrate is now 0 V. Holes are injected from the bit line impurity-diffused layer 4 equivalent to the drain to the silicon nitride film 2b, which is a component of the ONO film 2, or injected to the boundary between the silicon oxide film 2a and silicon nitride film 2b. If electrons are preliminarily trapped in the silicon nitride film 2b or at the above-described boundary, these electrons are cancelled by the injected holes to thereby accomplish erasure of the data. On the contrary if there are no electron trapped in the silicon nitride film 2b or at the above-described boundary, the injected holes are trapped therein or thereat. While FIG. 9B shows an exemplary case where the holes are injected only in the vicinity of the drain, it is also possible, by equalizing the source voltage during the erasure with drain voltage at 5 V, for example, to cancel also electrons injected in the vicinity of the source together with those injected in the vicinity of the drain, to thereby erase data en bloc.

When the data is read out, as shown in FIGS. 10A and 10B, the gate voltage, drain voltage and source voltage are set to levels, for example, of 3.3 V, 1 V and 0 V, respectively. The voltage level of the substrate is again 0 V. For the case where no trapped electron present in the silicon nitride film 2b or at the boundary between the silicon oxide film 2a and silicon nitride film 2b, as shown in FIG. 10A, a bit line impurity-diffused layer 4 equivalent to the source and another bit line impurity-diffused layer 4 equivalent to the drain are connected by the channel 20, and an inter-source-drain current flows between these bit line impurity-diffused layers 4, which results in read out of data "0". On the other hand, for the case where electrons are trapped in the silicon nitride film 2b or at the above-described boundary, as shown in FIG. 10B, the channel 20 cannot reach the bit line impurity-diffused layer 4 equivalent to the drain, and the inter-source-drain current does not flow between two bit line impurity-diffused layers 4, which results in read out of data "1".

(Second Embodiment)

Figure 11:
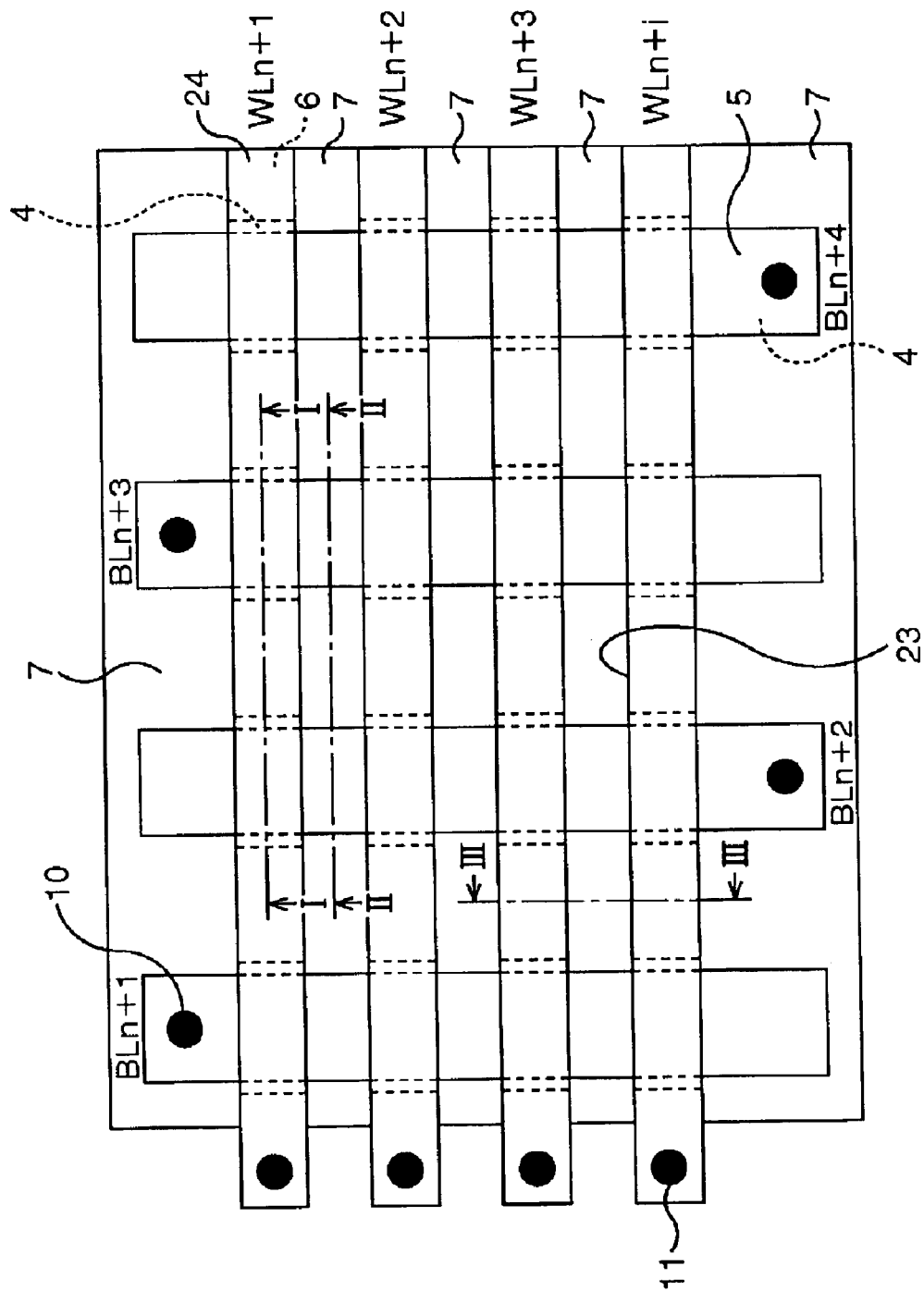
FIG. 11 is a layout chart showing a constitution of a non-volatile semiconductor memory device (NOR-type flash memory) according to a second embodiment of the present invention.
Figure 12A:
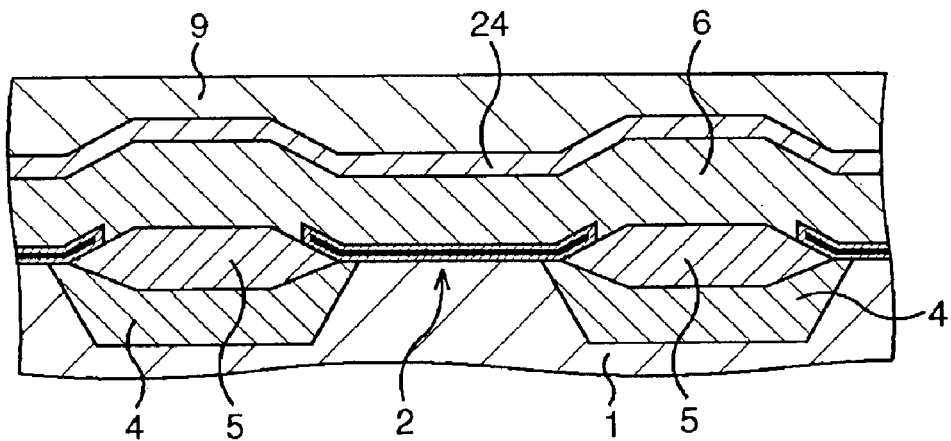
FIGS. 12A through 12C are schematic sectional views showing a constitution of the NOR-type flash memory according to the second embodiment of the present invention.
Figure 12B:
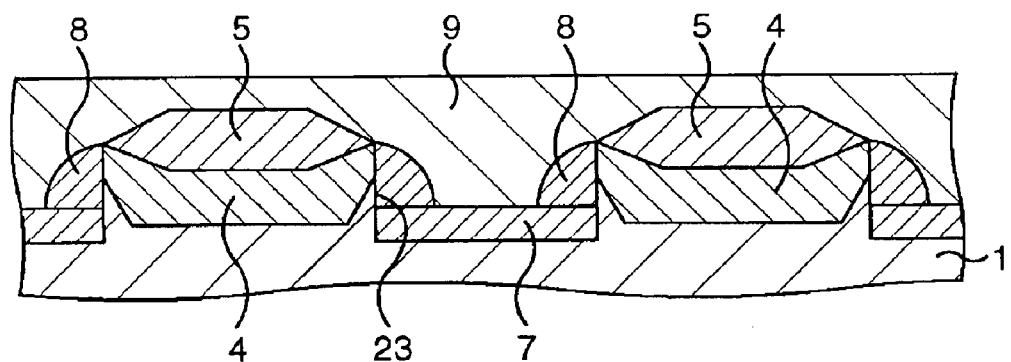
Figure 12C:
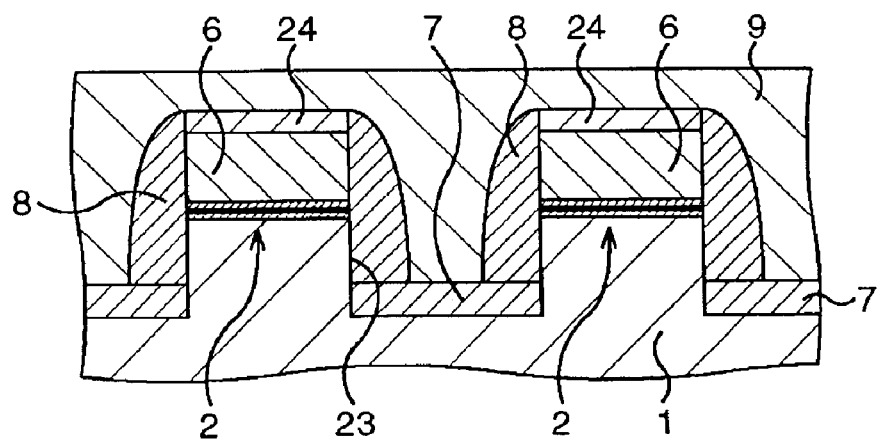

Next, a non-volatile semiconductor memory device (NOR-type flash memory) according to a second embodiment of the present invention will be explained. A circuit constitution in the second embodiment is same as that previously shown in FIG. 30, but a layout and sectional structure are differed from those in the first conventional example and first embodiment. FIG. 11 is a layout chart showing a constitution of the non-volatile semiconductor memory device (NOR-type flash memory) according to the second embodiment of the present invention. FIGS. 12A, 12B and 12C are schematic sectional views taken along the I—I line, II—II line and III—III line, respectively, in FIG. 11.

In the second embodiment, a cobalt silicide film 24 is formed on the word line 6. The area of the semiconductor substrate 1 having formed therein or thereon neither of the bit line impurity-diffused layer 4 and word lines 6 has a groove 23 formed therein. In this embodiment, the channel stop impurity-diffused layer 7 is formed at the bottom of the groove 23. The sidewall 8 is formed in the groove 23 between the bit line impurity-diffused layers 4 as shown in FIG. 12B, and is formed so as to extend over the area from the lateral faces of the word line 6 and the cobalt silicide film 24 stacked thereon to the bottom of the groove 23 between the word lines 6 as shown in FIG. 12C. The ONO film 2 is thus not formed under the sidewall 8, unlike the case shown in the first embodiment. The inter-layer insulating film 9 is filled also in the groove 23. The inter-layer insulating film 9 is formed by the CVD process, for example, similarly to the case of the first embodiment. It is to be noted that illustration of the insulating films (ONO film 2, sidewall 8 and inter-layer insulating film 9) other than the silicon oxide film 5 on the bit line impurity-diffused layer 4 are omitted in FIG. 11.

In thus-composed device of the second embodiment, element isolation is achieved not only by the channel stop impurity-diffused layer 7 but also by the inter-layer insulating film 9 filled in the groove 23. In the formation of the groove 23, as shown in FIG. 12C, there is no need of masking with any resist film; since an anti-reflective layer (not shown) which is formed between the material layer to be processed and a resist film in the photolithographic patterning process for the word line 6, and the silicon oxide film 5 are available as an etching mask. This ensures an advanced voltage resistance, and makes it possible to finely process the word line 6 with ease.

Next paragraphs will describe a method of fabricating thus-composed NOR-type flash memory according to the second embodiment. FIGS. 13A, 13B and 13C through FIGS. 15A, 15B and 15C are schematic sectional views serially showing process steps in the method of fabricating the NOR-type flash memory according to the second embodiment of the present invention. It is to be noted now that, in the drawings from FIG. 13A through FIG. 15C, those having Fig. number suffixed by "A" are sectional views taken along the I—I line in FIG. 11, those suffixed by "B" along the line II—II in FIG. 11, and those suffixed by "C" along the line III—III in FIG. 11.

First, similarly to the case of the first embodiment, process steps shown in FIGS. 3A, 3B and 3C to FIGS. 6A, 6B and 6C are proceeded.

Figure 13A:
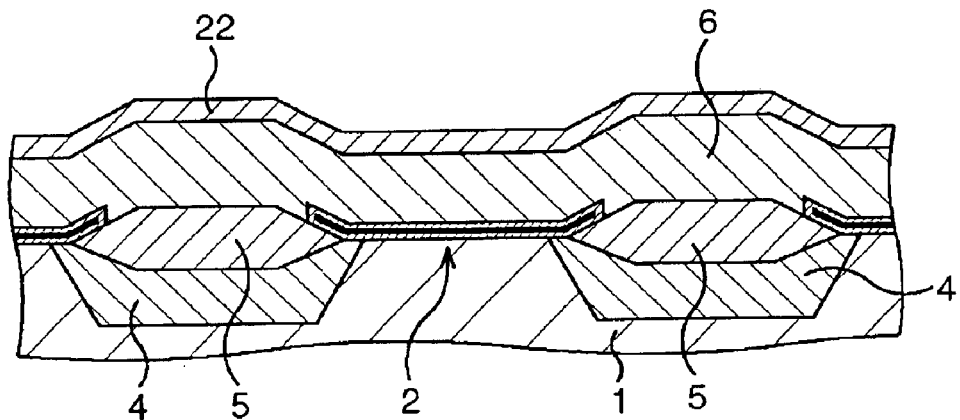
FIGS. 13A through 13C are schematic sectional views showing a process step in a method of fabricating the NOR-type flash memory according to the second embodiment of the present invention.
Figure 13B:
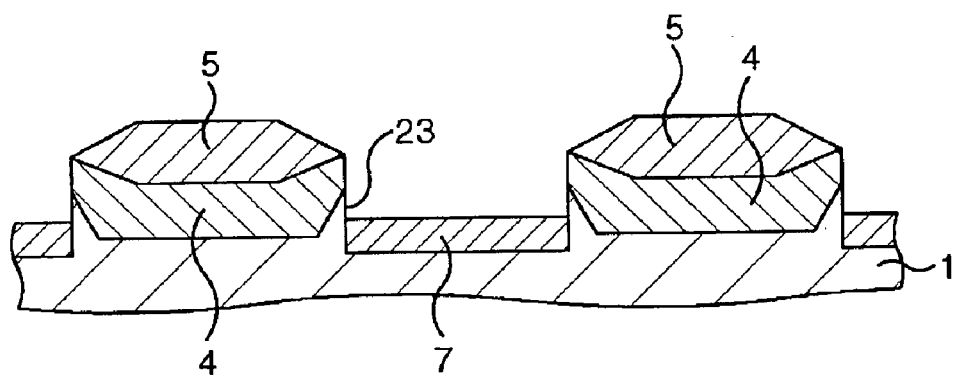
Figure 13C:
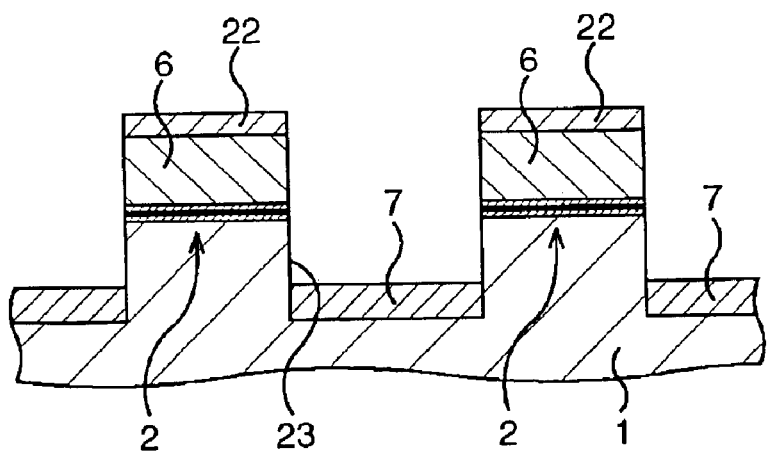

Next, a resist film (not shown) is formed so as to cover the peripheral circuit area and allows only the flash memory cell area to be exposed, and the semiconductor substrate 1 is then etched, where masking is effected by the resist film. Since also the silicon nitride film 22 and silicon oxide film 5 can function as an etching mask in the flash memory cell area, only a portion of the ONO film 2 and semiconductor substrate 1 not covered by any of them is etched. The groove 23 is thus formed as shown in FIGS. 13A through 13C. Boron ions are then doped by ion implantation into the bottom portion of the groove 23, where masking is effected by the resist film, silicon nitride film 22 and silicon oxide film 5, to thereby form the channel stop impurity-diffused layer 7. Conditions for the ion implantation relate to a dose of $5 \times 10^{12}$ to $1 \times 10^{13}$ $cm^{-2}$ or around, an ion acceleration voltage of 20 to 40 keV, and an inclination angle (incident angle) of 0°, for example. The resist film is then removed. It is also allowable to form the channel stop impurity-diffused layer 7 also on the lateral faces of the groove 23 by doping boron ions by oblique angle ion implantation. It is still also allowable to pattern the resist film so as to have openings between the adjacent word lines but distant from the both. For the case where the resist film is thus patterned, the groove 23 can be formed as being distant from the edge of the word lines 6 since both of the resist film and silicon oxide film 5 can function as an etching mask. There is no fear that the resist film adversely affects the fine processing of the word line 6, since it is not used as an etching mask for forming the word line 6 unlike the case in the third conventional example. This ensures fine processing of the word line 6 even if the resist film is relatively thick, and avoidance of damage before the groove formation even if the resist film is relatively thin.

Figure 14A:
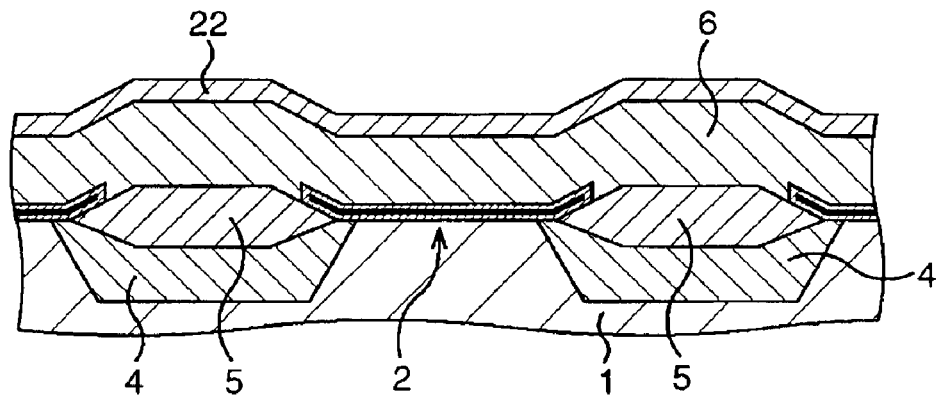
FIGS. 14A through 14C also are schematic sectional views showing the next process step as continued from FIGS. 13A through 13C.
Figure 14B:
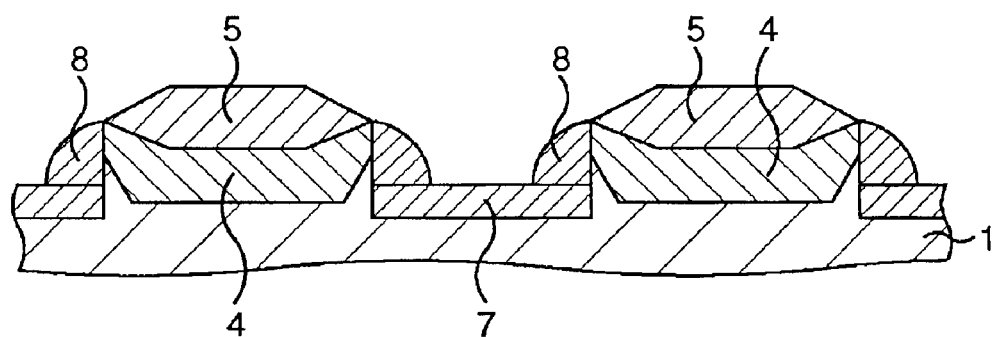
Figure 14C:
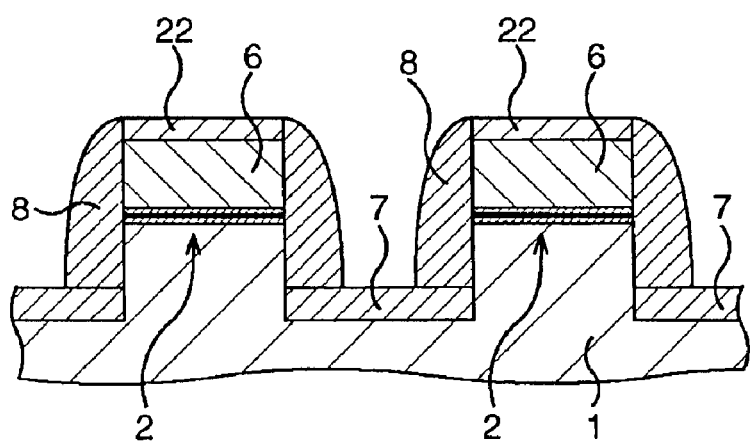

Next, a CVD oxide film is grown in a thickness of 100 to 200 nm on the entire surface, and then anisotropically etched to thereby produce the sidewalls 8 on the lateral faces of the gate electrodes (not shown) of transistors in the peripheral circuit area, on the lateral faces of the groove 23 between the bit line impurity-diffused layers 4 as shown in FIG. 14B, and so as to extend over the area from the lateral faces of the word line 6 and the cobalt silicide film 24 stacked thereon to the bottom of the groove 23 between the word lines 6 as shown in FIG. 14C. It is also allowable herein to form, in place of the CVD oxide film, other films capable of ensuring a desirable level of etching selectivity against the semiconductor substrate 1, for example, a silicon nitride film or silicon oxinitride film.

Figure 15A:
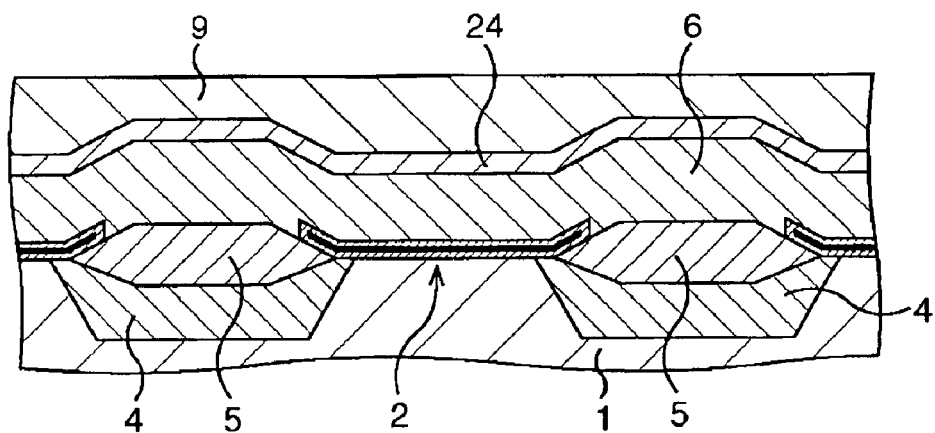
FIGS. 15A through 15C also are schematic sectional views showing the next process step as continued from FIGS. 14A through 14C.
Figure 15B:
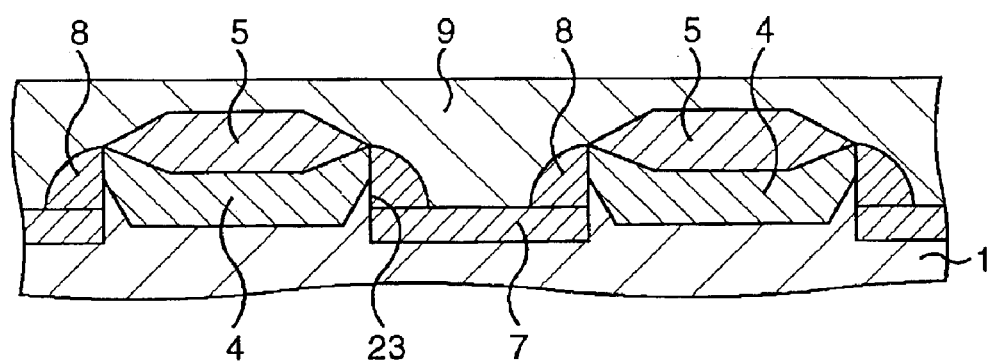
Figure 15C:
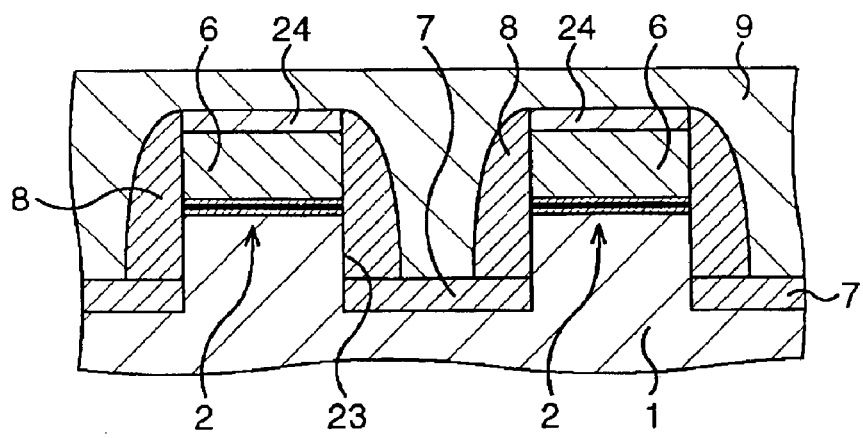

The silicon nitride film 22 on the word lines 6 and on the gate electrode of the transistors in the peripheral circuit area is then removed by boiling treatment using phosphoric acid, for example. This is followed by treatment with hydrofluoric acid for removing the oxide film on the source-and-drain regions (not shown) of the transistors in the peripheral circuit area. A Co film and a TiN film are then successively formed by sputtering on the entire surface, and are then subjected to lamp annealing (rapid thermal annealing: RTA) at 450 to 550° C., to thereby allow these films to react with the surfaces of the word line 6 and the gate electrode, source-and-drain region of the transistors in the peripheral circuit area. The cobalt silicide film 24 is thus formed as shown in FIGS. 15A through 15C. The inter-layer insulating film 9 is then formed over the entire surface by the CVD process, for example, which is followed by formation of wirings (not shown) and so forth. Thus the NOR-type flash memory according to the second embodiment is fabricated.

(Third Embodiment)

Figure 16:
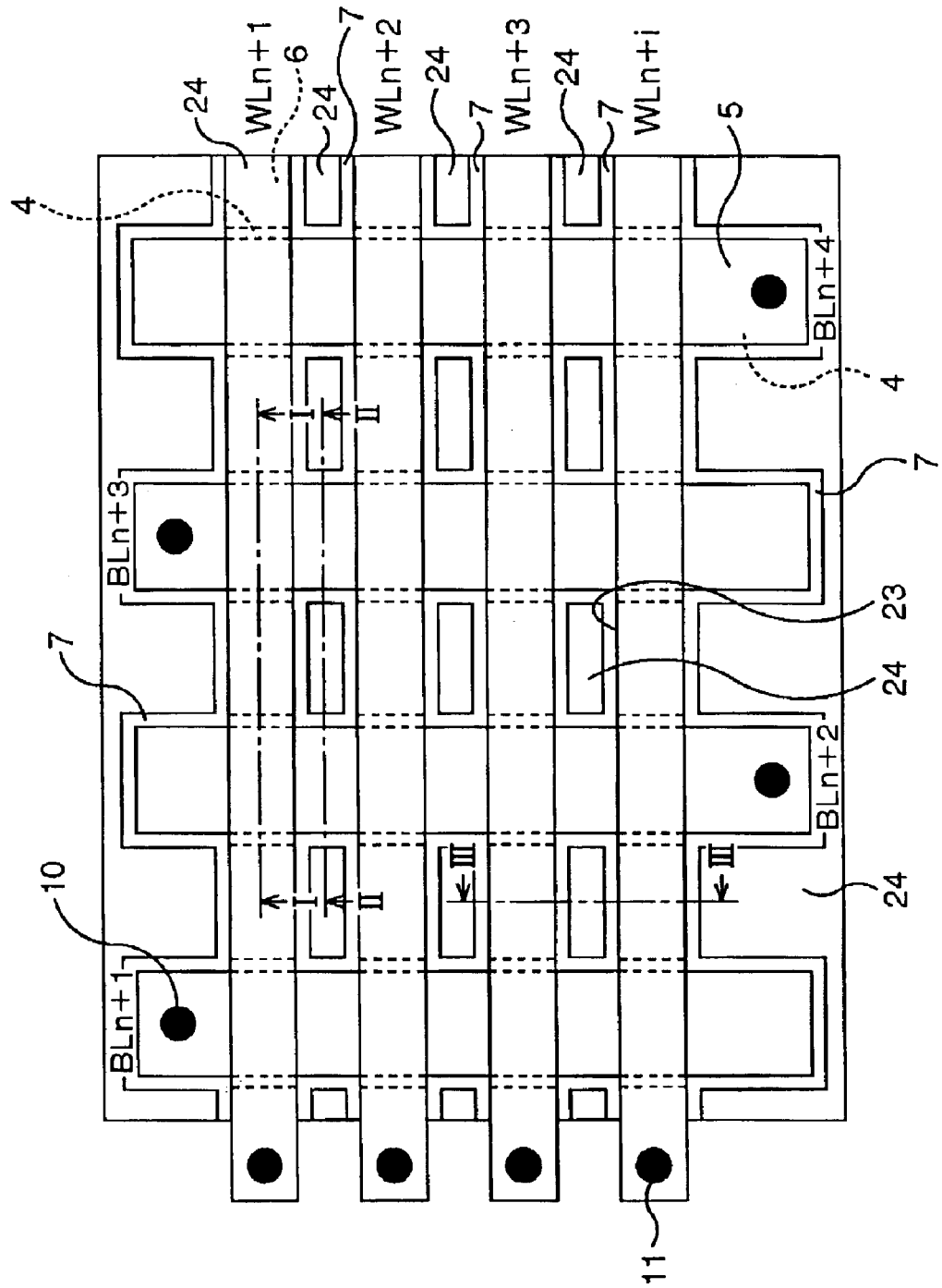
FIG. 16 is a layout chart showing a constitution of a non-volatile semiconductor memory device (NOR-type flash memory) according to a third embodiment of the present invention.
Figure 17A:
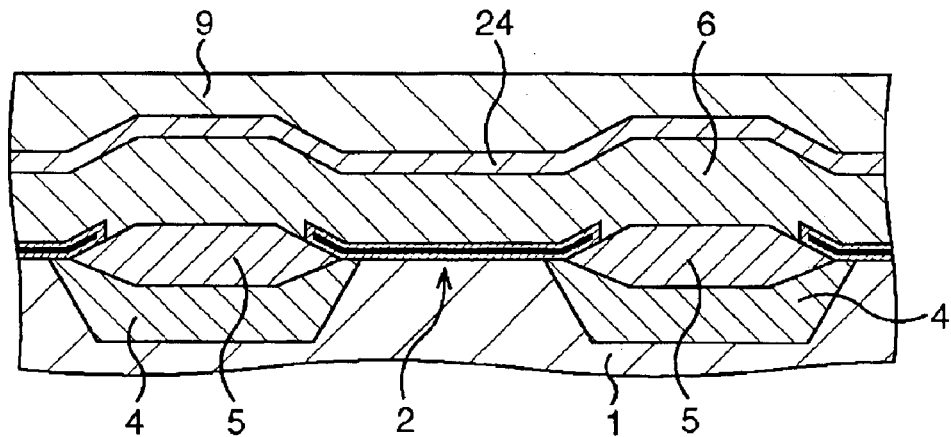
FIGS. 17A through 17C are schematic sectional views showing a constitution of the NOR-type flash memory according to the third embodiment of the present invention.
Figure 17B:
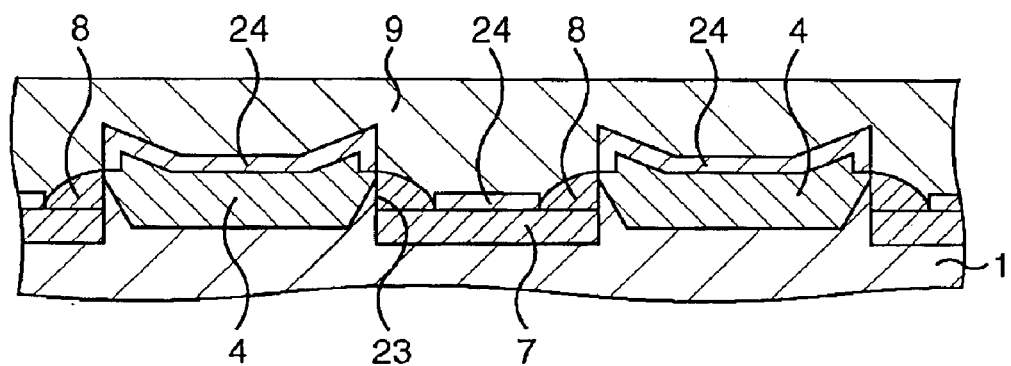
Figure 17C:
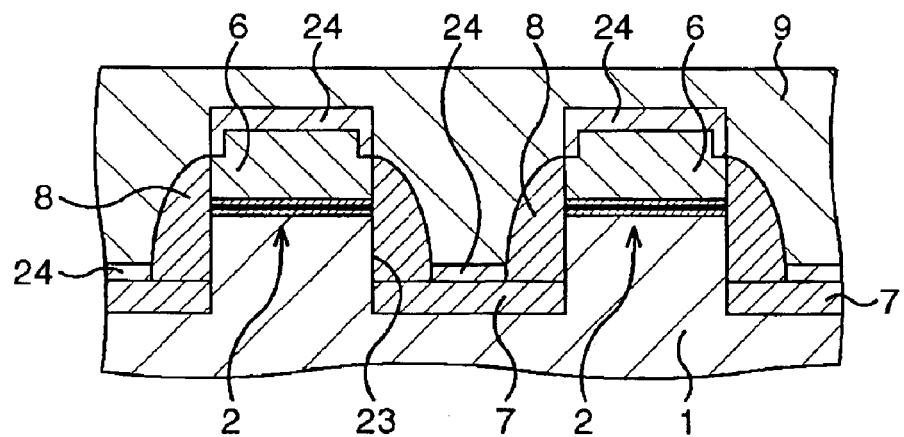

Next, a non-volatile semiconductor memory device (NOR-type flash memory) according to a third embodiment of the present invention will be explained. A circuit constitution in the third embodiment is same as that previously shown in FIG. 30, but a layout and sectional structure are differed from those in the first conventional example, and in the first and second embodiments. FIG. 16 is a layout chart showing a constitution of the non-volatile semiconductor memory device (NOR-type flash memory) according to the third embodiment of the present invention. FIGS. 17A, 17B and 17C are schematic sectional views taken along the I—I line, II—II line and III—III line, respectively, in FIG. 16.

In the third embodiment, the cobalt silicide film 24 is formed not only on the word line 6, but also on the bit line impurity-diffused layer 4. The silicon oxide film 5 is not formed on the bit line impurity-diffused layer 4. Similarly to the case in the second embodiment, the area of the semiconductor substrate 1 having formed therein or thereon neither of the bit line impurity-diffused layer 4 and word lines 6 has a groove 23 formed therein. In this embodiment, the channel stop impurity-diffused layer 7 is formed at the bottom of the groove 23. The sidewall 8 is, between the bit line impurity-diffused layers 4 as shown in FIG. 17B, formed in the groove 23 at a level lower than the lower end of the cobalt silicide film 24 formed on the bit line impurity-diffused layer 4, and between the word lines 6 as shown in FIG. 17C, formed over the area from the level of the lower end of the cobalt silicide film 24 to the bottom of the groove 23. The cobalt silicide film 24 is formed also in the area surrounded by the sidewall 8 on the channel stop impurity-diffused layer 7. It is to be noted that illustration of the insulating films (ONO film 2, sidewall 8 and inter-layer insulating film 9) other than the silicon oxide film 5 on the bit line impurity-diffused layer 4 are omitted in FIG. 16.

With thus-composed flash memory according to the third embodiment, same operations and effects with those obtained by the second embodiment can be obtained, and the resistivity of the bit line can also be reduced by virtue of the cobalt silicide film 24 formed on the bit line impurity-diffused layer 4. While the cobalt silicide film 24 also remains on the channel stop impurity-diffused layer 7, the cobalt silicide film 24 is isolated by the sidewall 8 both from the word line 6 and bit line impurity-diffused layer 4, so that short-circuit therebetween is prevented.

Next paragraphs will describe a method of fabricating thus-composed NOR-type flash memory according to the third embodiment. FIGS. 18A, 18B and 18C through FIGS. 20A, 20B and 20C are schematic sectional views serially showing process steps in the method of fabricating the NOR-type flash memory according to the third embodiment of the present invention. It is to be noted now that, in the drawings from FIG. 18A through FIG. 20C, those having Fig. number suffixed by "A" are sectional views taken along the I—I line in FIG. 16, those suffixed by "B" along the line II—II in FIG. 16, and those suffixed by "C" along the line III—III in FIG. 16.

First, similarly to the case of the first embodiment, process steps shown in FIGS. 3A, 3B and 3C to FIGS. 6A, 6B and 6C are proceeded.

Figure 18A:
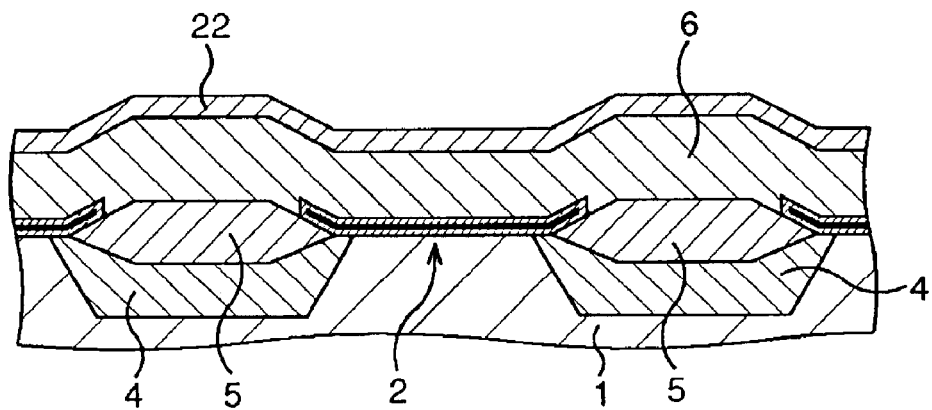
FIGS. 18A through 18C are schematic sectional views showing a process step in a method of fabricating the NOR-type flash memory according to the third embodiment of the present invention.
Figure 18B:
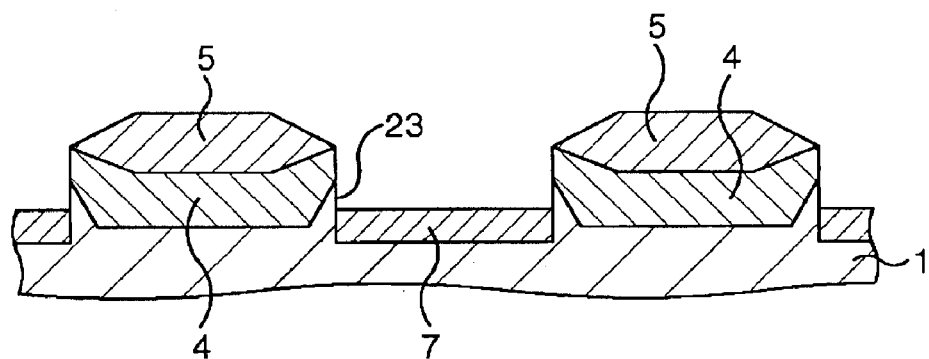
Figure 18C:
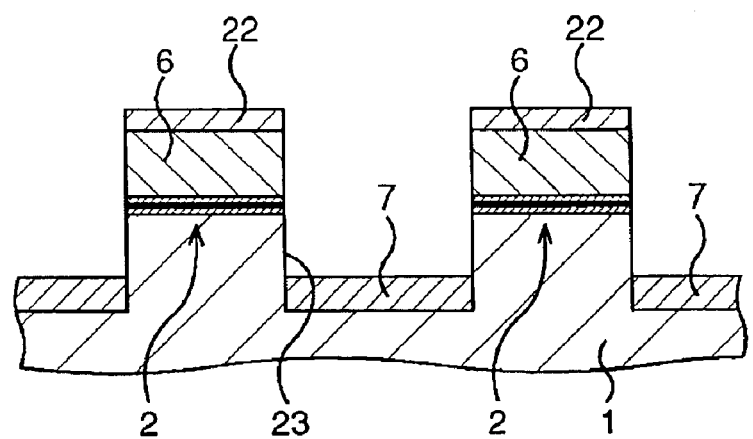

Next, a resist film (not shown) is formed so as to cover the peripheral circuit area and allows only the flash memory cell area to be exposed, and the semiconductor substrate 1 is then etched, where masking is effected by such resist film. Since also the silicon nitride film 22 and silicon oxide film 5 can function as an etching mask in the flash memory cell area, only a portion of the ONO film 2 and semiconductor substrate 1 not covered by any of them is etched. The groove 23 is thus formed as shown in FIGS. 18A through 18C. Boron ions are then doped by ion implantation into the bottom portion of the groove 23, where masking is effected by the resist film, silicon nitride film 22 and silicon oxide film 5, to thereby form the channel stop impurity-diffused layer 7. Conditions for the ion implantation relate to a dose of $5\times10^{12}$ to $1\times10^{13}$ cm$^{-2}$ or around, an ion acceleration voltage of 20 to 40 keV, and an inclination angle (incident angle) of 0°, for example. The resist film is then removed. It is also allowable to form the channel stop impurity-diffused layer 7 also on the lateral faces of the groove 23 by doping boron ions by oblique angle ion implantation. It is still also allowable to pattern the resist film so as to have openings between the adjacent word lines but distant from the both. For the case where the resist film is thus patterned, the groove 23 can be formed as being distant from the edge of the word lines 6 since both of the resist film and silicon oxide film 5 can function as an etching mask.

Figure 19A:
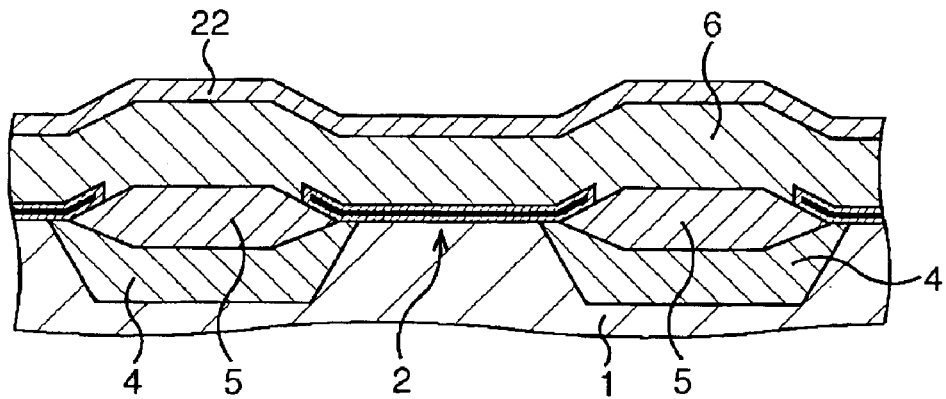
FIGS. 19A through 19C also are schematic sectional views showing the next process step as continued from FIGS. 18A through 18C.
Figure 19B:
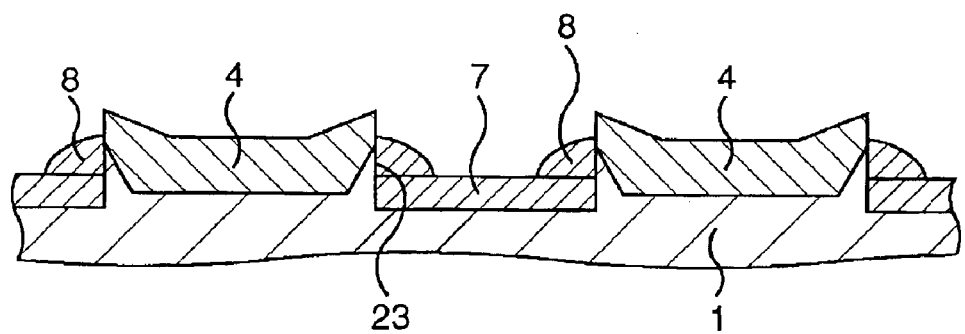
Figure 19C:
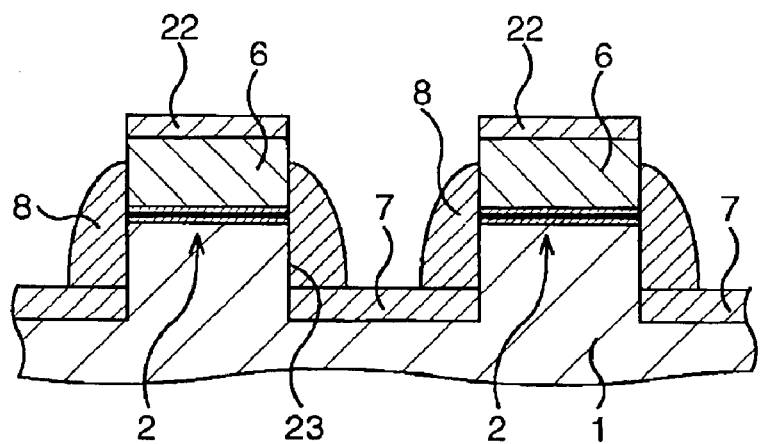

Next, a CVD oxide film is grown in a thickness of 100 to 200 nm on the entire surface, and then anisotropically etched. Over-etching is now carried out in this embodiment. As a consequence, the sidewall 8 is formed on the lateral faces of the gate electrodes (not shown) of the transistors in the peripheral circuit area, formed in the groove 23 between the bit line impurity-diffused layers 4 as shown in FIG. 19B, and formed so as to extend over the area from the lateral faces of the word line 6 and the cobalt silicide film 24 stacked thereon to the bottom of the groove 23 between the word lines 6 as shown in FIG. 19C, where the silicon oxide film 5 is also removed as shown in FIG. 19B. The height of the sidewall 8 is lower than that in the second embodiment. It is also allowable herein to form, in place of the CVD oxide film, other films capable of ensuring a desirable level of etching selectivity against the semiconductor substrate 1, for example, a silicon nitride film or silicon oxinitride film.

Figure 20A:
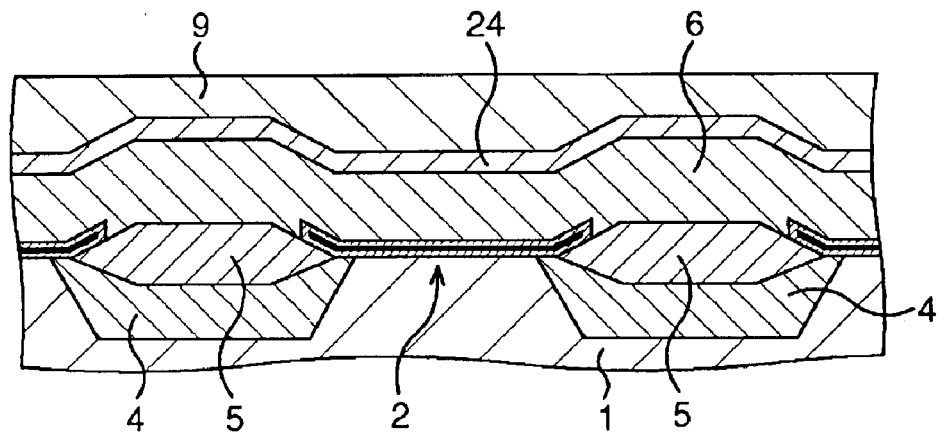
FIGS. 20A through 20C also are schematic sectional views showing the next process step as continued from FIGS. 19A through 19C.
Figure 20B:
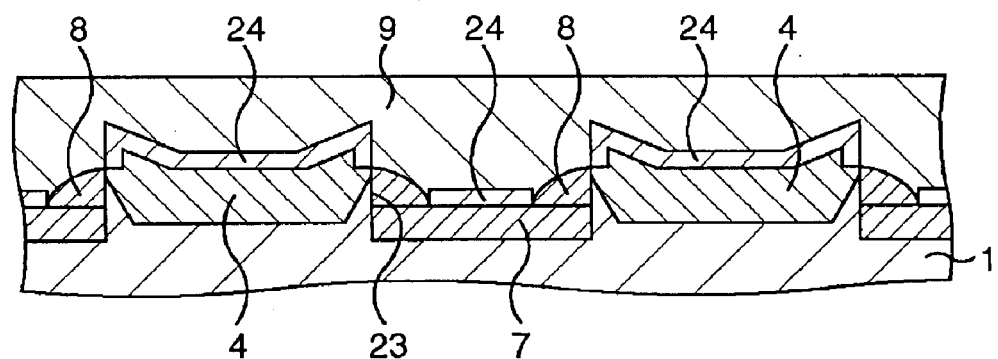
Figure 20C:
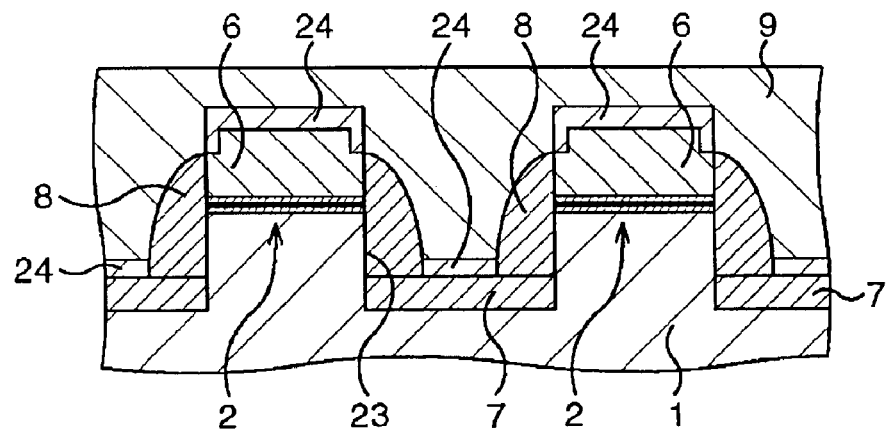

The silicon nitride film 22 on the word lines 6 and on the gate electrodes of the transistors in the peripheral circuit area are then removed by boiling treatment using phosphoric acid, for example. This is followed by treatment with hydrofluoric acid for removing the oxide film on the source-and-drain regions (not shown) of the transistors in the peripheral circuit area. Any silicon oxide film 5 possibly remaining even after the over-etching can completely be removed by this treatment. A Co film and a TiN film are then successively formed by sputtering on the entire surface, and are then subjected to lamp annealing (rapid thermal annealing: RTA) at 450 to 550° C., to thereby allow these films to react with the surfaces of the word line 6, bit line impurity-diffused layer 4, exposed portion of the channel stop impurity-diffused layer 7, and the gate electrodes and source-and-drain regions of the transistors in the peripheral circuit area. The cobalt silicide film 24 is thus formed as shown in FIGS. 20A through 20C. The inter-layer insulating film 9 is then formed over the entire surface by the CVD process, for example, which is followed by formation of wirings (not shown) and so forth. Thus the NOR-type flash memory according to the third embodiment is fabricated.

(Fourth Embodiment)

Figure 21:
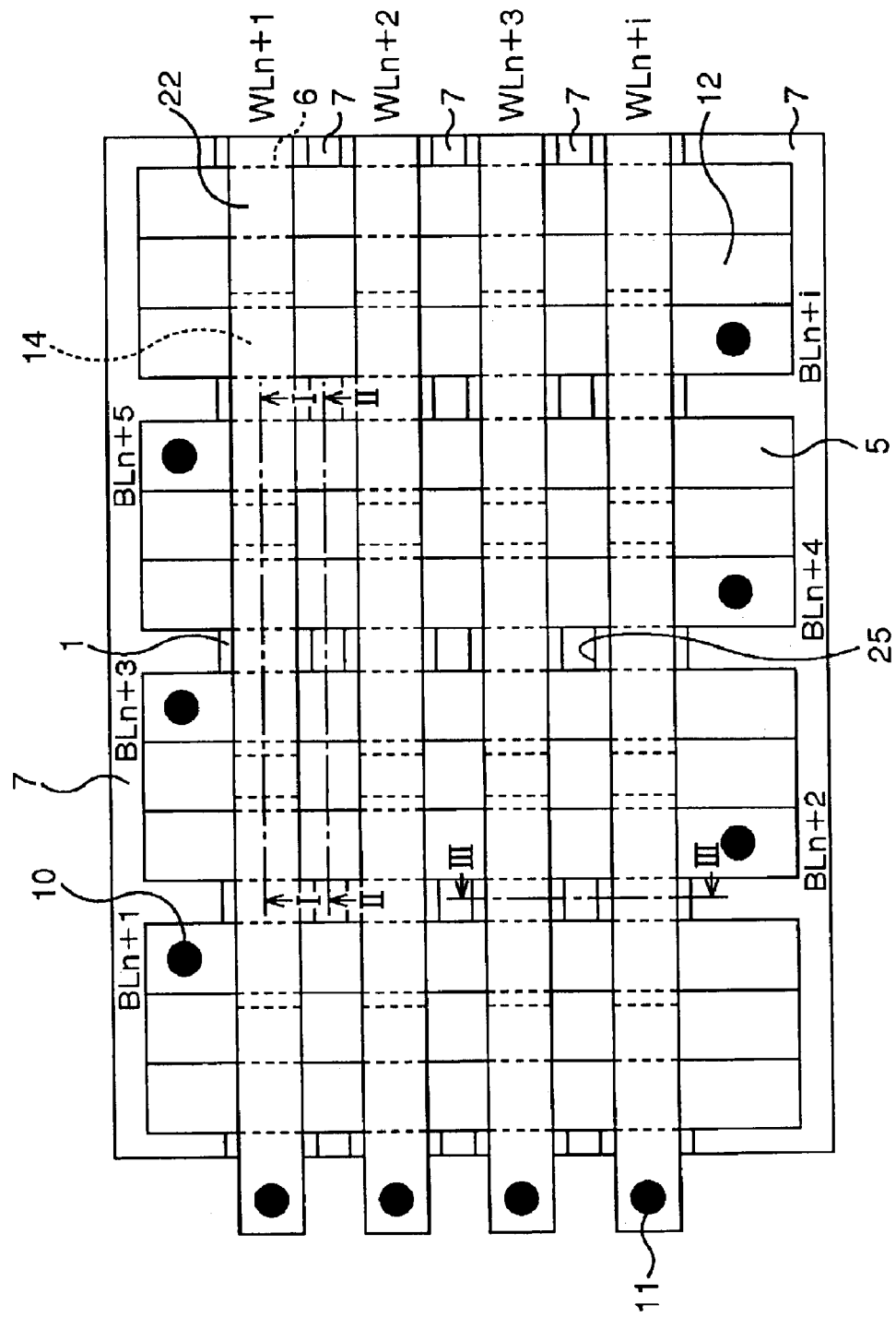
FIG. 21 is a layout chart showing a constitution of a non-volatile semiconductor memory device (AND-type flash memory) according to a fourth embodiment of the present invention.
Figure 22A:
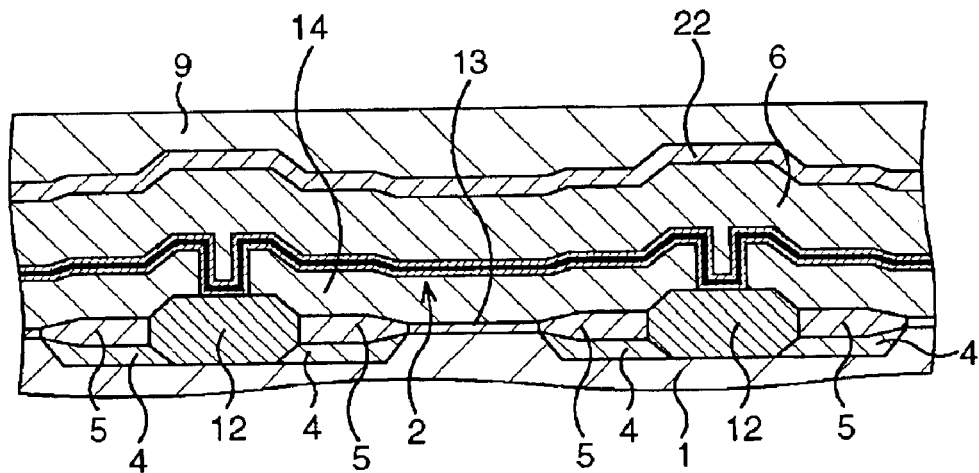
FIGS. 22A through 22C are schematic sectional views showing a constitution of the AND-type flash memory according to the fourth embodiment of the present invention.
Figure 22B:
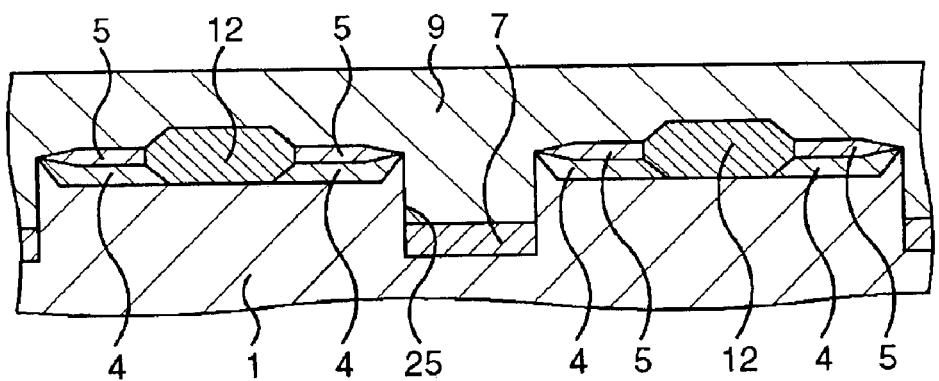
Figure 22C:
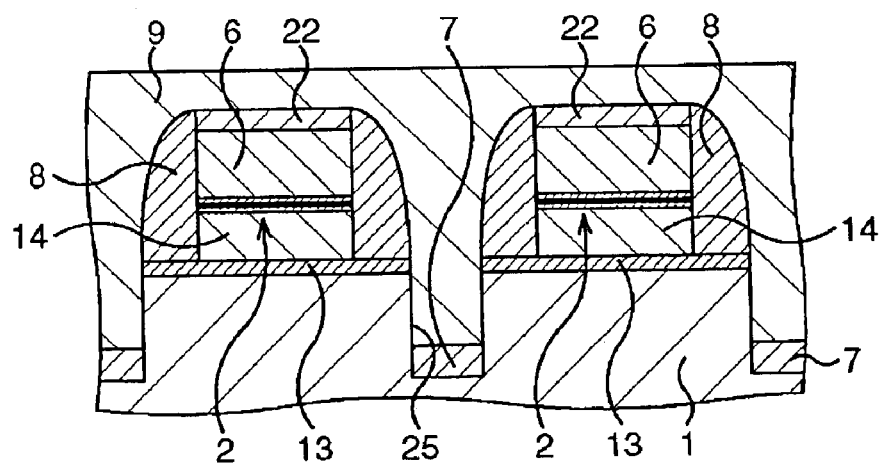
Figure 38:
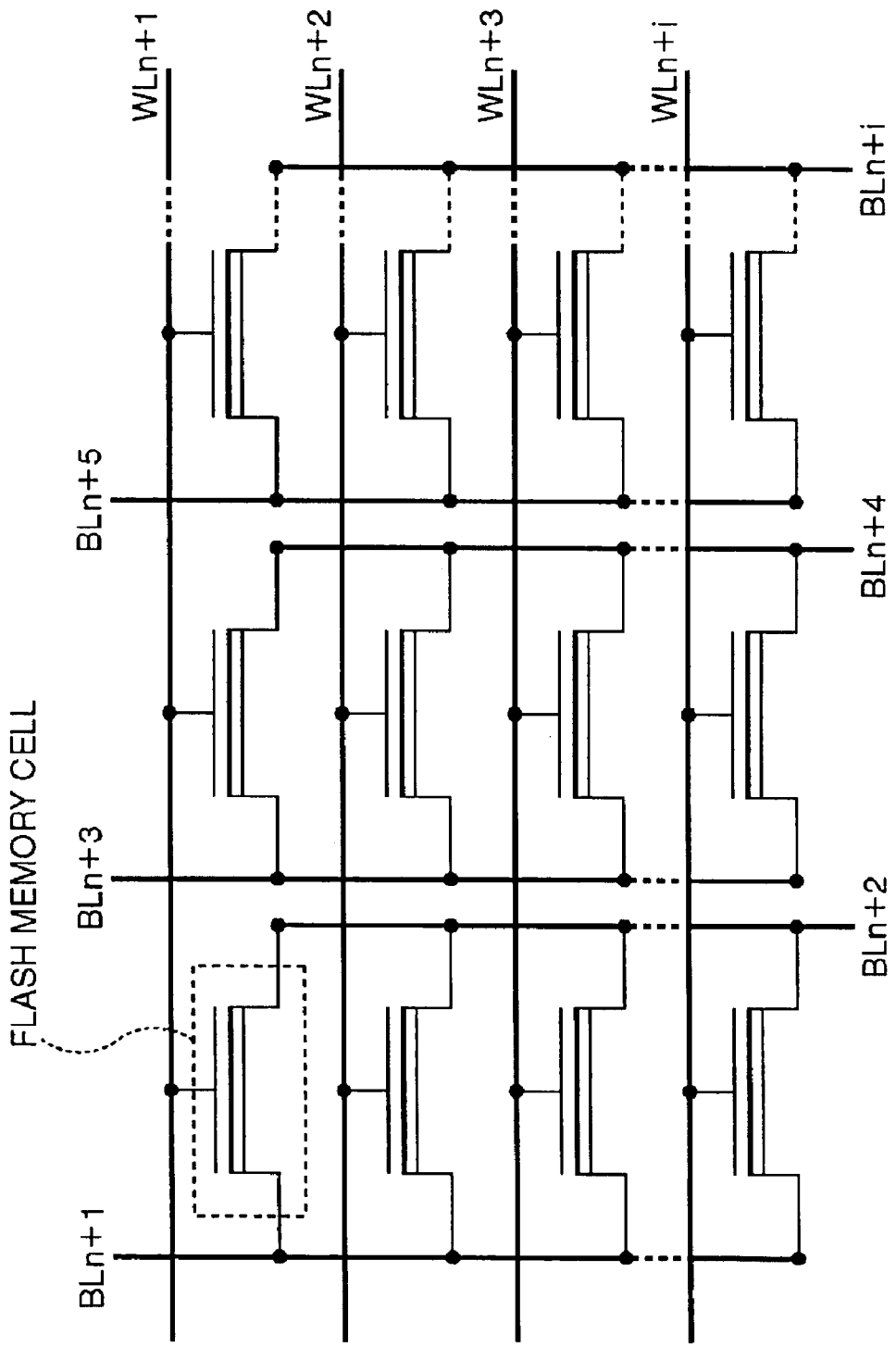
FIG. 38 is a circuit diagram showing a constitution of a general AND-type flash memory.

Next, a non-volatile semiconductor memory device (AND-type flash memory) according to a fourth embodiment of the present invention will be explained. A circuit constitution in the fourth embodiment is same as that previously shown in FIG. 38, but a layout and sectional structure are differed from those in the second conventional example shown in FIG. 39 and FIGS. 40A through 40C. FIG. 21 is a layout chart showing a constitution of the non-volatile semiconductor memory device (AND-type flash memory) according to the fourth embodiment of the present invention. FIGS. 22A, 22B and 22C are schematic sectional views taken along the I—I line, II—II line and III—III line, respectively, in FIG. 21.

Also in the fourth embodiment, as shown in FIGS. 22A through 22C, the bit line is composed of the bit line impurity-diffused layer 4 formed in the surficial portion of the semiconductor substrate 1, and the word line 6 is composed of a semiconductor film formed on the semiconductor substrate 1 while placing an insulating film in between. The sidewalls 8 are formed on the lateral faces of the word line 6, the ONO film 2 thereunder and the floating gate 14 thereunder, and the silicon nitride film 22 is formed on the word line 6. The entire surface is covered with the inter-layer insulating film 9. The area of the semiconductor substrate 1 having formed therein or thereon none of the bit line impurity-diffused layer 4, word lines 6, sidewalls 8 and element isolation oxide film 12 has formed therein a groove 25. In this embodiment, the channel stop impurity-diffused layer 7 is formed at the bottom of the groove 25. The inter-layer insulating film 9 is filled also in the groove 25. The inter-layer insulating film 9 is formed by the CVD process, for example. It is to be noted that illustration of the insulating films (ONO film 2, sidewall 8, inter-layer insulating film 9 and tunnel oxide film 13) other than the silicon oxide film 5 on the bit line impurity-diffused layer 4 and the silicon nitride film 22 on the word line 6 are omitted in FIG. 21.

Figure 39:
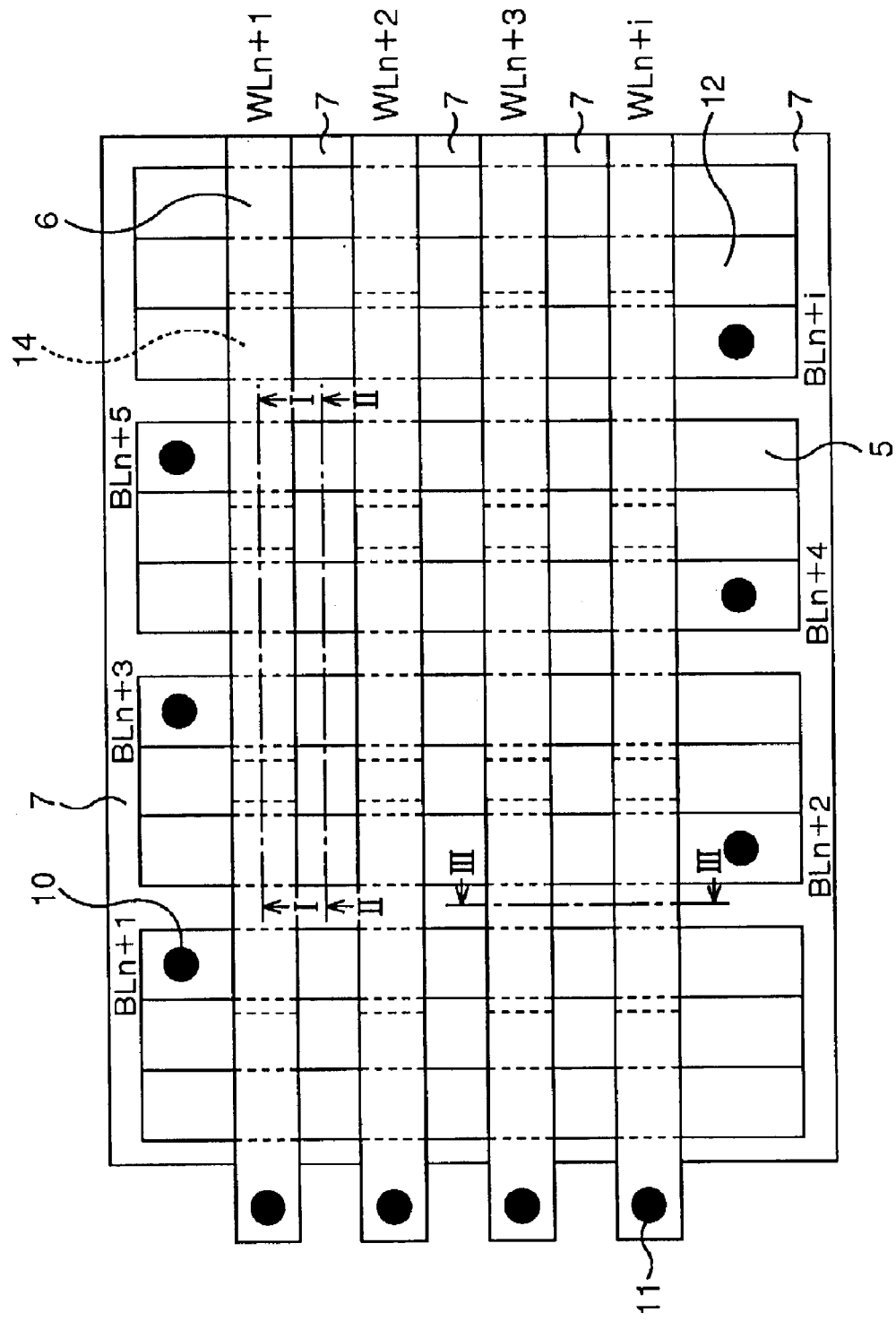
FIG. 39 is a layout chart showing a general constitution of a AND-type flash memory.
Figure 40A:
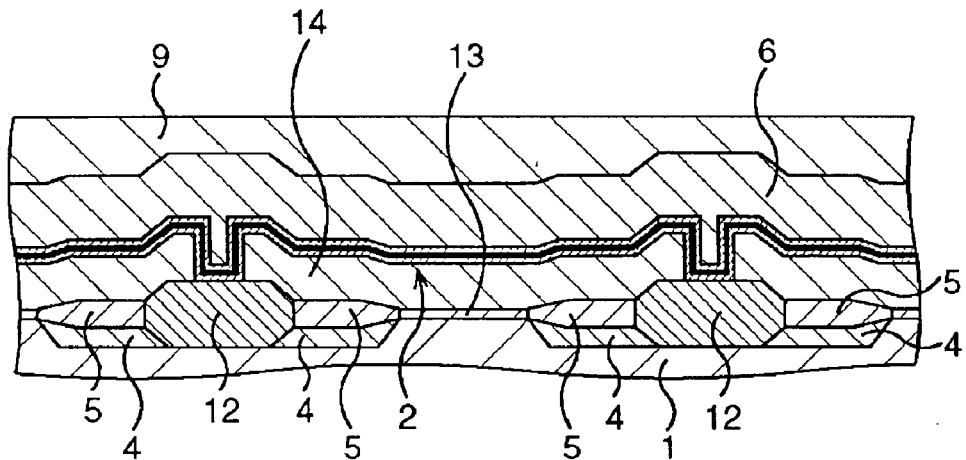
FIGS. 40A, 40B and 40C are schematic sectional views taken along the I—I line, II—II line and III—III line, respectively, in FIG. 39.
Figure 40B:
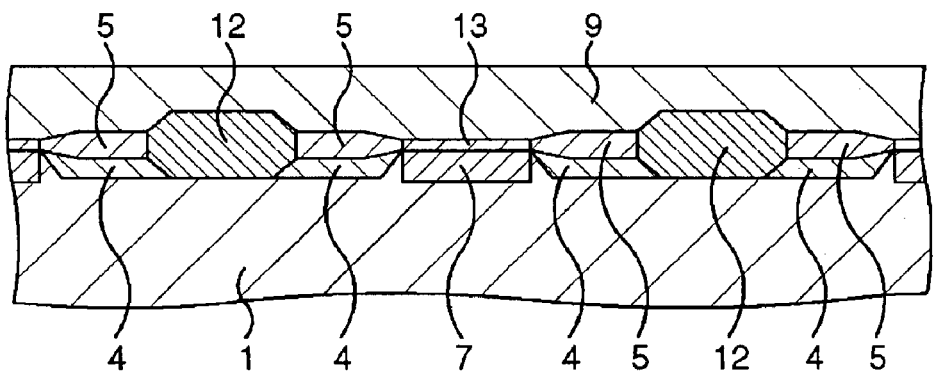
Figure 40C:
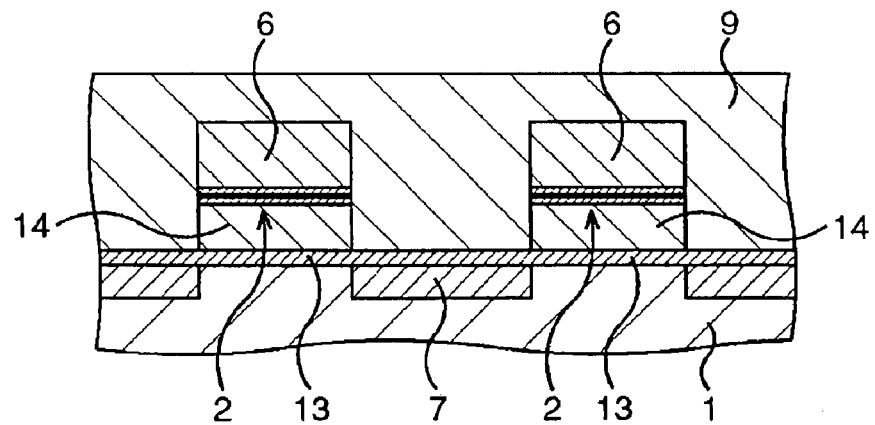
Figure 41A:
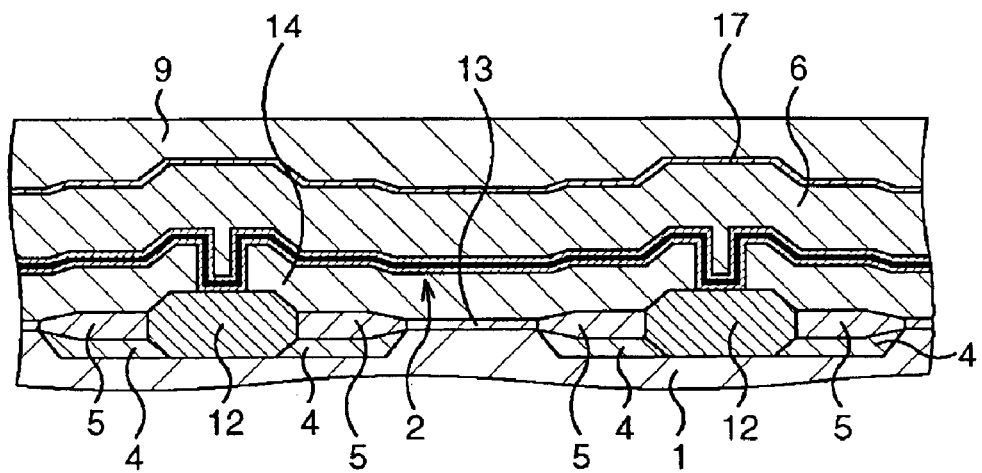
FIGS. 41A through 41C are schematic sectional views showing a constitution of a flash memory according to a third conventional example.
Figure 41B:
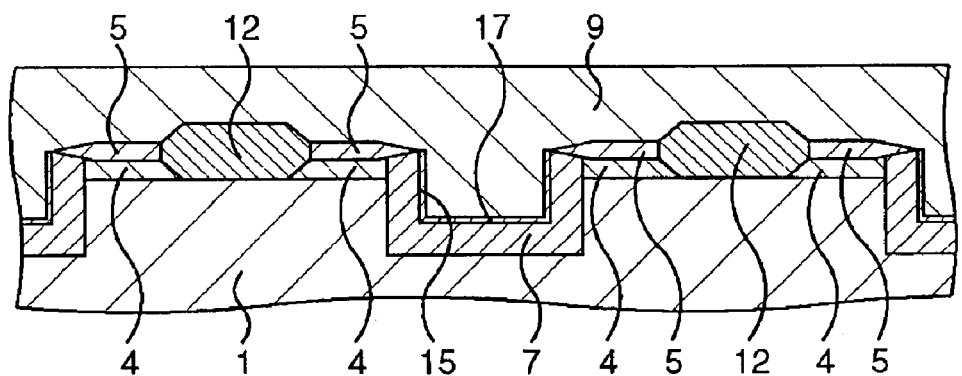
Figure 41C:
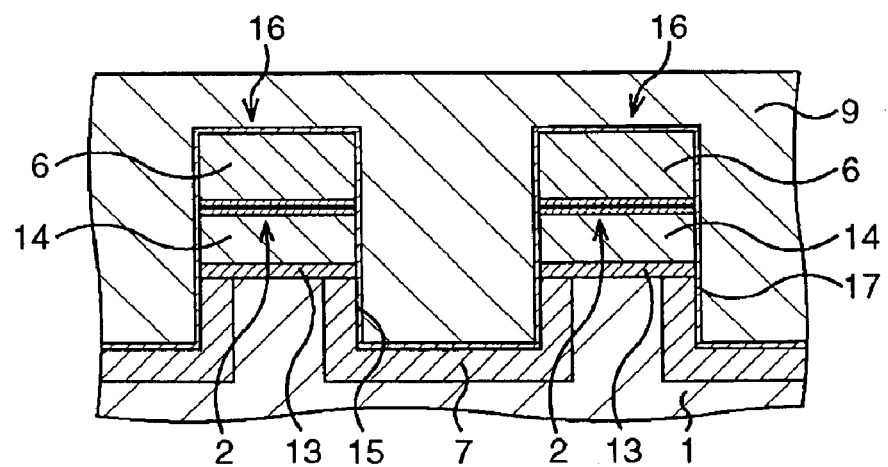
Figure 42A:
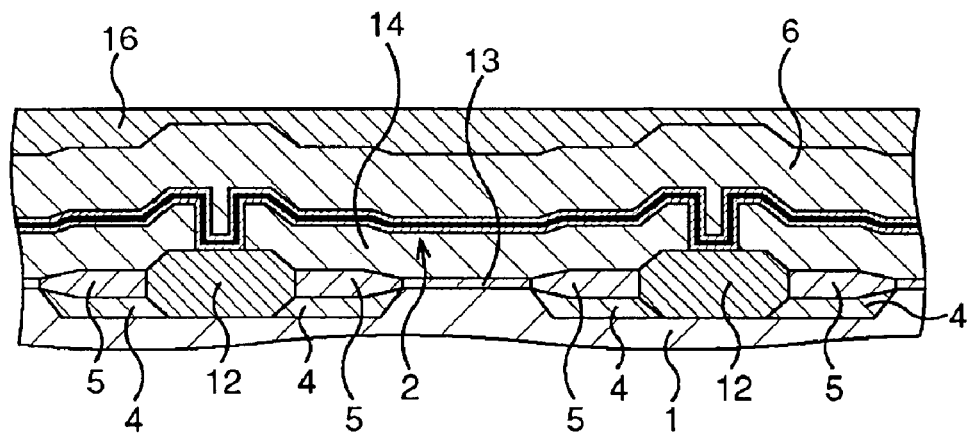
FIGS. 42A through 42C are schematic sectional views showing a process step in a conventional method of fabricating a flash memory according to the third conventional example.
Figure 42B:
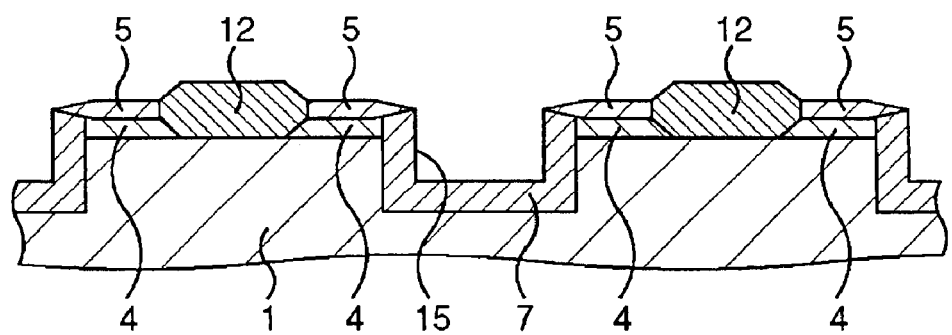
Figure 42C:
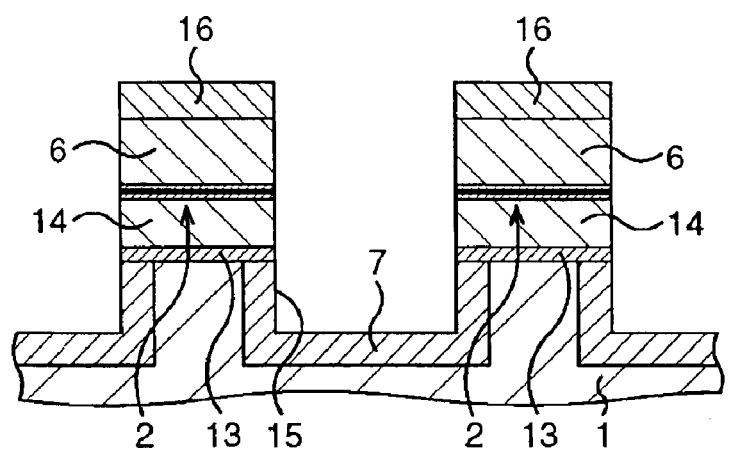
Figure 43A:
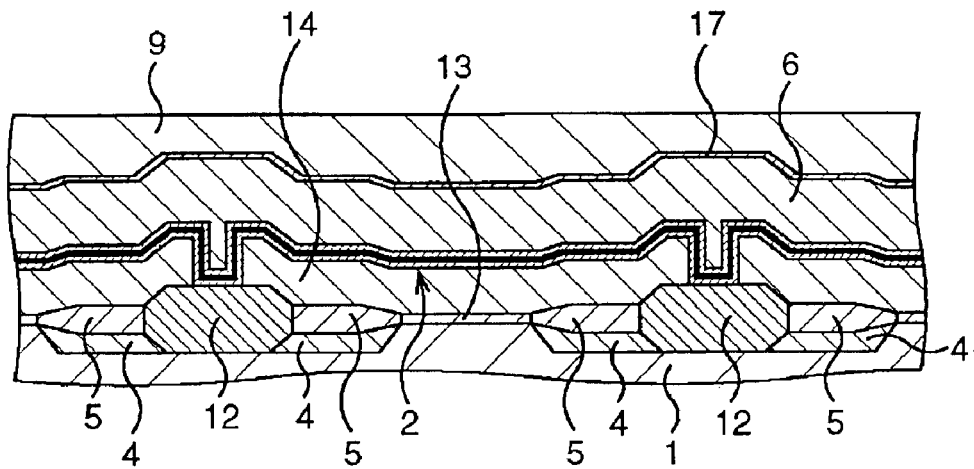
FIGS. 43A through 43C also are schematic sectional views showing the next process step as continued from FIGS. 42A through 42C.
Figure 43B:
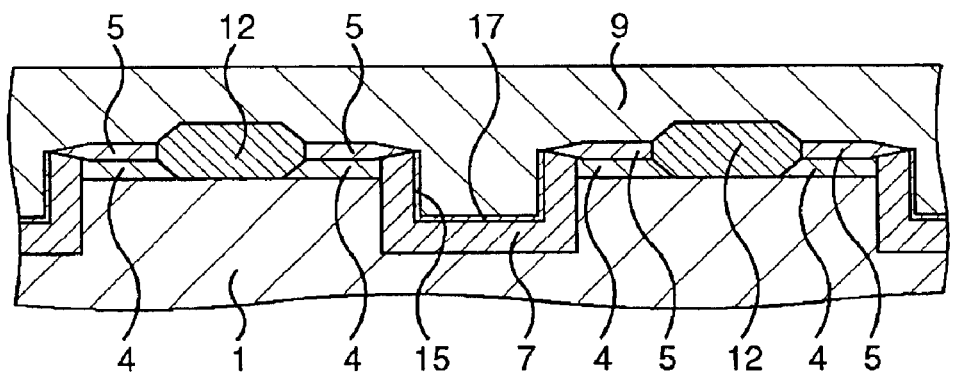
Figure 43C:
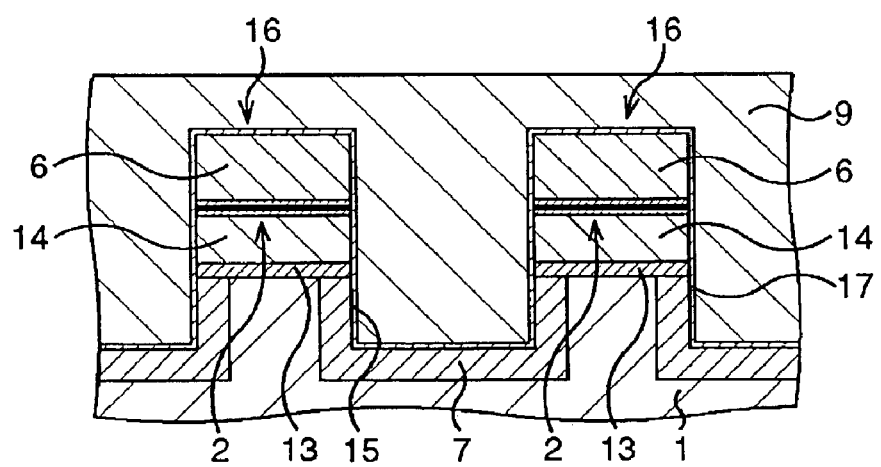

The pattern of the channel stop impurity-diffused layer 7 in the fourth embodiment is thus slightly different from that previously shown in FIG. 39. More specifically, as shown in FIG. 21, the word line 6 and channel stop impurity-diffused layer 7 never come into direct contact with each other in a plan view, and instead there is a gap having a width equivalent to the width of the sidewall 8 between them.

In thus-composed device of the fourth embodiment, element isolation is achieved not only by the channel stop impurity-diffused layer 7 but also by the inter-layer insulating film 9 filled in the groove 25, which ensures an advanced voltage resistance. In the formation of the groove 25, as shown in FIG. 22C, there is no need of masking with any resist film, since there are the sidewalls 8 between the groove 25 between the word lines 6 and each of such word line 6, and there is the silicon nitride film 22 on the word line 6, where all of the sidewalls 8, silicon nitride film 22, element isolation oxide film 12 and silicon oxide film 5 can be used as an etching mask. This makes it possible to finely process the word line 6 with ease, and is further advantageous in that suppressing variation in transistor characteristics due to damage possibly occurs when the groove 25 is formed by etching.

Figure 23A:
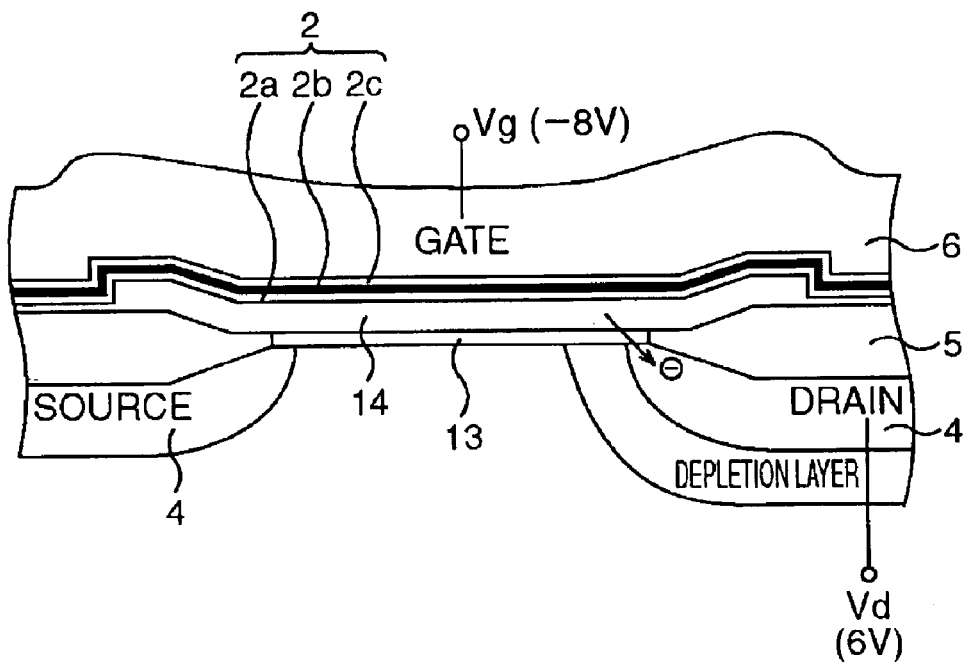
FIGS. 23A and 23B are schematic drawings showing operations of the AND-type flash memory.
Figure 23B:
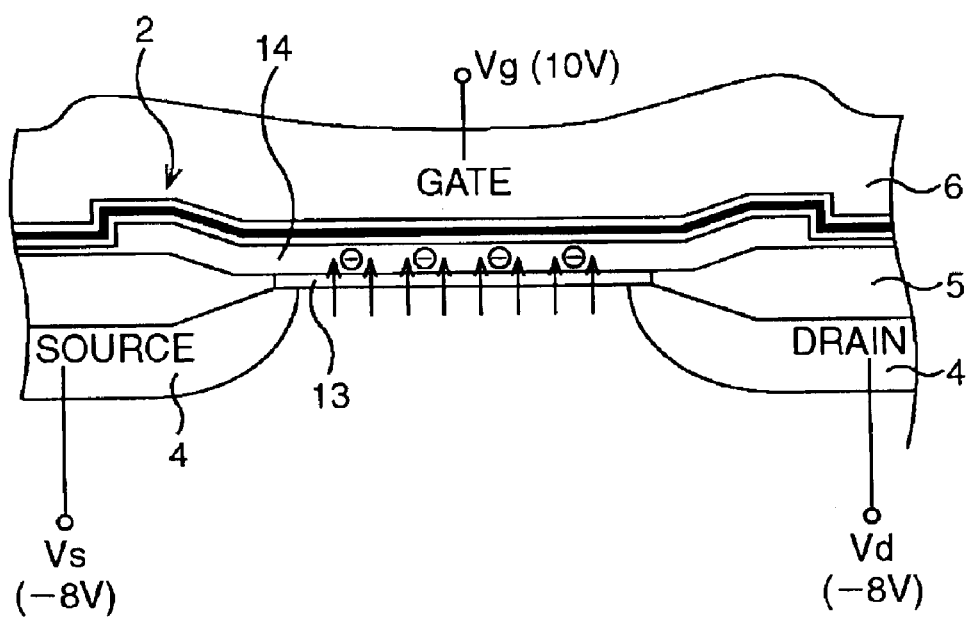
Figure 24A:
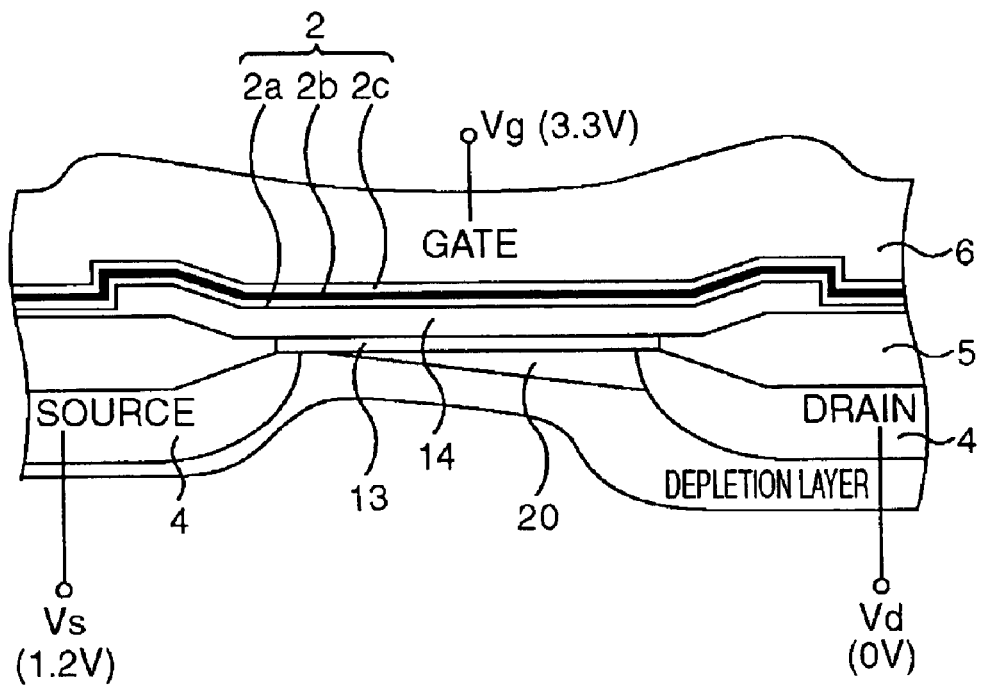
FIGS. 24A and 24B also are schematic drawings showing operations of the AND-type flash memory.
Figure 24B:
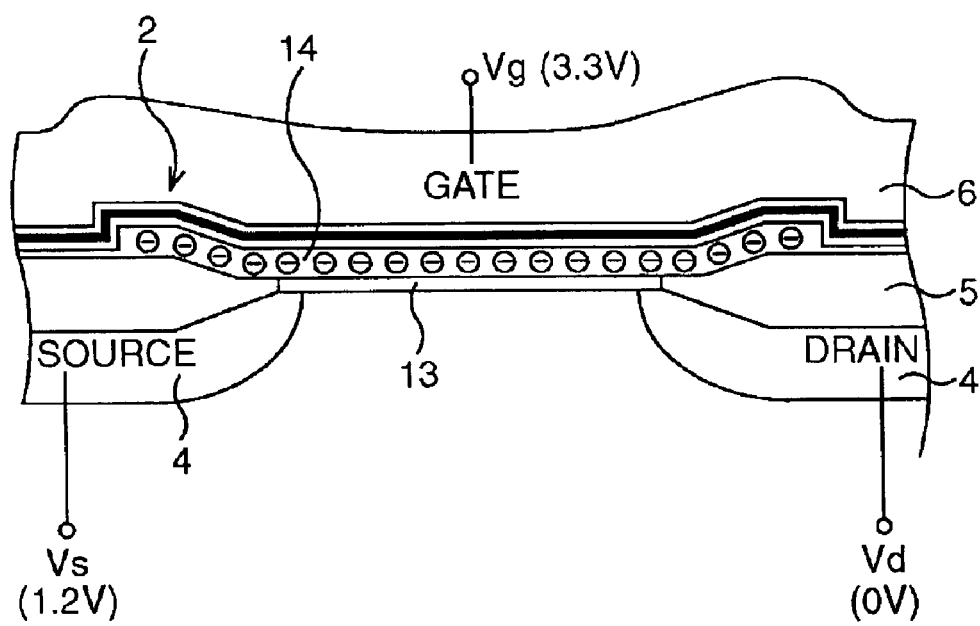

FIGS. 23A through 24B are schematic drawings showing operations of the NOR-type flash memory. FIG. 23A shows a write operation of data "0", and FIG. 23B shows an erase operation of data "0". FIGS. 24A and 24B show read operations of data, where FIG. 24A shows a case where data "1" is preliminarily stored, and FIG. 24B shows a case where data "0" is preliminarily stored.

When the data is written, as shown in FIG. 23A, the gate voltage, drain voltage and source voltage are set to levels, for example, of −8 V, 6 V and floating level, respectively. The voltage level of the substrate is now 0 V. Electrons trapped in the floating gate 14 are withdrawn by Fowler-Nordheim (FN) tunnel current.

On the other hand, when the data is erased, as shown in FIG. 23B, the gate voltage, drain voltage and source voltage are set to levels, for example, of 10 V, −8 V and −8 V, respectively. The voltage level of the substrate is set to −8 V, for example. Electrons are trapped by the floating gate 14 with the aid of Fowler-Nordheim (FN) tunnel current coming from the semiconductor substrate.

When the data is read out, as shown in FIGS. 24A and 24B, the gate voltage, drain voltage and source voltage are typically set to levels, for example, of 3.3 V, 1.2 V and 0 V, respectively. The voltage level of the substrate is now 0 V. For the case where no trapped electron present in the floating gate 14, as shown in FIG. 24A, an inversion layer is formed in the semiconductor substrate 1, as shown in FIG. 24A, and a bit line impurity-diffused layer 4 equivalent to the source and another bit line impurity-diffused layer 4 equivalent to the drain are connected by the channel 20, which allows inter-source-drain current to flow between these bit line impurity-diffused layers 4. This results in read out of data "0". On the other hand, for the case where electrons are trapped in the floating gate 14 as shown in FIG. 24B, neither the inversion layer nor the channel is formed, and thus the inter-source-drain current does not flow between two bit line impurity-diffused layers 4, which results in read out of data "1".

Figure 25A:
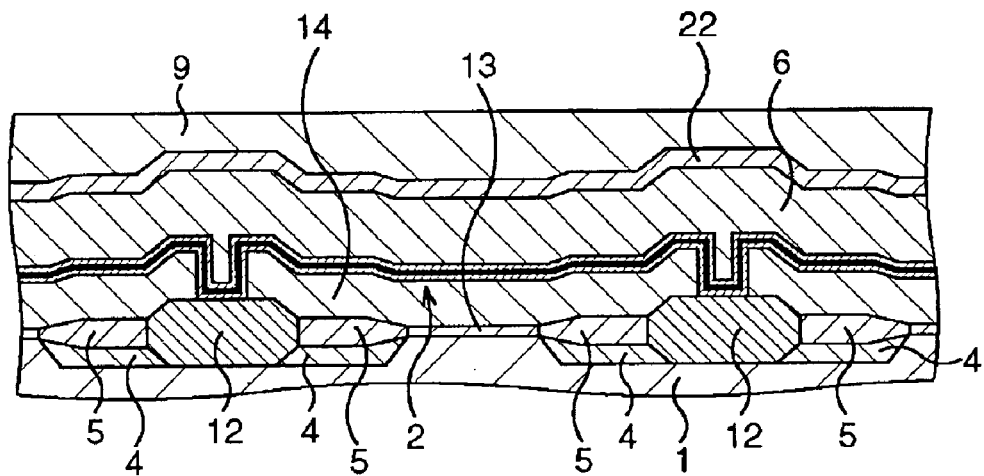
FIGS. 25A through 25C are schematic sectional views showing a modified example of the fourth embodiment.
Figure 25B:
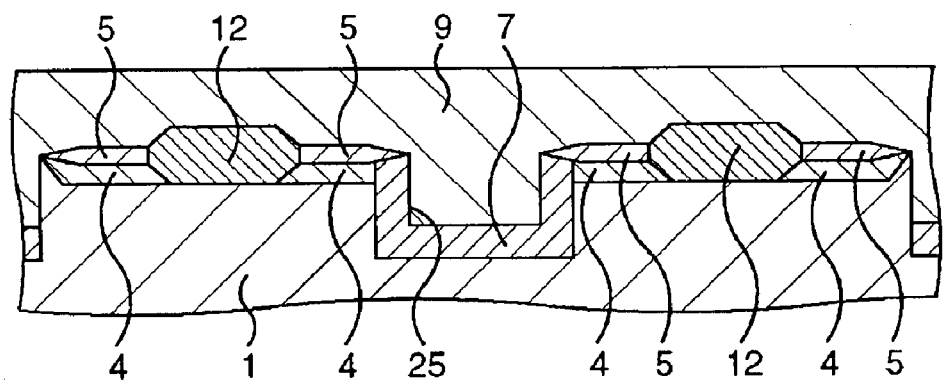
Figure 25C:
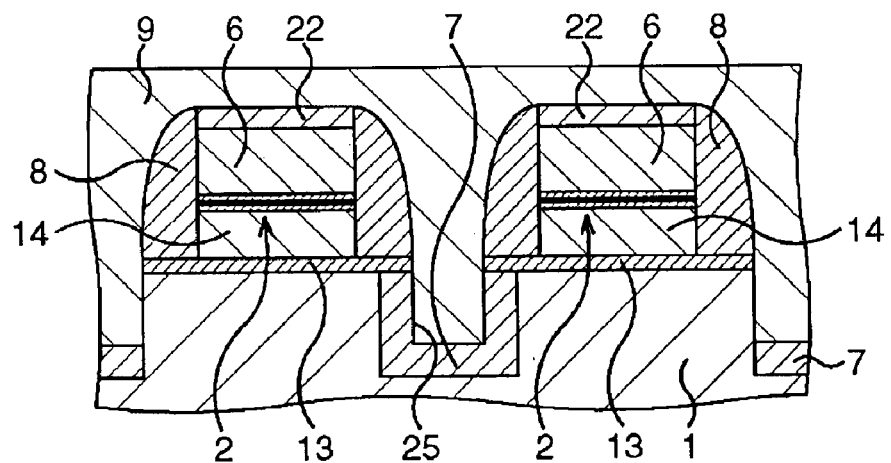

The groove 25 of the AND-type flash memory according to the fourth embodiment can be formed by the method described in the first embodiment, based on the conventional method of fabricating an AND-type flash memory, in which the sidewalls 8 are formed on the lateral faces of the gate electrode (not shown) of the transistor in the peripheral circuit area and word line 6, a resist film exposing only the flash memory cell area is formed, and the semiconductor substrate 1 is then etched, where masking is effected by the resist film, sidewalls 8, silicon nitride film 22, element isolation oxide film 12 and silicon oxide film 5. Other structural components can be formed by the known general procedures. A process is such that, for example, forming the element isolation oxide film 12 on the surface of the semiconductor substrate 1, forming the tunnel insulating film 13 on the semiconductor substrate 1, forming the bit line impurity-diffused layer 4 in the surficial portion of the semiconductor substrate 1, forming the silicon insulating film 5 on the bit line impurity-diffused layer 4, forming the floating gate 14 on the tunnel insulating film 13 and on the silicon insulating film 5, forming the ONO film 2 on the floating gate 14, and serially forming the conductive layer and the silicon nitride film 22 (before patterned), which are later processed to form the word line 6, over the entire surface. The processes thereafter may be the same with those in the first embodiment. It is also allowable to form the channel stop impurity-diffused layer 7 also on the lateral faces of the groove 25 by doping boron ions by oblique angle ion implantation as shown in FIGS. 25A through 25C. FIGS. 25A, 25B and 25C are schematic sectional views showing a modified example of the non-volatile semiconductor memory device (AND-type flash memory) according to the fourth embodiment of the present invention, taken along the I—I line, II—II line and III—III line, respectively, in FIG. 21.

(Fifth Embodiment)

Figure 26:
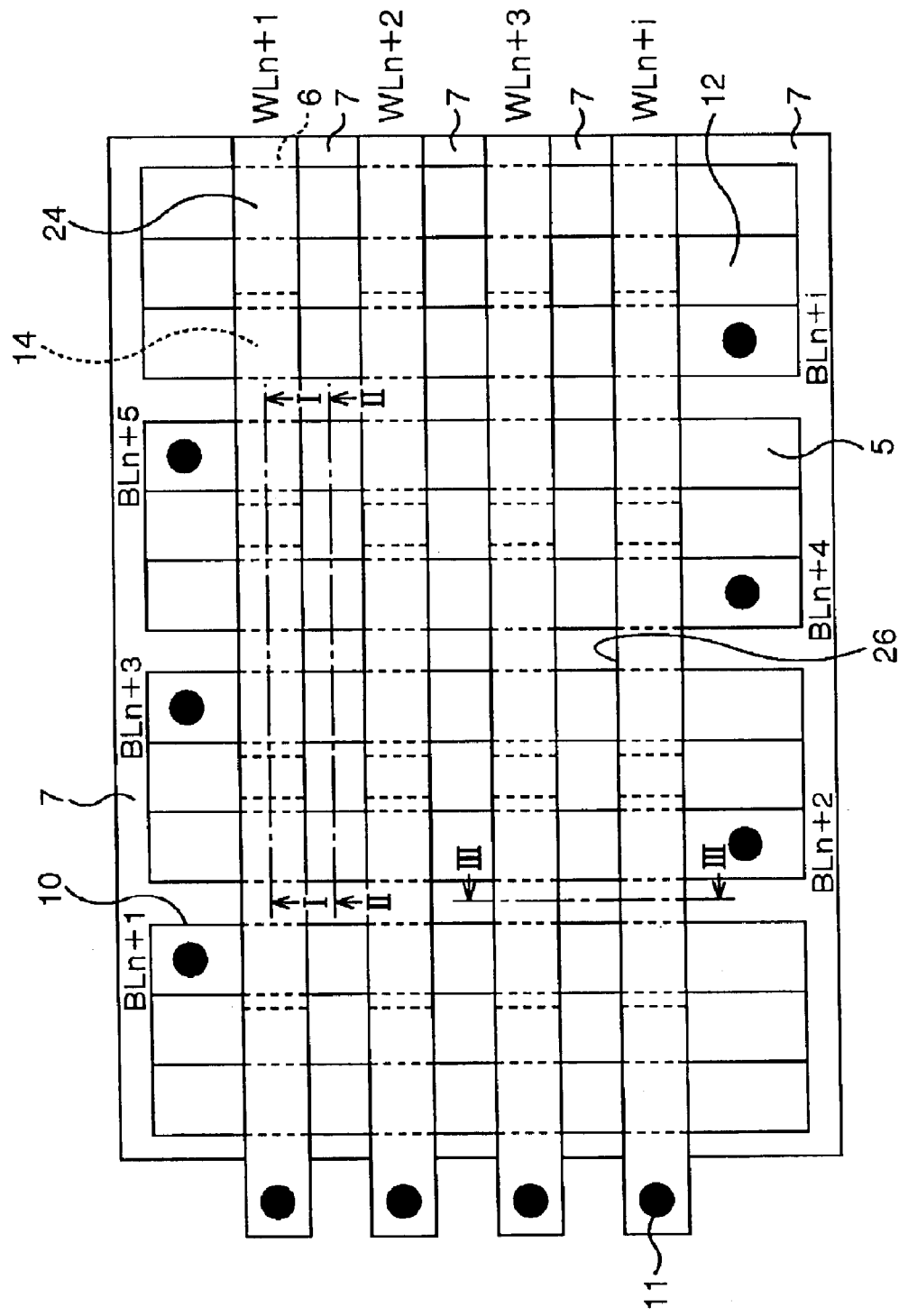
FIG. 26 is a layout chart showing a constitution of a non-volatile semiconductor memory device (AND-type flash memory) according to a fifth embodiment of the present invention.
Figure 27A:
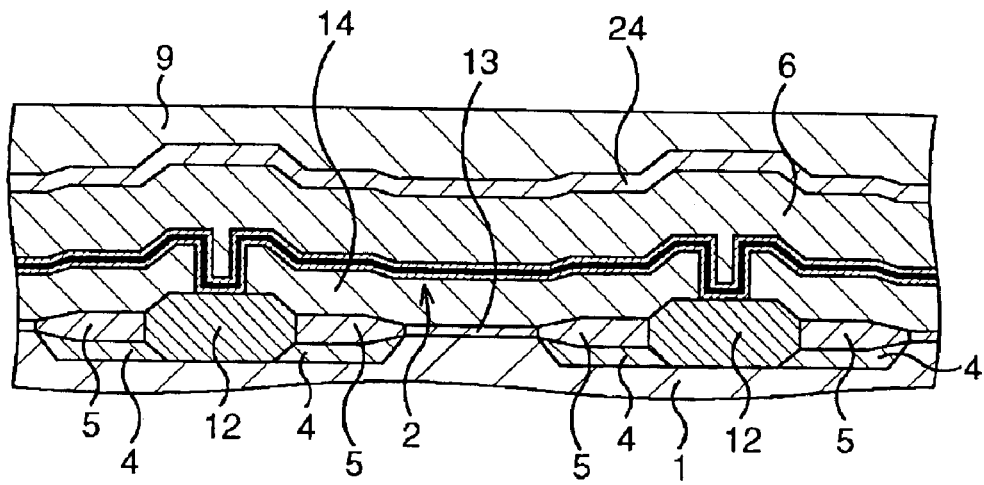
FIGS. 27A through 27C are schematic sectional views showing a constitution of the AND-type flash memory according to the fifth embodiment of the present invention.
Figure 27B:
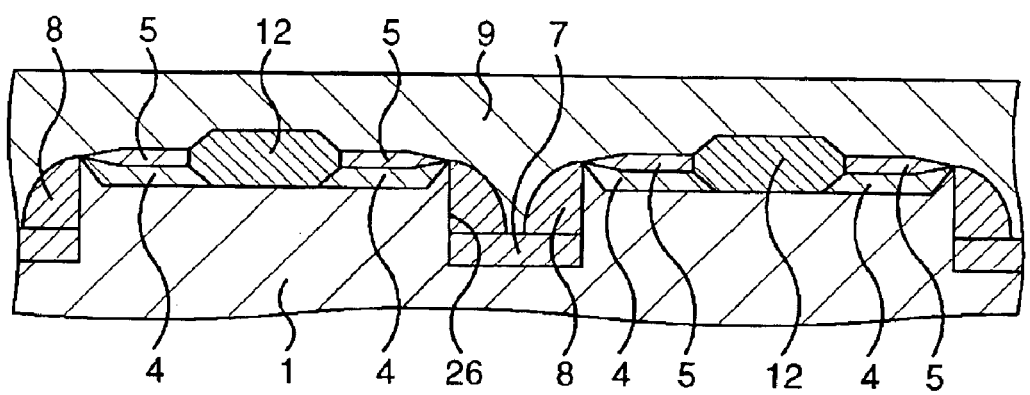
Figure 27C:
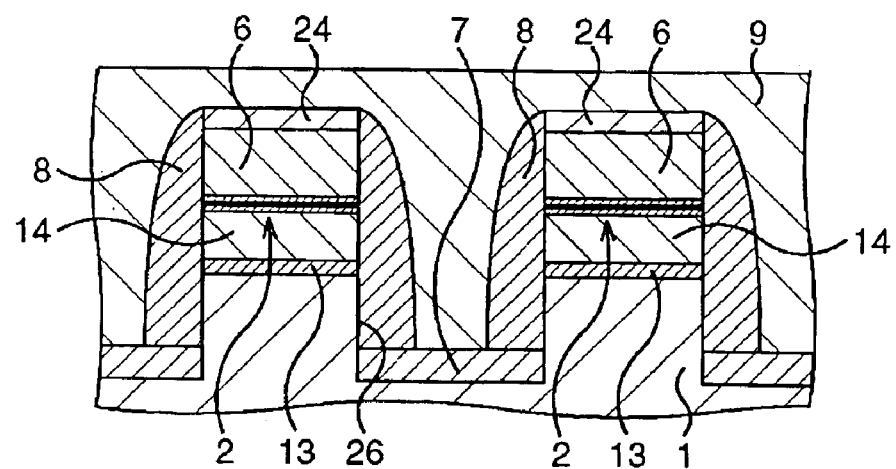

Next, a non-volatile semiconductor memory device (AND-type flash memory) according to a fifth embodiment of the present invention will be explained. A circuit constitution in the fifth embodiment is same as that previously shown in FIG. 38, but a layout and sectional structure are differed from those in the second conventional example and the fourth embodiment. FIG. 26 is a layout chart showing a constitution of the non-volatile semiconductor memory device (AND-type flash memory) according to the fifth embodiment of the present invention. FIGS. 27A, 27B and 27C are schematic sectional views taken along the I—I line, II—II line and III—III line, respectively, in FIG. 26.

In the fifth embodiment, the cobalt silicide film 24 is formed on the word line 6. The area of the semiconductor substrate 1 having formed therein or thereon neither of the bit line impurity-diffused layer 4, word lines 6 and element isolation oxide film 12 has formed therein a groove 26. In this embodiment, the channel stop impurity-diffused layer 7 is formed at the bottom of the groove 26. The sidewall 8 is formed in the groove 26 between the bit line impurity-diffused layers 4 as shown in FIG. 27B, and is formed so as to extend over the area from the lateral faces of the word line 6 and the cobalt silicide film 24 stacked thereon to the bottom of the groove 26 between the word lines 6 as shown in FIG. 27C. The inter-layer insulating film 9 is filled also in the groove 26. The inter-layer insulating film 9 is formed by the CVD process, for example, similarly to the case of the fourth embodiment. It is to be noted that illustration of the insulating films (ONO film 2, sidewall 8, inter-layer insulating film 9 and tunnel oxide film 13) other than the silicon oxide film 5 on the bit line impurity-diffused layer 4 are omitted in FIG. 26.

In thus-composed device of the fifth embodiment, element isolation is achieved not only by the channel stop impurity-diffused layer 7 but also by the inter-layer insulating film 9 filled in the groove 26. In the formation of the groove 26, as shown in FIG. 27C, there is no need of masking with any resist film, since an anti-reflective layer (not shown) which is formed between the material layer to be processed and a resist film in the photolithographic patterning process for the word line 6, element isolation oxide film 12 and silicon oxide film 5 are available as an etching mask. This ensures effects similar to those obtained by the fourth embodiment.

The groove 26 in the AND-type flash memory according to the fifth embodiment can be formed by the method described in the second embodiment, based on the conventional method of fabricating an AND-type flash memory, in which the word line 6 and silicon nitride film 22 stacked thereon are formed, a resist film exposing only the flash memory cell area is formed, and the semiconductor substrate 1 is then etched, where masking is effected by such resist film, silicon nitride film 22, element isolation oxide film 12 and silicon oxide film 5. Other structural components can be formed by the known general procedures. The processes thereafter may be the same with those in the second embodiment.

(Sixth Embodiment)

Figure 28:
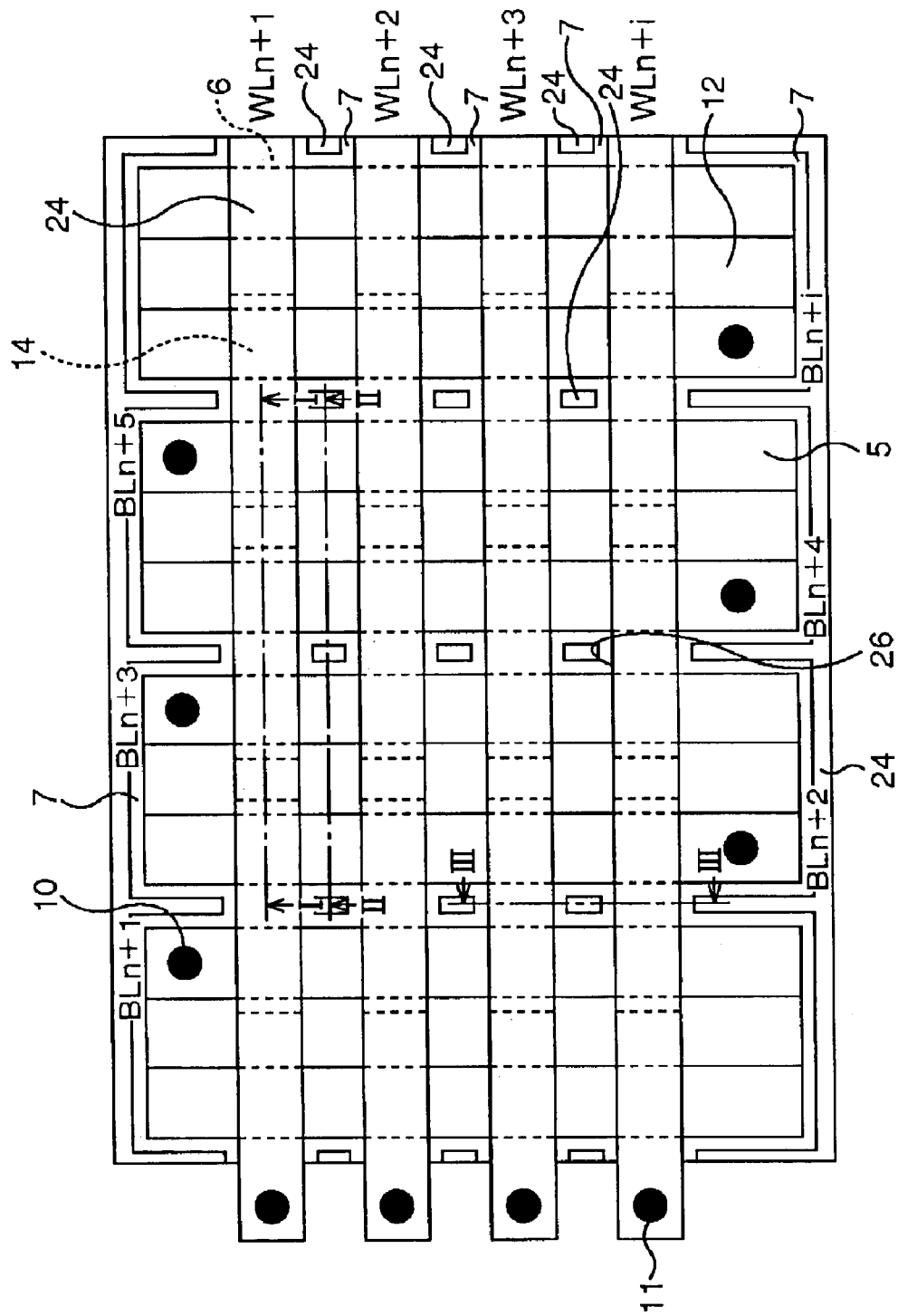
FIG. 28 is a layout chart showing a constitution of a non-volatile semiconductor memory device (AND-type flash memory) according to a sixth embodiment of the present invention.
Figure 29A:
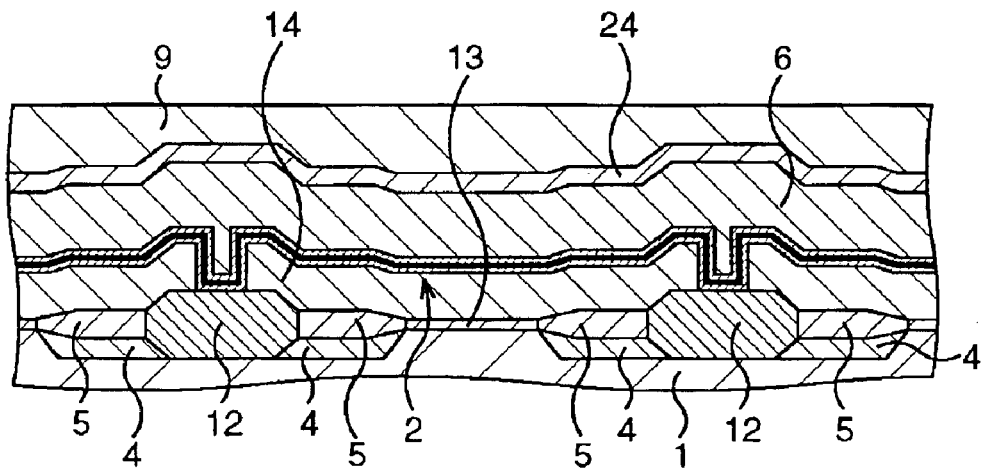
FIGS. 29A through 29C are schematic sectional views showing a constitution of the AND-type flash memory according to the sixth embodiment of the present invention.
Figure 29B:
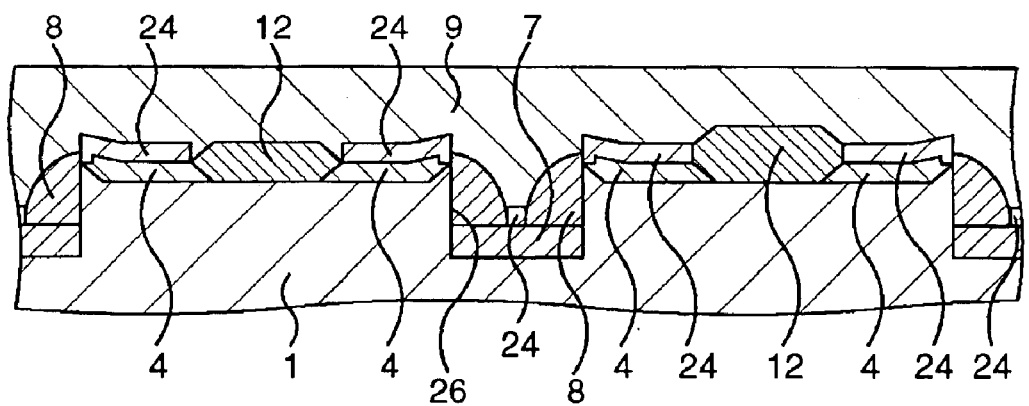
Figure 29C:
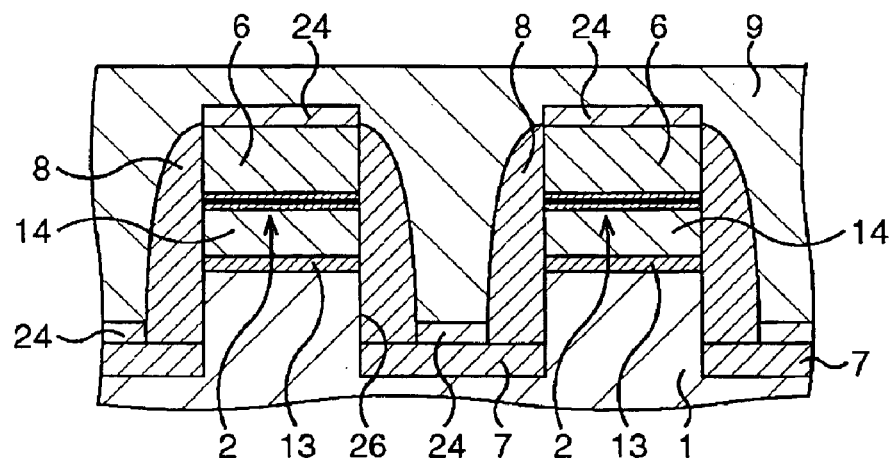

Next, a non-volatile semiconductor memory device (AND-type flash memory) according to a sixth embodiment of the present invention will be explained. A circuit constitution in the sixth embodiment is same as that previously shown in FIG. 38, but a layout and sectional structure are differed from those in the second conventional example, and the fourth and fifth embodiments. FIG. 28 is a layout chart showing a constitution of the non-volatile semiconductor memory device (AND-type flash memory) according to the sixth embodiment of the present invention. FIGS. 29A, 29B and 29C are schematic sectional views taken along the I—I line, II—II line and III—III line, respectively, in FIG. 28.

In the sixth embodiment, the cobalt silicide film 24 is formed not only on the word line 6, but also on the bit line impurity-diffused layer 4. The silicon oxide film 5 is not formed on the bit line impurity-diffused layer 4. Similarly to the case in the fourth embodiment, the area of the semiconductor substrate 1 having formed therein or thereon neither of the bit line impurity-diffused layer 4, element isolation oxide film 12 and word lines 6 has formed therein the groove 26. In this embodiment, the channel stop impurity-diffused layer 7 is formed at the bottom of the groove 26. The sidewall 8 is, between the bit line impurity-diffused layers 4 as shown in FIG. 29B, formed in the groove 26 at a level lower than the lower end of the cobalt silicide film 24 formed on the bit line impurity-diffused layer 4, and between the word lines 6 as shown in FIG. 29C, formed over the area from the level of the lower end of the cobalt silicide film 24 to the bottom of the groove 26. The cobalt silicide film 24 is formed also in the area surrounded by the sidewall 8 on the channel stop impurity-diffused layer 7. It is to be noted that illustration of the insulating films (ONO film 2, sidewall 8, inter-layer insulating film 9 and tunnel oxide film 13) other than the silicon oxide film 5 on the bit line impurity-diffused layer 4 are omitted in FIG. 28.

With thus-composed flash memory according to the sixth embodiment, same operations and effects with those obtained by the fifth embodiment can be obtained, and the resistivity of the bit line can also be reduced by virtue of the cobalt silicide film 24 formed on the bit line impurity-diffused layer 4. While the cobalt silicide film 24 also remains on the channel stop impurity-diffused layer 7, the cobalt silicide film 24 is isolated by the sidewall 8 both from the word line 6 and bit line impurity-diffused layer 4, So that short-circuit therebetween is prevented.

The groove 26 of the AND-type flash memory according to the sixth embodiment can be formed by the method described in the third embodiment, based on the conventional method of fabricating an AND-type flash memory, in which the word line 6 and silicon nitride film 22 stacked thereon are formed, a resist film exposing only the flash memory cell area is formed, and the semiconductor substrate 1 is then etched, where masking is effected by the resist film, silicon nitride film 22, element isolation oxide film 12 and silicon oxide film 5. Other structural components can be formed by the known general procedures. The processes thereafter may be the same with those in the third embodiment. For example, the constitution of the sixth embodiment can be obtained by removing the silicon oxide film 5 by over-etching and hydrofluoric acid treatment, and by the successive salicide process.

What is claimed is:

1. A non-volatile semiconductor memory device comprising:
   a semiconductor substrate;
   a plurality of bit lines comprised of an impurity-diffused layer formed in the surficial portion of said semiconductor substrate; and
   a plurality of word lines comprised of a conductive layer formed above said semiconductor substrate and arranged so as to cross with said plurality of bit lines in a plan view;
   a first insulating film formed on said word lines; and
   a sidewall formed along said word lines;
   wherein between every adjacent word lines,
   a groove is formed only in the surficial portion of said semiconductor substrate within each area horizontally defined, in a plan view, by the first insulating film formed on said adjacent word lines and by adjacent bit lines so as to be effectively aligned with an edge of said sidewall, said groove not overlapping said first insulating film in plan view;
   a channel stop impurity-diffused layer is formed at the bottom of said groove; and
   an insulating film is filled in said groove.

2. The non-volatile semiconductor memory device according to claim 1, wherein
   said device is a NOR-type flash memory; and
   channel stop impurity-diffused layer is formed also on the lateral faces of said groove.

3. The non-volatile semiconductor memory device according to claim 1, wherein said device is a NOR-type flash memory.

4. The non-volatile semiconductor memory device according to claim 1, wherein said device is an AND-type flash memory.

5. A non-volatile semiconductor memory device comprising:
   a semiconductor substrate;
   a plurality of bit lines comprised of an impurity-diffused layer formed in the surficial portion of said semiconductor substrate; and
   a plurality of word lines comprised of a conductive layer formed above said semiconductor substrate and arranged so as to cross with said plurality of bit lines in a plan view;
   wherein between every adjacent word lines,
   a groove is formed only in the surficial portion of said semiconductor substrate within each area horizontally defined, in a plan view, by said adjacent word lines and adjacent bit lines, said groove not overlapping said word lines or bit lines in the plan view;
   a channel stop impurity-diffused layer is formed at the bottom of said groove;
   sidewalls are formed on the lateral faces of the individual word lines so as to extend towards the bottom of said groove; and
   an insulating film is filled in said groove.

6. The non-volatile semiconductor memory device according to claim 5, wherein said groove is formed, in a plan view, so as to be aligned with said word lines.

7. The non-volatile semiconductor memory device according to claim 5, wherein said groove is formed, in a plan view, so as to be distant from said word lines.

8. The non-volatile semiconductor memory device according to claim 5, further comprising a silicide film formed on said bit lines and on a portion of said channel stop impurity-diffused layer exposed out from said sidewalls.

9. The non-volatile semiconductor memory device according to claim 5, wherein
   said device is a NOR-type flash memory; and
   channel stop impurity-diffused layer is formed also on the lateral faces of said groove.

10. The non-volatile semiconductor memory device according to claim 5, wherein said device is a NOR-type flash memory.

11. The non-volatile semiconductor memory device according to claims 5, wherein said device is an AND-type flash memory.

* * * * *